(12) United States Patent
Kandaka et al.

(10) Patent No.: US 7,440,182 B2
(45) Date of Patent: Oct. 21, 2008

(54) MULTILAYER MIRROR, METHOD FOR MANUFACTURING THE SAME, AND EXPOSURE EQUIPMENT

(75) Inventors: Noriaki Kandaka, Sagamihara (JP); Katsuhiko Murakami, Sagamihara (JP); Takaharu Komiya, Yokohama (JP); Masayuki Shiraishi, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/907,798

(22) Filed: Oct. 17, 2007

(65) Prior Publication Data

US 2008/0049307 A1    Feb. 28, 2008

Related U.S. Application Data

(60) Division of application No. 11/401,946, filed on Apr. 12, 2006, now Pat. No. 7,382,527, which is a continuation of application No. PCT/JP2004/015284, filed on Oct. 15, 2004.

(30) Foreign Application Priority Data

| Oct. 15, 2003 | (JP) | ............................. 2003-354561 |
| Oct. 15, 2003 | (JP) | ............................. 2003-354568 |
| Oct. 15, 2003 | (JP) | ............................. 2003-354989 |
| Mar. 29, 2004 | (JP) | ............................. 2004-094633 |

(51) Int. Cl.
G02B 5/26 (2006.01)
(52) U.S. Cl. ...................................... 359/359; 359/584
(58) Field of Classification Search ......... 359/359–361, 359/581–590
See application file for complete search history.

(56) References Cited

U.S. PATENT DOCUMENTS 6,228,512 B1    5/2001    Bajt et al.

(Continued)

FOREIGN PATENT DOCUMENTS

JP    A 11-312638    11/1999

(Continued)

OTHER PUBLICATIONS

Daniel A. Tichenor et al., "Recent results in the development of an integrated EUVL laboratory tool." May 1995. Proceedings of SPIE, vol. 2437, pp. 293-307.

(Continued)

*Primary Examiner*—Stephone B. Allen
*Assistant Examiner*—Mark Consilvio
(74) *Attorney, Agent, or Firm*—Oliff & Berridge, PLC

(57) ABSTRACT

A multilayer mirror aims to reduce incidence angle dependence of reflectivity. A substrate is made of low thermal polished expansion glass with 0.2 nm RMS or less roughness of the surface. On the surface thereof formed is a Ru/Si multilayer having a wide full-width half maximum of peak reflectivity, and on the Ru/Si multilayer formed is a Mo/Si multilayer having a high peak reflectivity value. This enables higher reflectivity than when Ru/Si alone provided and a reflectivity peak having a wider full-width half maximum than when the Mo/Si multilayer alone provided. Since Ru absorbs EUV ray more than Mo does, higher reflectivity is obtainable than that of a structure having the Ru/Si multilayer formed on the Mo/Si multilayer. The multilayer with a wide full-width half maximum has small incidence angle dependence of reflectivity in spectral reflectivity, thereby achieving high imaging performance in projection optical system.

6 Claims, 24 Drawing Sheets

U.S. PATENT DOCUMENTS

| | | |
|---|---|---|
| 6,333,961 B1 | 12/2001 | Murakami |
| 6,452,661 B1 | 9/2002 | Komatsuda |
| 6,643,353 B2 | 11/2003 | Verman et al. |
| 2002/0171817 A1 | 11/2002 | Babonneau et al. |
| 2002/0171922 A1 | 11/2002 | Shiraishi et al. |
| 2004/0189965 A1 | 9/2004 | Takahashi |
| 2005/0031071 A1 | 2/2005 | Kanazawa et al. |
| 2005/0213198 A1 | 9/2005 | Lee et al. |

FOREIGN PATENT DOCUMENTS

| | | |
|---|---|---|
| JP | A 2002-134385 | 5/2002 |
| JP | A 2002-323599 | 11/2002 |
| JP | A 2003-015040 | 1/2003 |
| JP | A 2003-501681 | 1/2003 |
| JP | A 2003-516643 | 5/2003 |
| JP | A 2004-095980 | 3/2004 |

OTHER PUBLICATIONS

Claude Montcalm et al., "Multilayer reflective coatings for extreme-ultraviolet lithography." Jun. 1989. Proceedings of SPIE, vol. 3331, pp. 42-51.

Thomas Kuhlmann et al., "EUV multilayer mirrors with tailored spectral reflectivity." 2003. Proceedings of SPIE, vol. 4782, p. 196.

Mandeep Singh et al., "Improved Theoretical Reflectivities of Extreme Ultraviolet Mirrors." Jul. 2000. Proceedings of SPIE, vol. 3997, pp. 412-419.

H.A. Macleod, "Thin-film optical filters." Nov. 1989. The Nikkan Kogyo Shimbun, Ltd., pp. 190-201 (with translation).

FIG. 2
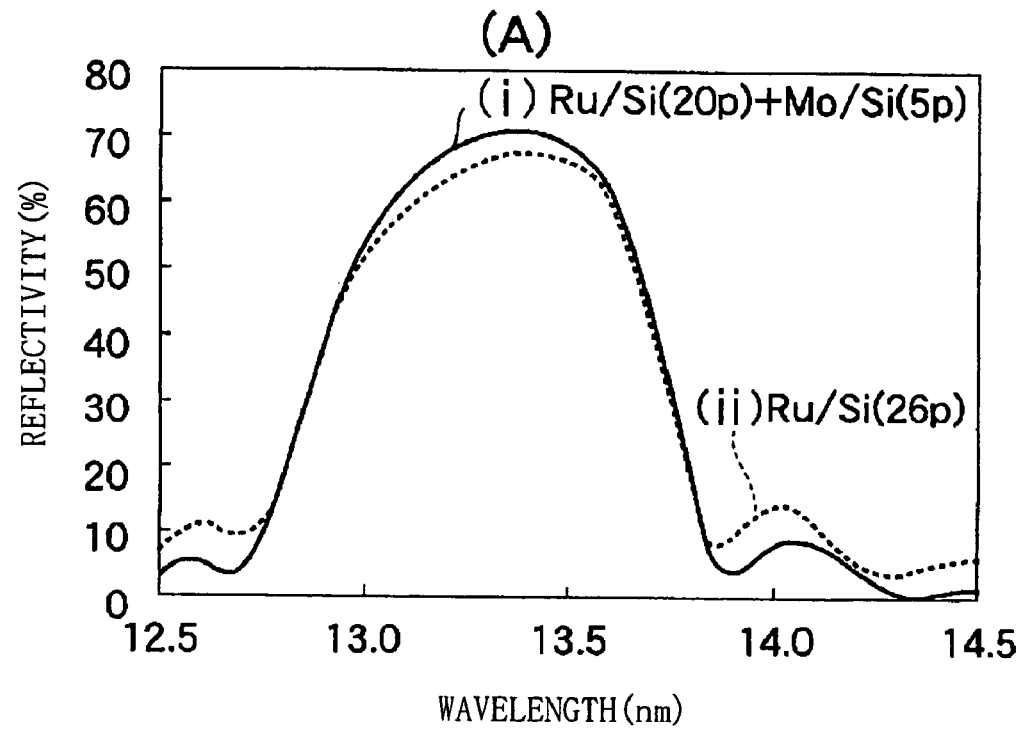
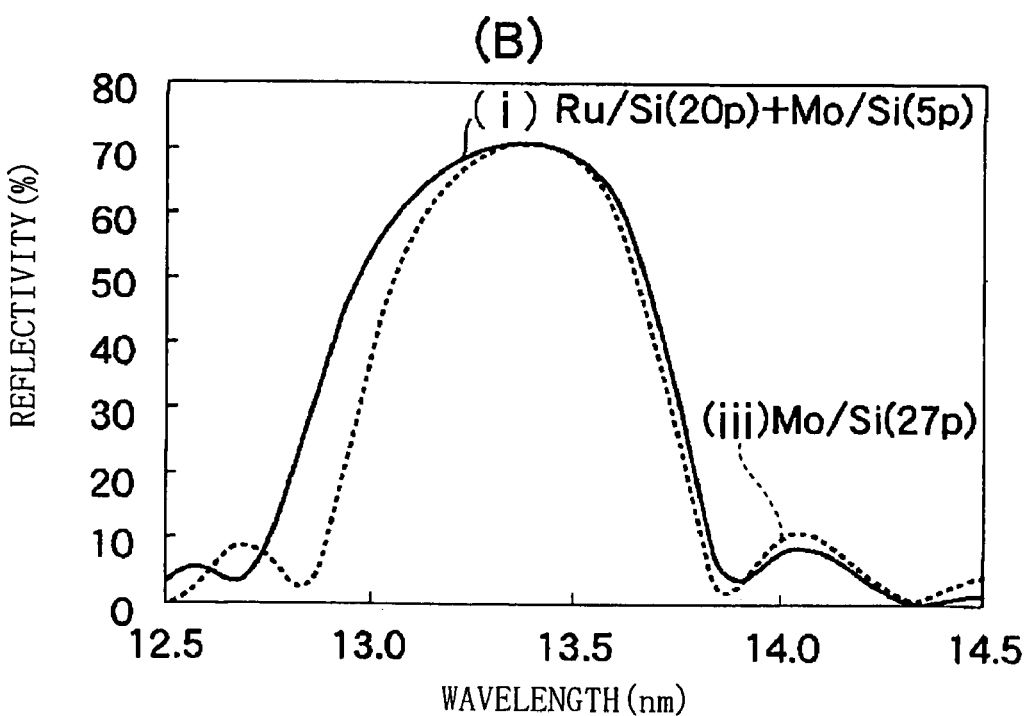

FIG. 3
(A)
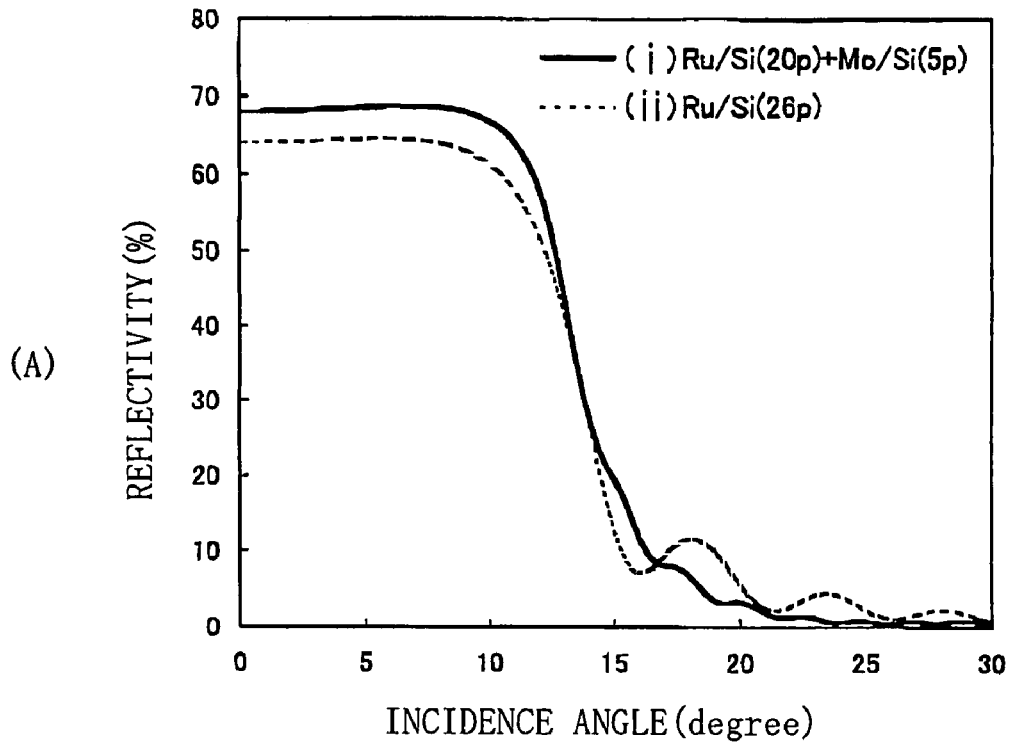
(B)
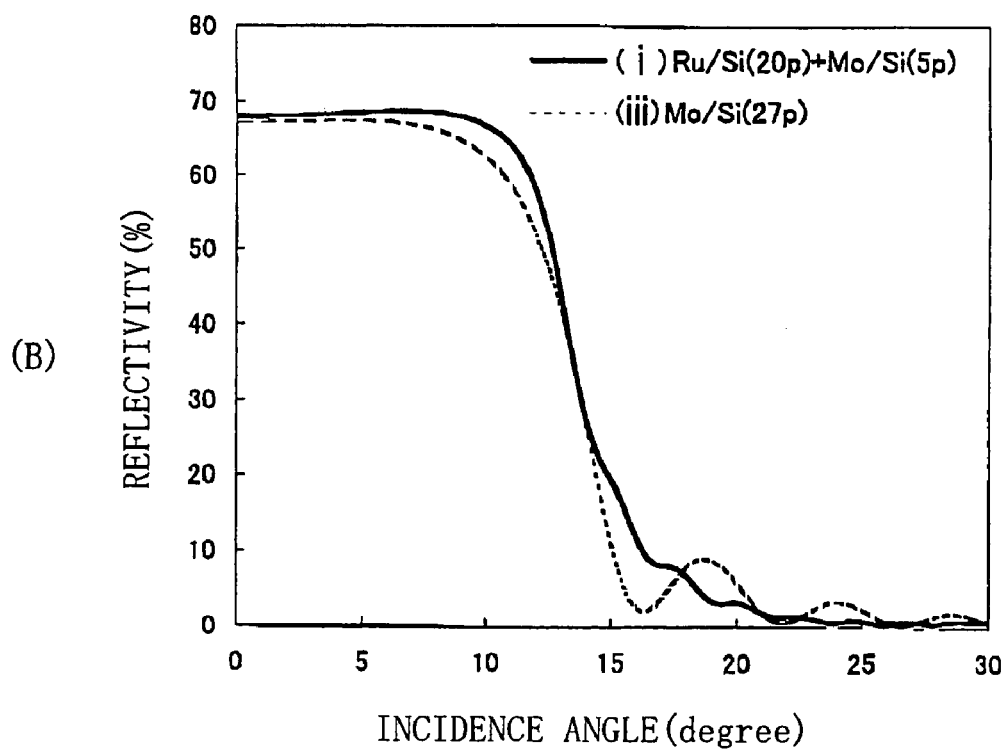

FIG. 5
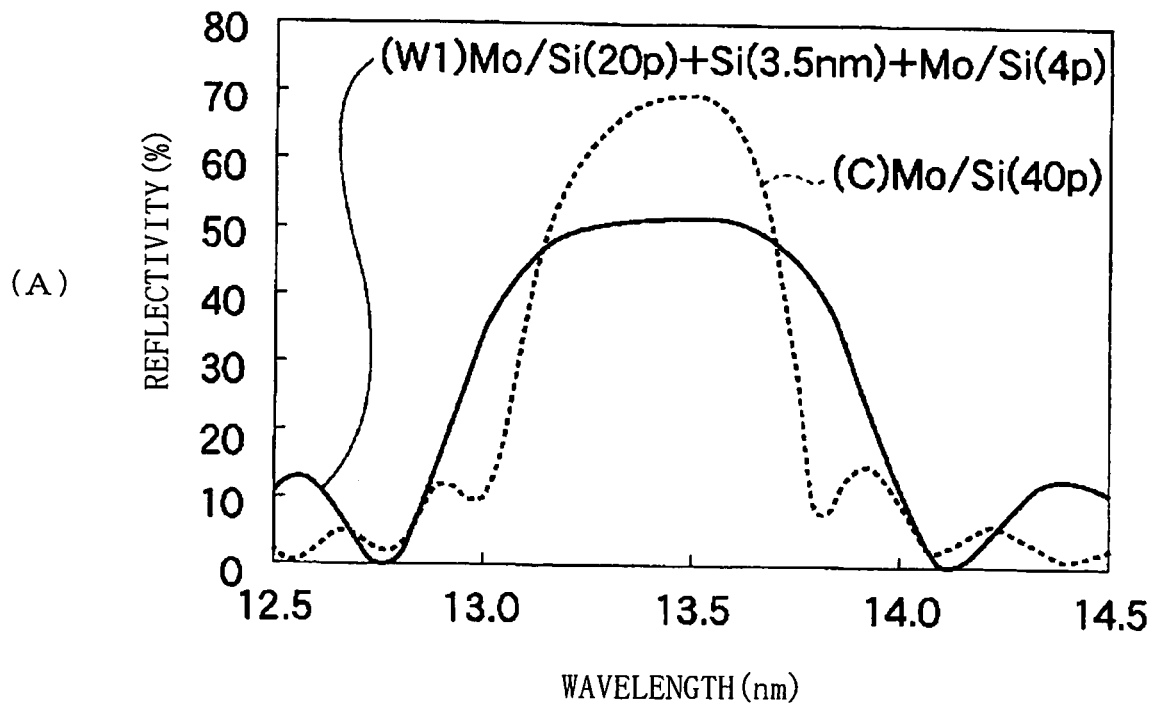
(A)
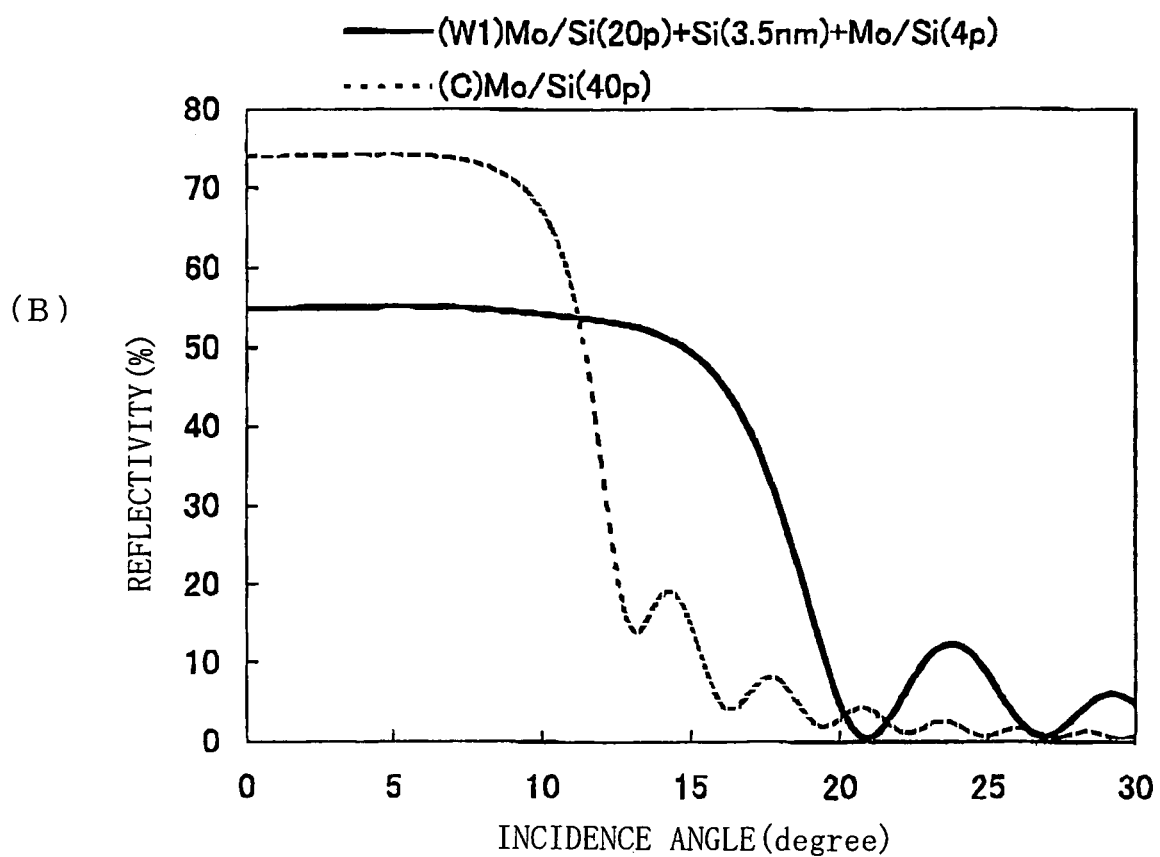
(B)

FIG. 7
(A)
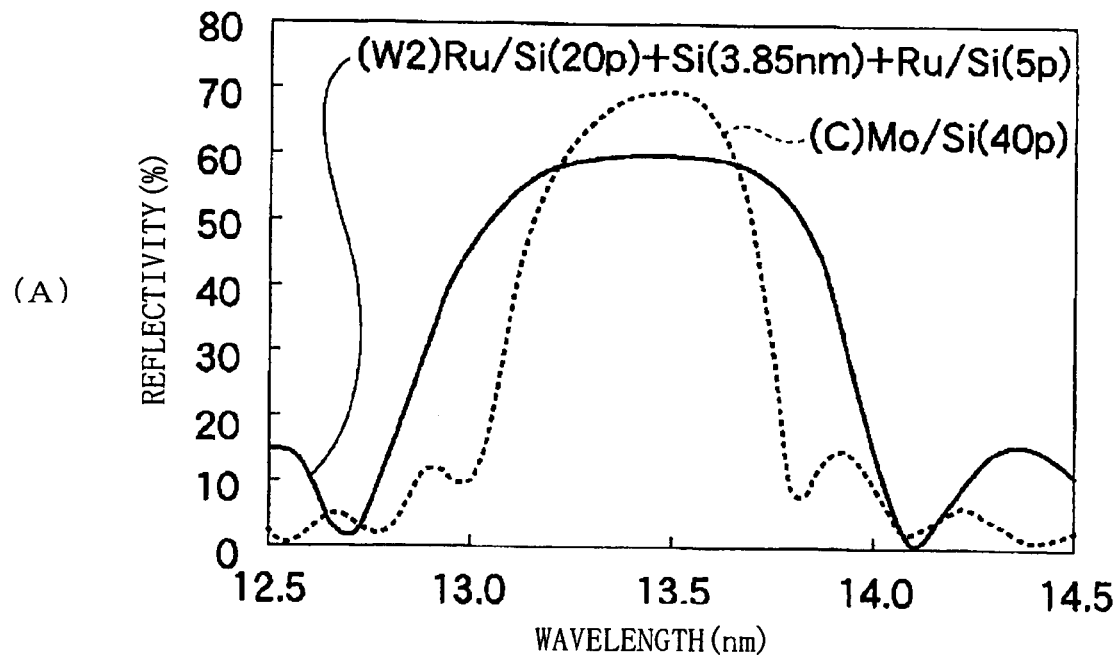
(B)
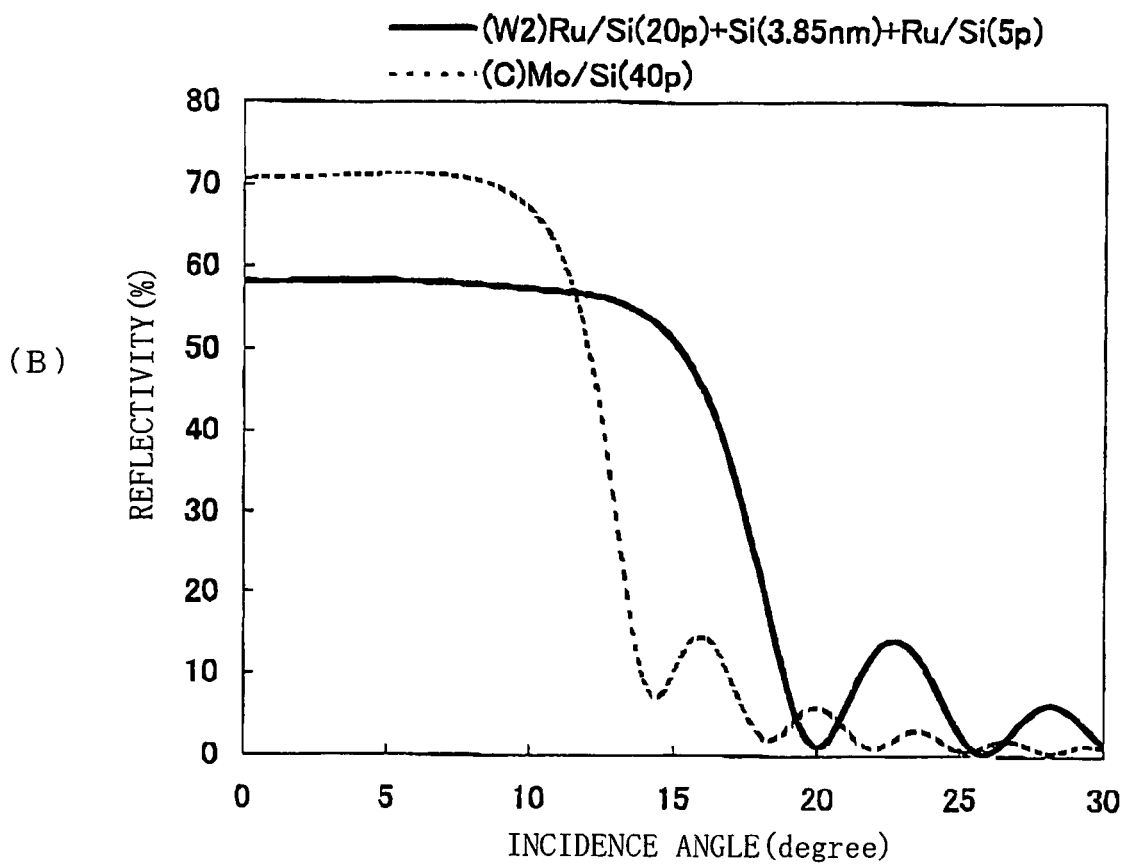

FIG. 9
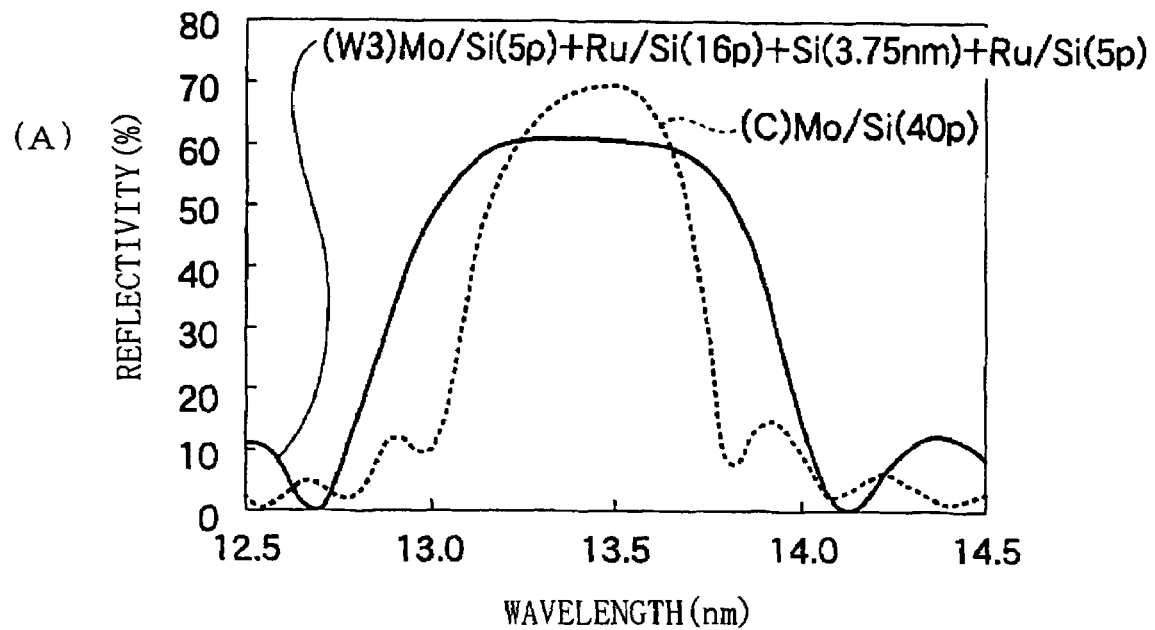
(A)
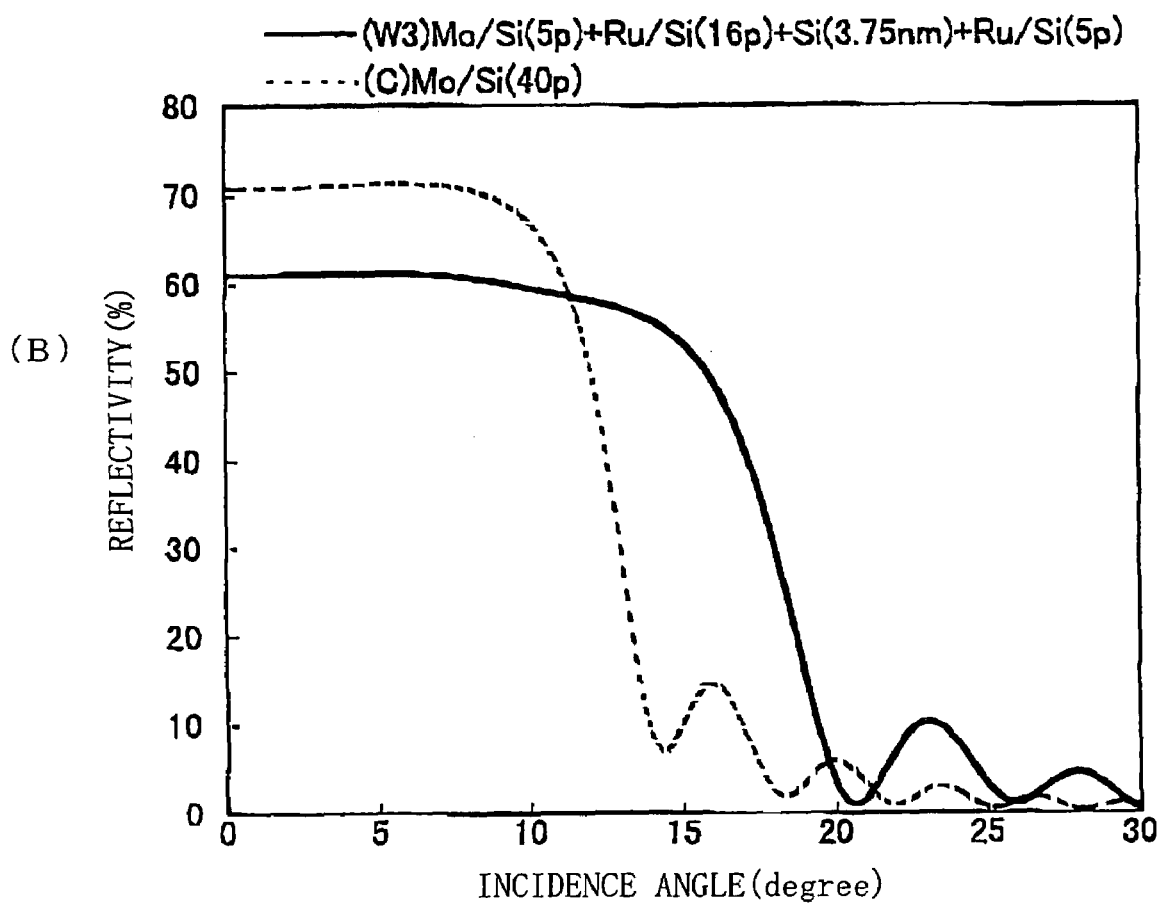
(B)

SPECTRAL REFLECTIVITY OF PRIOR ART MULTILAYER (AT VERTICAL INCIDENCE)

FIG. 22
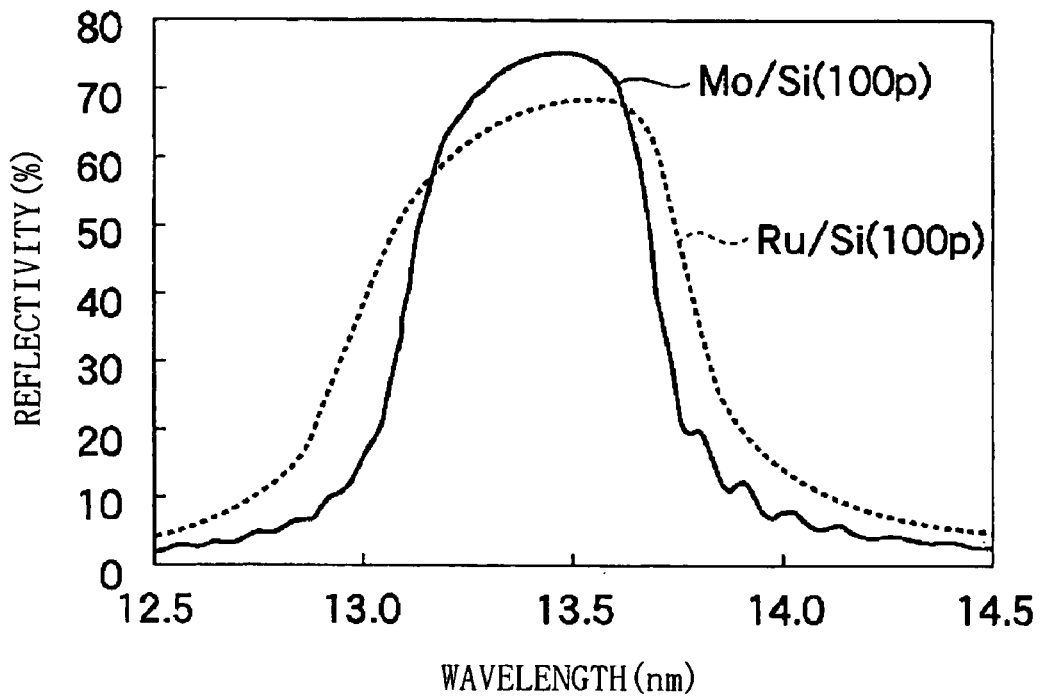
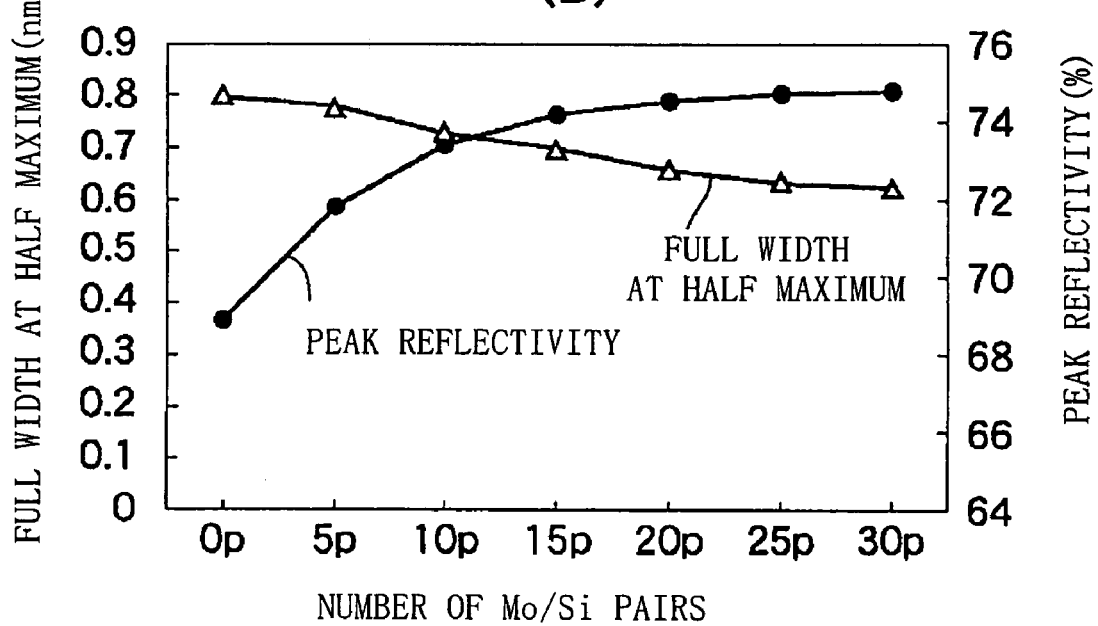

MULTILAYER MIRROR, METHOD FOR MANUFACTURING THE SAME, AND EXPOSURE EQUIPMENT

CROSS REFERENCE TO RELATED APPLICATION

This application is a division of U.S. patent application Ser. No. 11/401,946, filed Apr. 12, 2006, which is a continuation application of International Application PCT/JP2004/015284, filed Oct. 15, 2004, designating the U.S., and claims the benefit of priority from Japanese Patent Application Nos. 2003-354561, 2003-354568, and 2003-354989, all filed on Oct. 15, 2003, and No. 2004-094633, filed on Mar. 29, 2004, the entire contents of which are incorporated herein by reference.

BACKGROUND OF THE PRIOR ART

1. Technical Field

The present invention relates to a multilayer mirror etc. used in EUV lithography and, more particularly, to a technique for reducing the incidence angle dependence of the reflectivity on the surface of a mirror.

2. Background of the Prior Art

At present, as a method for manufacturing a semiconductor integrated circuit, reduced projection exposure capable of obtaining a high processing speed is widely utilized. In the reduced projection technique, as the semiconductor integrated circuit device becomes more finer, projection lithography using soft X-rays having a wavelength of about 11 to 14 nm instead of ultraviolet ray is being developed (refer to non-patent document 1). Recently, the technique is also called as the EUV (Extreme Ultra-Violet, soft X-ray) lithography. The EUV lithography is expected as a technique having a resolution of 45 nm or less, which has been impossible to realize with the conventional photolithography (a wavelength of about 190 nm or more).

Meanwhile, in a currently mainstream reduced projection optical system using visible or ultraviolet ray, a lens, which is a transmission type optical element, can be used. A reduced projection optical system for which a high resolution is required is composed of a number of lenses. In contrast to this, in the wavelength band of the EUV ray (soft X-ray), there is no transparent material and the refractive index of a material is very close to 1, therefore, a conventional optical element making use of refraction cannot be used. Instead of this, a grazing incidence mirror making use of total reflection, a multilayer mirror capable of obtaining a high reflectivity as a whole by aligning the phase of weak reflected light at the boundary surface to overlap a number of reflected light rays, etc., are used.

In a projection optical system using a lens, it is possible to realize an optical system in which light advances in one direction along the optical axis, however, in a projection optical system configured by a mirror, a flux of light is turned back many times. Due to this, it becomes necessary to prevent the turned back flux of light from interfering with a mirror substrate spatially and the numerical aperture (NA) in the optical system is restricted.

At present, as a projection optical system, ones composed of four to six mirrors are proposed. In order to attain a sufficient resolution, it is preferable for the numerical aperture of a projection optical system to be large, therefore, an optical system composed of six mirrors capable of attaining a large numerical aperture is considered to be promising. As an example of six-mirror optical system, there is a configuration proposed by Takahashi et al. (refer to the patent document 1 and FIG. 21 to be described later).

In order for a reduced projection optical system to exhibit sufficient performance in reduced projection exposure, the configuration of an illumination optical system is also important. In order for a projection optical system to exhibit a sufficient resolution, it is necessary for irradiation intensity to be uniform in a pupil as well as illuminating an exposure region on a mask on which a circuit pattern to be transferred is formed with uniform intensity. Further, in order to secure throughput, it is also important to illuminate with the light as strong as possible. As an example of such an illumination optical system, which is disclosed in, for example, the patent document 2.

In the multilayer mirror constituting an EUV optical system, materials suited to obtain a high reflectivity differ depending on the wavelength band of incidence light. For example, in the wavelength band near 13.5 nm, if a molybdenum Mo/Si multilayer in which a molybdenum (Mo) layer and a silicon (Si) layer are laminated by turns is used, a reflectivity of 67.5% can be obtained for vertical incidence. Further, in the wavelength band near 11.3 nm, if a Mo/Be multilayer in which a molybdenum (Mo) layer and a beryllium (Be) layer are laminated by turns is used, a reflectivity of 70.2% can be obtained for vertical incidence (refer to the non-patent document 2). The full width at half maximum (FWHM) of the reflectivity peak of the multilayer reported in the non-patent document 2 is about 0.56 nm in the case of the Mo/Si multilayer the periodic length of which has been adjusted so as to have a peak at a wavelength of 13.5 nm for vertical incidence.

Meanwhile, it is known that the reflectivity of a multilayer mirror varies considerably depending on the optical incidence angle and wavelength. FIG. 19 is a graph showing an example of the incidence angle dependence of the reflectivity of a conventional multilayer mirror. In the drawing, the horizontal axis represents the incidence angle (degree (°)) of the light that is made incident into a multilayer mirror and the vertical axis represents the reflectivity (%) for the EUV ray with a wavelength (λ) of 13.5 nm. As seen from the drawing, in the conventional multilayer mirror, a high reflectivity of 70% or more is obtained when the incidence angle is about 0° to 5°, however, when it is 10° or more, the reflectivity falls considerably.

FIG. 20 is a graph showing an example of the spectral reflectivity properties of a conventional multilayer mirror. In the drawing, the horizontal axis represents the wavelength (λ) of the incidence light and the vertical axis represents the reflectivity (%). Note that, the incidence angle is assumed to be 0° (vertical incidence to the reflective surface). As seen from the drawing, in the conventional multilayer mirror, a high reflectivity of 70% or more is obtained in the vicinity of a wavelength of 13.5 nm (in the central part in the drawing), however, in other wavelength bands other than that, the reflectivity falls considerably.

For such a problem, Kuhlmann et al. has proposed a reflective multilayer having an approximately uniform reflectivity across a wide wavelength band by making uneven the periodic structure (film thickness of each layer) of the reflective multilayer (refer to the non-patent document 3). The non-patent document 3 discloses a structure of a multilayer having a wide band for the reflectivity angle distribution or the spectral reflectivity, which has been obtained by adjusting the thickness of each layer of a 50-layer pair multilayer using a commercially available multilayer optimizing program.

For example, in the case of a multilayer the periodic length of which is constant, if the periodic length is optimized such that the reflectivity is maximum in a vertical incidence arrangement, the range in which a high reflectivity can be kept is when the incidence angle is 0° to 5° and when the incidence angle is 10° or more, the reflectivity falls considerably. In contrast to this, the non-patent document 3 discloses a multilayer having an uneven structure in film thickness, the reflectivity of which becomes almost constant at about 45% in the incidence angle range of 0° to 20°. Although the full width at half maximum (FWHM) of the spectral reflectivity peak of a normal Mo/Si multilayer is about 0.56 nm, the non-patent document 3 also discloses a structure the reflectivity of which becomes almost uniform at 30% across the wavelength range of 13 nm to 15 nm for vertical incidence.

The uniformization of the reflectivity in a wide wavelength band and the uniformization in a wide incidence angle range described above are not the properties that can be controlled individually, and in a multilayer capable of obtaining a uniform reflectivity in a wide wavelength band, there is a trend that the change in reflectivity becomes small even in a wide incidence angle range. A multilayer capable of obtaining a uniform reflectivity in such a wide wavelength range can make use of the EUV ray in a wide wavelength region although the reflectivity peak value is lower than that of a normal multilayer, therefore, it can be expected to be capable of obtaining a large amount of light depending on its applications when the band of the incidence light wavelength is wide.

Further, Singh et al. have reported that by making the Γ value (the proportion of the periodic length of a multilayer to the thickness of a Mo layer) uneven in the depth direction in a Mo/Si multilayer, the reflectivity is increased (refer to the non-patent document 4). The EUV reflectivity of a Mo/Si multilayer reaches its maximum when the Γ value is 0.35 to 0.4, however, the non-patent document 4 discloses that a more increase in reflectivity can be obtained when bringing the Γ value of Mo/Si close to 0.5 at the portion of the substrate side (deep layer side) of the multilayer than when setting it to a constant value of 0.4 for the entire multi layer.

Meanwhile, as a configuration of a reflective multilayer capable of obtaining a high reflectivity for the EUV ray in the vicinity of a wavelength of 13 nm, Ru/Si is known, in addition to Mo/Si (Ru stands for ruthenium). If it is assumed that n is a refractive index and k is an extinction coefficient (the imaginary part of a complex refractive index), the optical constants (n, k) of silicon at a wavelength of 13.5 nm are n (Si)=0.9993, and
k (Si)=0.001 8.

In contrast to this, the optical constants (n, k) of molybdenum and ruthenium are n (Mo)=0.9211,
k (Mo)=0.0064,
n (Ru)=0.8872, and
k (Ru)=0.0175, respectively.

Like a multilayer for the EUV ray, when absorption occurs in the multilayer itself, in order to obtain a high reflectivity, it is preferable that the difference in refractive index of a substance constituting the multilayer be large and absorption be small. As seen from the above-mentioned optical constants, from the standpoint of refractive index, a Ru/Si multilayer is suited and from the standpoint of absorption, a Mo/Si is more suited to obtain a high reflectivity. In the case of these two multilayers, the influence of absorption is dominant and the Mo/Si multilayer has a higher peak reflectivity.

The full width at half maximum of the reflectivity peak of a multilayer is brought about by the difference in refractive index. It is known that the band full width (2 Δg) of the peak of the reflectivity of a dielectric multilayer (a multilayer in which two substances having different refractive indices are laminated by turns) well known in infrared, visible, and ultraviolet regions is expressed by the following formula (for example, refer to non-patent document 5).

[Formula 1]

$$2\Delta g = \frac{4}{\pi} \cdot \sin^{-1}\left(\frac{n_H - n_L}{n_H + n_L}\right) \quad (1)$$

Here, $n_H$ is the refractive index of a high refractive-index substance and $n_L$ is the refractive index of a low refractive-index substance.

As seen from the above formula, the larger the refractive index difference between the two substances constituting a multilayer, the more the band increases, therefore, a wider full width at half maximum can be obtained from a Ru/Si multilayer than that from a Mo/Si multilayer. In the case where there is no absorption by a film, the peak value of the dielectric multilayer reflectivity gradually reaches 100%, however, in the EUV region it does not reach 100% because of absorption.

Since the magnitude of absorption depends on the wavelength, if the change in reflectivity versus wavelength is plotted, the reflectivity is asymmetry before and after the peak wavelength. The peak reflectivity of a multilayer in the EUV region increases as the number of pairs of formed films increases, however, it saturates at a certain number of pairs. The number of pairs with which saturation is reached is about 50 pair layers for a Mo/Si multilayer and about 30 pair layers for a Ru/Si multilayer. The reason that the reflectivity reaches saturation is that by reflection and absorption at each boundary surface when the EUV ray passes through a film, almost no light reaches a position deeper than that and there is no longer contribution to the reflection of the entire film. A Ru/Si multilayer is greater than a Mo/Si multilayer in the magnitude of absorption and the reflectivity at a single boundary surface is higher, therefore, the number of pairs with which saturation is reached is smaller.

(References) Patent document 1: Japanese Unexamined Patent Application Publication No. 2003-15040

Patent document 2: Japanese Unexamined Patent Application Publication No. 11-312638

Non-patent document 1: Daniel A. Tichenor, and other 21 persons, "Recent results in the development of an integrated EUVL laboratory tool", Proceedings of SPIE, (USA), (SPIE, The International Society for Optical Engineering), May 1995, Vol. 2437, p. 293

Non-patent document 2: Claude Montcalm, and other five persons, "Multilayer reflective coatings for extreme-ultraviolet lithography", Proceedings of SPIE, (USA), (SPIE, The international Society for Optical Engineering), June, 1989, Vol. 3331, p. 42

Non-patent document 3: Thomas Kuhlmann, and other three persons, "EUV multilayer mirrors with tailored spectral reflectivity", Proceedings of SPIE, (USA), (SPIE, The International Society for Optical Engineering", 2003, Vo. 4782, p.196

Non-patent document 4: Mandeep Singh, and other one person, "Improved "Theoretical Reflectivities of Extreme Ultraviolet Mirrors", Proceedings of SPIE, (USA), July, 2000, Vol. 3997, p. 412

Non-patent document 5: written by H. A. Macleod, translated by Shigetaro Ogura and other three persons, "Thin-film optical filters", The Nikkan Kogyo Shimbun, Ltd., November, 1989

Problem to be Solved by the Invention

A projection optical system actually used in EUV lithography is composed of a multilayer mirror, in which a Mo/Si multilayer is formed on a substrate.

FIG. 21 shows an example of a projection optical system composed of six mirrors. The projection optical system is composed of six mirrors CM1 to CM6 and light reflected by a mask M is projected onto a wafer W. The four mirrors CM1 to CM4 on the upstream side (the side nearer to the mask M) in the optical system constitute a first reflection image forming optical system G1 for forming an intermediate image of a mask pattern on the mask M, and the two mirrors CM5 and CM6 on the downstream side (the side nearer to the wafer W) constitute a second reflection image forming optical system G2 for performing reduced projection of an intermediate image of a mask pattern onto the wafer W.

The light reflected by the mask M is reflected by a reflective surface R1 of a first concave mirror CM1 and reflected by a reflective surface R2 of a second convex mirror CM2. The light reflected by the reflective surface R2 passes through an aperture diaphragm AS and after reflected by a reflective surface R3 of a third convex mirror CM3 and a reflective surface R4 of a fourth concave mirror sequentially, forms an intermediate image of a mask pattern. Then, the light from the intermediate image of the mask pattern formed via the first reflection image forming optical system G1 is reflected by a reflective surface R5 of a fifth convex mirror CM5 and a reflective surface R6 of a sixth concave mirror CM6, then forms a reduced image of the mask pattern on the wafer W.

The periodic length distribution in the substrate plane of a Mo/Si multilayer formed on the surface of a mirror directly affects the reflectivity distribution in the plane and the in-plane distribution of the reflectivity affects the image forming performance as the in-plane illuminance variations on the formed image surface or the light amount variations in the pupil plane, therefore, it is necessary to establish an optimum in-plane distribution by taking all of them into consideration. However, since it is difficult to form a film on a substrate with a free film thickness distribution, therefore, it is general to optimize with an axis-symmetric film thickness distribution around the optical axis of an optical system when the optical system is configured.

Even if the periodic length distribution is optimized as described above, there still remains a problem as described below. In the projection optical system shown in FIG. 21, the light that reaches a point on the image forming surface does not come only from one direction to reach the image forming surface, but it comes from a solid angle space having a certain extent to converge to a point. In other words, a bundle of rays that contribute to image formation at a point on the image forming surface are reflected in a region on each mirror substrate having a finite area and two regions on the mirror substrate corresponding to two points not so apart from each other on the image forming surface partially overlap each other. In other words, reflection at a single point on the mirror substrate contributes to image formation in a region having a certain extent on the image forming surface and the rays reflected at the same point reach different points on the image forming surface. At this time, the rays reaching different points on the image forming surface are made incident to the same point on the mirror at different angles and therefore, an incidence angle at a certain point on the reflective surface has a certain extent.

In a multilayer mirror, the optimum periodic length for a fixed wavelength depends on the incidence angle, therefore, in a strict sense, an optimum periodic length for all incidence angles is not available. If the extent of the incidence angle is not so large, its influence is not large. However, even if the periodic length in-plane distribution of a normal Mo/Si multilayer (the periodic length is constant) is optimized for a mirror substrate constituting an optical system, for example, as shown in FIG. 21, such that the wave surface aberration of the transmitted light becomes smaller, large variations in the light intensity in the pupil plane occur. Here, the distribution of the multilayer periodic length is optimized in a range of an axis-symmetric distribution around the optical axis at the time of configuration of an optical system under the restriction of the film forming method described above.

The variations in light intensity in the pupil plane is optically equivalent to that the effective NA becomes smaller irregularly, therefore, the image forming performance is degraded considerably. This is a problem that occurs in a normal Mo/Si multilayer because the incidence angle dependence of the reflectivity is large. Because of this, a method has been demanded that reduces the incidence angle dependence of the reflectivity on a mirror surface that degrades the image forming performance and that attains high image forming performance.

Further, in order to attain high image forming performance in a projection optical system, it is necessary for the illumination light intensity distribution on a mask and the light intensity distribution in the pupil plane in an illumination optical system to be uniform. This is because the light intensity distribution in the pupil plane in an illumination optical system is reflected directly in the intensity distribution on an image forming surface and the intensity distribution in the pupil plane in a projection optical system.

Furthermore, in a multilayer mirror in an illumination optical system currently proposed, the in-plane distribution of incidence angle is large. Because of this, it is difficult to strictly match the optimum periodic length at all of the points on a reflective surface. This is because the amount of change in the in-plane periodic length distribution needs to be increased and since a slight shift is produced when the periodic length distribution is controlled at the time of film formation or when alignment as an illumination optical system is performed, the film thickness corresponding to a supposed incidence angle differs from the film thickness corresponding to an actual incidence angle and considerable degradation in the reflectivity is brought about. In this case, there is a problem of decrease in the amount of light that can be used for illumination and reduction in the throughput. There has been a demand for a technique for reducing the incidence angle dependence of the reflectivity on the mirror surface.

SUMMARY OF THE INVENTION

An object of the present invention is to provide a technique for reducing the incidence angle dependence of the reflectivity on a multilayer mirror etc.

According to a first embodiment of the present invention, a multilayer mirror has a reflective multilayer in which a high refractive-index film and a low refractive-index film for the EUV ray are laminated by turns and has the following features. First, in the multilayer (the surface layer film group) on the light incidence plane side, the low refractive-index film is composed of a substance including molybdenum (Mo) and the high refractive-index film is composed of a substance including silicon (Si). Second, in the multilayer (deep layer film group) on an opposite light incidence plane side of the surface layer film group, the low refractive-index film is composed of a substance including ruthenium (Ru) and the high refractive-index film is composed of a substance including silicon.

Here, the high refractive-index film or the low refractive-index film may be a single layer or a composite layer in which a plurality of layers are overlapped. Further, another layer may be interposed between the high refractive-index film and the low refractive-index film.

According to the present invention, a substance including molybdenum also includes, for example, rhodium (Rh), carbon (C), silicon (Si), etc. In other words, a substance including molybdenum may be molybdenum including Rh, C, and Si as impurities or may be a compound of these substances and molybdenum (this similarly applies to a substance including ruthenium and a substance including silicon). Further, a substance including ruthenium also includes, for example, rhodium (Rh), carbon (C), silicon (Si), etc. Furthermore, a substance including silicon also includes, for example, carbon (C), carbon tetraboride ($B_4C$), boron (B), etc.

According to the first embodiment described above, the Mo/Si multilayer having a high peak value of reflectivity is formed on the Ru/Si multilayer having a large full width at half maximum of the reflectivity peak, so that it is possible to obtain the reflectivity higher than that in the case of only Ru/Si, and a reflectivity peak with a wider full width at half maximum than that in the case of only the Mo/Si multilayer. Further, Ru absorbs EUV ray more than Mo does, therefore, a higher reflectivity is obtained than that in a structure in which the Ru/Si multilayer is formed on the Mo/Si multilayer. A multilayer having a wide full width at half maximum with respect to the spectral reflectivity has less incidence angle dependence of the reflectivity which makes it possible to keep high image forming performance of a projection optical system according to the present invention.

According to a first embodiment, it is preferable for the number of pairs of a high refractive-index film and a low refractive-index film in the surface layer film group to be 2 to 10. The number of laminations of the Mo/Si multilayer is 10 or less, so that the full width at half maximum of the reflectivity peak is kept wide due to the influence from Ru/Si formed on the substrate side. Further, the uppermost surface is the Mo/Si multilayer having a higher reflectivity than that of the Ru/Si multilayer, therefore, the peak reflectivity increases. This makes it possible to obtain a multilayer having a high reflectivity and a wide full width at half maximum, which cannot be otherwise attained with the Mo/Si multilayer or the Ru/Si multilayer alone.

The multilayer mirror in the first embodiment is manufactured by the following method. In other words, it is only necessary for the method to have a process for forming a deep layer film group by alternately depositing a substance including ruthenium and a substance including silicon on a substrate and a process for forming a surface layer film group by alternately depositing a substance including molybdenum and a substance including silicon on the deep layer film group.

According to a second embodiment of the present invention, a multilayer mirror has a reflective multilayer in which a high refractive-index film and a low refractive-index film for EUV ray are laminated by turns and has the following features. First, it has a multilayer film group (a surface layer film group) on the light incidence plane side, an additional layer on the opposite incidence plane side in the surface layer film group, and a multilayer film group (a deep layer film group) on the opposite incidence plane side of the additional layer. Second, the reflected light is shifted in phase due to the presence of the additional layer, so that the reflectivity peak value is reduced in the mirror as a whole, and at the same time, the reflectivity around peak wavelengths is increased compared to the case where no additional layer is present.

According to a third embodiment of the present invention, a multilayer mirror has a reflective multilayer in which a high refractive-index film and a low refractive-index film for EUV ray are laminated by turns and has the following features. First, it has a multilayer film group (a surface layer film group) on the light incidence plane side, an additional layer on the opposite incidence plane side in the surface layer film group, and a multilayer film group (a deep layer film group) on the opposite incidence plane side in the additional layer. Second, in the surface layer film group, the low refractive-index film is composed of a substance including ruthenium (Ru) and the high refractive-index film is composed of a substance including silicon (Si). Third, in the deep layer film group, the low refractive-index film is composed of a substance including ruthenium (Ru) and the high refractive-index film is composed of a substance including silicon. Fourth, the thickness of the additional layer is about half the periodic length of the multilayer or the thickness of about half the periodic length plus an integer multiple of the periodic length. Note that the low refractive-index film in the surface layer film group may be composed of a substance including molybdenum (Mo) instead of a substance including ruthenium (Ru) as described above. Further, the low refractive-index film in the deep layer film group may also be composed of a substance including molybdenum (Mo) instead of ruthenium.

In the multilayer mirror in the second and third embodiments described above, it is preferable for the number of unit periodic structures (pairs) of the surface layer film group to be 10 to 30 and for the number of pairs of the deep layer film group to be 5 to 50% of the number of pairs of the surface layer film group.

In the multilayer mirror in the second and third embodiments, the additional layer is provided at the position of from the tenth period to the thirtieth period from the uppermost surface of the multilayer, however, EUV ray reaches a position deeper than the additional layer. Therefore, the reflected light from the multilayer film group (the deep layer film group) on the opposite incidence plane side (the substrate side) of the additional layer contributes to the reflectivity of the entire multilayer.

The phase of the reflected light from the periodic multilayer above and under the additional layer (the incidence plane side and the opposite incidence plane side) shifts in the vicinity of the reflectivity peak due to the thickness of the additional layer, therefore, the amplitude of the reflected light attenuates. Because of this, the reflectivity decreases at the front end portion of the reflectivity peak due to the presence of the additional layer. The reflectivity peak shape in the multilayer the number of pairs of which is less than that with which the reflectivity saturates is a shape the top of which is pointed, however, as the reflectivity of the peak portion decreases, the top portion of the peak approaches a flat shape (the peak portion comes to bear broad properties).

On the other hand, the situation differs considerably at the portion of the foot apart from the peak. In a normal periodic structure, when the wavelength is shifted from the optimized wavelength (the wavelength at which the reflectivity peak is obtained), a shift in the phase is small in the reflected light from the boundary surface in the vicinity of the surface, therefore, the amplitude increases by overlapping each other, however, there may be a case where the phase of the reflected light from the boundary surface apart from the surface turns into the opposite phase to attenuate the amplitude. At the wavelengths corresponding to the foot of the reflectivity peak of the Mo/Si or Ru/Si multilayer, the reflected light from the boundary surface after the tenth pair layer to the thirtieth pair layer acts so as to reduce the reflected light intensity. However, if the additional layer is added, the phase of the reflected light from the boundary surface at a position deeper than that shifts by half the wavelength, therefore, the amplitude of the reflected light increases.

As described above, by providing an additional layer between the surface layer film group and the deep layer film group, the front end portion of the reflectivity peak is flattened and at the portion of the foot of the reflectivity, the reflectivity increases, therefore, the full width at half maximum of the reflectivity peak increases. In the case of the Ru/Si multilayer or the Mo/Si multilayer, in the wavelength range from 12 to 15 nm, a reflectivity exceeding 60% is obtained theoretically. By adapting the multilayer structure according to the present invention to these multilayers, it is possible to obtain a multilayer having a reflectivity the full width at half maximum of which is wider than that of Ru/Si and Mo/Si without an additional layer.

Also, in the multilayer mirror in the second and third forms described above, the additional layer may be made of silicon (Si), boron (B), or a substance including these. The extinction coefficient k of silicon (Si) and boron (B) at a wavelength of 13.5 nm is as relatively small as k (Si)=0.001 8, and k (B)=0.0041

The role of the additional layer is to shift the phase of the reflected light in the deep layer film group and the surface layer film group by ½ wavelength, therefore, preferably the absorption is as small as possible and a higher reflectivity can be attained by using these substances or a substance (for example, $B_4C$) including these substances.

According to a fourth embodiment of the present invention, a multilayer mirror has a reflective multilayer in which a high refractive-index film and a low refractive-index film for EUV ray are laminated by turns and has the following features. First, it is provided with a multilayer film group (a surface layer film group) on the light incidence plane side, an additional layer on the opposite incidence plane side of the surface layer film group, and a multilayer film group (a deep layer film group) on the opposite incidence plane side of the additional layer. Second, in the multilayer film group (a first surface layer film group) on the incidence plane side of the surface layer film group, the low refractive-index film is composed of a substance including molybdenum (Mo) and the high refractive-index film is composed of a substance including silicon (Si). Third, in the multilayer film group (a second surface layer film group) on the additional layer side of the surface layer film group, the low refractive-index film is composed of a substance including ruthenium (Ru) and the high refractive-index film is composed of a substance including silicon (Si). Fourth, in the deep layer film group, the low refractive-index film is composed of a substance including ruthenium (Ru) and the high refractive-index film is composed of a substance including silicon.

According to the fourth embodiment described above, a multilayer composed of molybdenum and silicon is formed on the multilayer of a structure in which the additional layer is added to the substantially periodic multilayer composed of ruthenium and silicon. Even the Ru/Si multilayer of the periodic structure can have a full width at half maximum wider than that of the Mo/Si multilayer, and even the multilayer having the additional layer added can have a full width at half maximum wider than that of the Mo/Si multilayer. By forming a Mo/Si film thereon, the peak value of the peak reflectivity can be increased and a wider full width at half maximum can be obtained.

According to a fifth embodiment of the present invention, a multilayer mirror has a reflective multilayer in which a high refractive-index film and a low refractive-index film are laminated on a substrate by turns under a condition that a Bragg's reflection condition holds that reflected light from a plurality of boundary surfaces of the high refractive-index film and low refractive-index film for EUV ray is put in phase and has the following features. First, it includes an interposed layer whose thickness is half or more of the center wavelength of EUV ray. Second, the band of the EUV ray wavelength or incidence angle having a relatively high EUV ray reflectivity is widened.

According to the fifth embodiment described above, part of a pair of high refractive-index film and low refractive-index film (layer pair) is composed of two kinds of substances and another part thereof may be composed of three or more kinds of substances.

Further, in the fifth embodiment, the reflective multilayer may include a plurality of blocks in which a pair (layer pair) of a high refractive-index film H and low refractive-index films L1 and L2 having different structures are laminated repeatedly. For example, a block in which a layer pair of L1/L2/L1/H is repeated and a block in which a layer pair of L1/H is repeated may be included, and the number of repetitions of the layer pair lamination in each block may be 1 to 50. In this case, the film thickness of a layer included in each layer pair may differ in each layer pair. Note that, it is assumed that the film constituting substances of L1 and L2 are different from each other (this applies hereinafter). Further, in the fifth embodiment, it may also be possible to perform lamination while varying the film thickness of each film arbitrarily and set the reflectivity for the light with a wavelength of 13.1 nm to 13.9 nm to 45% or more.

According to a sixth embodiment of the present invention, a multilayer mirror has a 10 reflective multilayer in which a high refractive-index film and a low refractive-index film are laminated on a substrate by turns under a condition that a Bragg's reflection condition holds that reflected light from a plurality of boundary surfaces of the high refractive-index film and low refractive-index film for EUV ray is put in phase and has the following features. First, the reflective multilayer includes a plurality of blocks in which a pair (layer pair) of a high refractive-index film H and low refractive-index films L1 and L2 having different structures are laminated repeatedly. Second, a block on the substrate side of the multilayer mirror is formed by repeatedly laminating a layer pair of L2/H, the second block from the substrate is formed by repeatedly laminating a layer pair of L2/L1/H, the third block from the substrate is formed by repeatedly laminating a layer pair of L1/H, the fourth block from the substrate is formed by repeatedly laminating a layer pair of L1/L2/L1/H, the fifth block from the substrate is formed by repeatedly laminating a layer pair of L2/L1/H, the sixth block from the substrate is formed by repeatedly laminating a layer pair of L1/H, the seventh block from the substrate is formed by repeatedly laminating a layer pair of L1/L2/L1/H, and the eighth block from the substrate is formed by repeatedly laminating a layer pair of L1/H. Third, the number of repetitions of the layer pair lamination in each block is 1 to 50. Fourth, the band of the EUV ray wavelength or incidence angle having a relatively high EUV ray reflectivity is widened.

Note that, in the sixth embodiment, it is preferable for the reflectivity to be 50% or more for the light at grazing incidence made incident at an incidence angle at least in a range from 18 degrees to 25 degrees. It is preferable for an incidence angle range including a desired angle (for example, 20 degrees) in an incidence angle range of 0 to 25 degrees to be within five degrees, or more preferably within seven degrees of an incidence angle range, in which the reflectivity is 50% or more, and in which the reflectivity peak has a flat shape (the fluctuation in the reflectivity is within 596).

According to a seventh embodiment of the present invention, a multilayer mirror has a reflective multilayer in which a high refractive-index film and a low refractive-index film are laminated on a substrate by turns under a condition that a Bragg's reflection condition holds that reflected light from a plurality of boundary surfaces of the high refractive-index film and low refractive-index film for EUV ray is put in phase and has the following features. First, the reflective multilayer includes a plurality of blocks in which a pair (layer pair) of a high refractive-index film H and low refractive-index films L1 and L2 having different structures are laminated repeatedly. Second, the block on the substrate side of the multilayer mirror is formed by repeatedly laminating a layer pair of L2/H, the second block from the substrate is formed by repeatedly laminating a layer pair of L2/L1/H, the third block from the substrate is formed by repeatedly laminating a layer pair of L1/H, the fourth block from the substrate is formed by repeatedly laminating a layer pair of L2/L1/H, the fifth block from the substrate is formed by repeatedly laminating a layer pair of L1/L2/L1/H, the sixth block from the substrate is formed by repeatedly laminating a layer pair of L1/H, the seventh block from the substrate is formed by repeatedly laminating a layer pair of L1/L2/L1/H, and the eighth block from the substrate is formed by repeatedly laminating a layer pair of L1/H. Third, the number of repetitions of the layer pair lamination in each block is 1 to 50. Fourth, a band of EUV ray wavelength or incidence angle having a relatively high EUV ray reflectivity is widened.

According to the seventh embodiment, it is possible to uniformalize the reflectivity on the entire reflective surface by arbitrarily varying the total film thickness of the reflective multilayer in accordance with the incidence angle of light at each position on the reflective surface. Further, in the seventh embodiment, it is possible to set the reflectivity to 50% or more for the light at grazing incidence made incident at an incidence angle at least in the range from 0 to 20 degrees by varying the total film thickness of the reflective multilayer while maintaining the ratio of the film thickness of each layer in the reflective multilayer.

According to an eighth embodiment of the present invention, a multilayer mirror has a reflective multilayer in which a high refractive-index film and a low refractive-index film are laminated on a substrate by turns under a condition that a Bragg's reflection condition holds that reflected light from a plurality of boundary surfaces of the high refractive-index film and low refractive-index film for EUV ray is put in phase and has the following features. First, the reflective multilayer includes a plurality of blocks in which a pair (layer pair) of a high refractive-index film H and low refractive-index films L1 and L2 having different structures are laminated repeatedly. Second, the block on the substrate side of the multilayer mirror is formed by repeatedly laminating a layer pair of L1/L2/L1/H, the second block from the substrate is formed by repeatedly laminating a layer pair of L2/L1/H, the third block from the substrate is formed by repeatedly laminating a layer pair of L1/L2/L1/H, the fourth block from the substrate is formed by repeatedly laminating a layer pair of L2/L1/H, the fifth block from the substrate is formed by repeatedly laminating a layer pair of L1/H, the sixth block from the substrate is formed by repeatedly laminating a layer pair of L1/L2/L1/H, the seventh block from the substrate is formed by repeatedly laminating a layer pair of L2/L1/H, the eighth block from the substrate is formed by repeatedly laminating a layer pair of L1/L2/L1/H, the ninth block from the substrate is formed by repeatedly laminating a layer pair of L1/H, the tenth block from the substrate is formed by repeatedly laminating a layer pair of L1/L2/L1/H, the eleventh block from the substrate is formed by repeatedly laminating a layer pair of L2/L1/H, the twelfth block from the substrate is formed by repeatedly laminating a layer pair of L1/L2/L1/H, and the thirteenth block from the substrate is formed by repeatedly laminating a layer pair of L1/H. Third, the number of repetitions of the layer pair lamination in each block is 1 to 50. Fourth, the band of the EUV ray wavelength or incidence angle having a relatively high EUV ray reflectivity is widened. According to the eighth embodiment, it is preferable for the reflectivity for the light at grazing incidence made incident at an incidence angle at least in the range from 0 to 20 degrees to be 45% or more.

According to a ninth embodiment of the present invention, a multilayer mirror has a reflective multilayer in which a high refractive-index film and a low refractive-index film are laminated on a substrate by turns under a condition that a Bragg's reflection condition holds that reflected light from a plurality of boundary surfaces of the high refractive-index film and low refractive-index film for EUV ray is put in phase and has the following features. First, the reflective multilayer includes a plurality of blocks in which a pair (layer pair) of a high refractive-index film H and low refractive-index films L1 and L2 having different structures are laminated repeatedly. Second, the block on the substrate side of the multilayer mirror is formed by repeatedly laminating a layer pair of L2/H, the second block from the substrate is formed by repeatedly laminating a layer pair of L2/L1/H, the third block from the substrate is formed by repeatedly laminating a layer pair of L2/H, the fourth block from the substrate is formed by repeatedly laminating a layer pair of L1/H, the fifth block from the substrate is formed by repeatedly laminating a layer pair of L2/H, the sixth block from the substrate is formed by repeatedly laminating a layer pair of L2/L1/H, the seventh block from the substrate is formed by repeatedly laminating a layer pair of L1/H, the eighth block from the substrate is formed by repeatedly laminating a layer pair of L2/L1/H, the ninth block from the substrate is formed by repeatedly laminating a layer pair of L1/H, the tenth block from the substrate is formed by repeatedly laminating a layer pair of L2/L1/H, the eleventh block from the substrate is formed by repeatedly laminating a layer pair of L1/H, the twelfth block from the substrate is formed by repeatedly laminating a layer pair of L2/L1/H, the thirteenth block from the substrate is formed by repeatedly laminating a layer pair of L1/L2/L1/H, and the fourteenth block from the substrate is formed by repeatedly laminating a layer pair of L1/H. Third, the number of repetitions of the layer pair lamination in each block is 1 to 50. Fourth, the band of the EUV ray wavelength or incidence angle having a relatively high EUV ray reflectivity is widened. According to the ninth embodiment, it is preferable for the reflectivity for the light having a wavelength of 13.1 nm to 13.9 nm to be 45% or more.

According to a tenth embodiment of the present invention, a multilayer mirror has a reflective multilayer in which a high refractive-index film and a low refractive-index film are laminated on a substrate by turns under a condition that a Bragg's reflection condition holds that reflected light from a plurality of boundary surfaces of the high refractive-index film and low refractive-index film for EUV ray is put in phase and has the following features. First, the reflective multilayer includes a plurality of blocks in which a pair (layer pair) of a high refractive-index film H and low refractive-index films L1 and L2 having different structures are laminated repeatedly. Second, the block on the substrate side of the multilayer mirror is formed of a layer of H, the second block from the substrate is formed by repeatedly laminating a layer pair of L2/H, and the third block from the substrate is formed by repeatedly laminating a layer pair of L2/L1/H. Third, the number of repetitions of the layer pair lamination in each block is 1 to 50. Fourth, the band of the EUV ray wavelength or incidence angle having a relatively high EUV ray reflectivity is widened.

According to an eleventh embodiment of the present invention, a multilayer mirror has a reflective multilayer in which a high refractive-index film and a low refractive-index film are laminated on a substrate by turns under a condition that a Bragg's reflection condition holds that reflected light from a plurality of boundary surfaces of the high refractive-index film and low refractive-index film for EUV ray is put in phase and has the following features. First, at least one layer of the high refractive-index films has a thickness of half or more of the center wavelength of the EUV ray. Second, the band of the EUV ray wavelength or incidence angle having a relatively high EUV ray reflectivity is widened.

The exposure equipment of the present invention is exposure equipment for forming a pattern by selectively irradiating a sensitive substrate with EUV ray and having the above-mentioned multilayer mirror in an optical system. According to the exposure equipment of the present invention, a multilayer with a wide band is formed at least at a part in the projection optical system and the illumination optical system, therefore, it is possible to make uniformalize the illuminance on the image forming surface and the in-pupil light amount and to keep high image forming performance. Further, it is possible to prevent the drop in light amount caused by the alignment error of a mirror with a large periodic length in-plane distribution in the projection optical system.

With the multilayer mirror of the present invention, it is possible to obtain reflectivity peak properties the reflectivity of which is relatively high and having a wide full width at half maximum. Since a multilayer having a wide full width at half maximum of spectral reflectivity has small incidence angle dependence of reflectivity, according to the present invention, it is possible to keep high the image forming performance in a projection optical system.

Since the exposure equipment of the present invention uses such a multilayer mirror, it is possible to uniformalize the illuminance on the image forming surface and the in-pupil light amount and to keep high image forming performance.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIGS. 2(A), (B) show the calculated values of reflectivity of the multilayer mirror according to the first embodiment of the present invention as the dependence on the wavelength of incidence light;

FIGS. 3(A), (B) show the calculated values of reflectivity of the multilayer mirror according to the first embodiment of the present invention as the dependence on the incidence angle of incidence light;

FIGS. 5(A), (B) show the calculated values of reflectivity of the multilayer mirror according to the second embodiment of the present invention, wherein (A) shows the dependence on the wavelength of incidence light and (B) shows dependence on the incidence angle of incidence light;

FIGS. 7(A), (B) show the calculated values of reflectivity of the multilayer mirror according to the third embodiment of the present invention, wherein (A) shows the dependence on the wavelength of incidence light and (B) shows dependence on the incidence angle of incidence light;

FIGS. 9(A), (B) show the calculated values of reflectivity of the multilayer mirror according to the fourth embodiment of the present invention, wherein (A) shows the dependence on the wavelength of incidence light and (B) shows dependence on the incidence angle of incidence light;

FIG. 22(A) shows the incidence wavelength properties of the theoretical reflectivity of a Mo/Si multilayer and a Ru/Si multilayer and FIG. 22(B) shows the change in the full width at half maximum and peak reflectivity for the number of formed pair layers of the Mo/Si multilayer in a multilayer formed by forming the Mo/Si multilayer film on the Ru/Si multilayer film;

DETAILED DESCRIPTION OF THE PREFERRED EMBODIMENT

Hereinafter, there will be described embodiments of the present invention with reference to the accompanying drawings.

Embodiment 1

Figure 1:
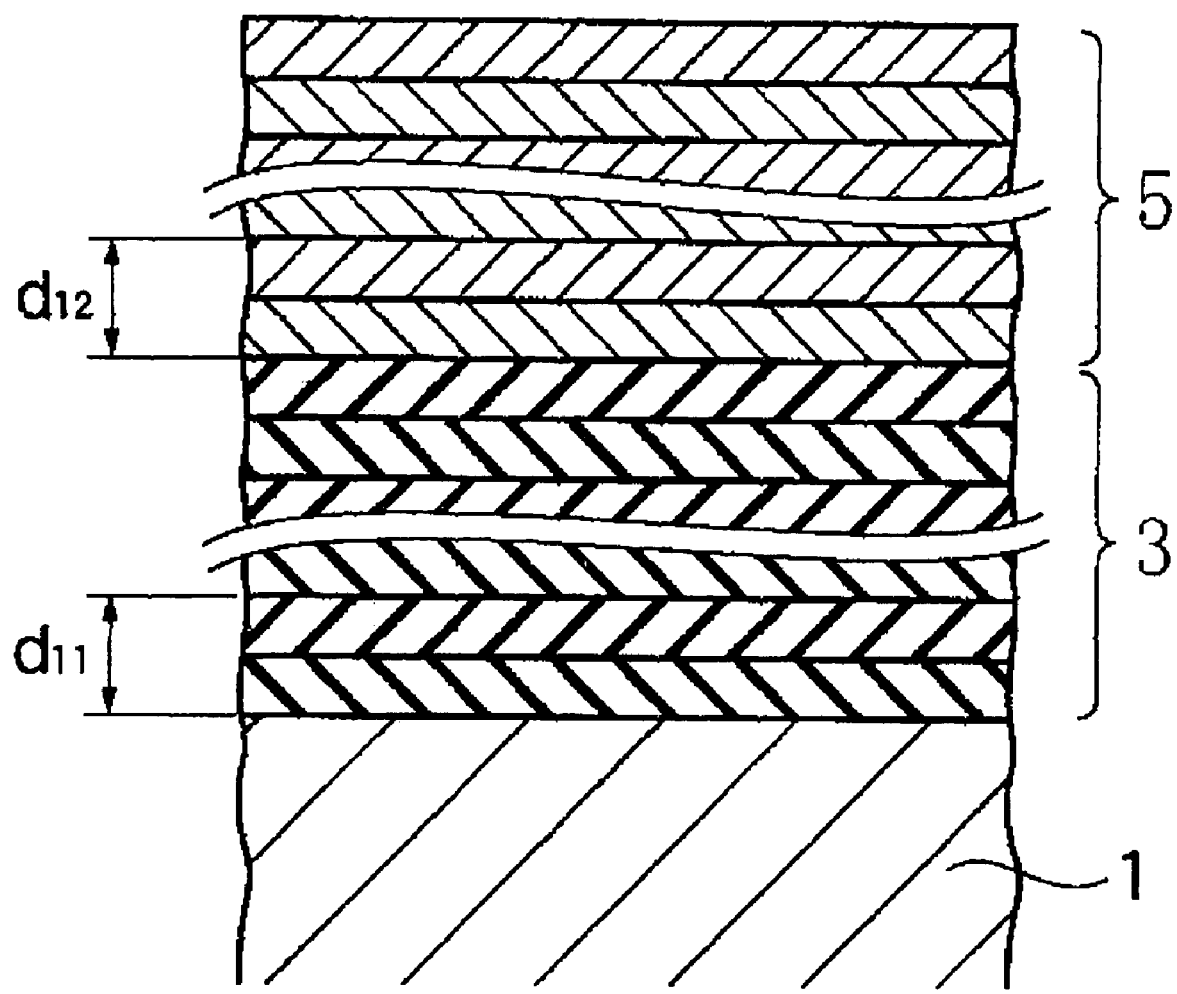
FIG. 1 is a sectional view showing a multilayer mirror according to a first embodiment of the present invention.

FIG. 1 is a sectional schematic diagram of a multilayer mirror according to a first embodiment of the present invention. A substrate 1 is made of low thermal expansion glass polished until the roughness of the surface (the upper surface in the drawing) is 0.2 nm RMS or less. On the surface of the substrate 1, 20 pair layers of Ru/Si multilayer 3 are formed and on the Ru/Si multilayer 3, five pair layers of Mo/Si multilayer 5 are formed. The periodic length (the thickness of unit periodic structure (layer pair) of Ru/Si, denoted by di, in the drawing) of the Ru/Si multilayer 3 is 6.86 nm and the periodic length. (the thickness of the layer pair of Mo/Si, denoted by $d_{12}$ in the drawing) of the Mo/Si multilayer 5 is 6.9 nm. The Γ value of these multilayers is 0.4 in each unit periodic structure. Note that, the Γ value is a ratio ($\Gamma = d_{Ru}/d$, or $\Gamma = d_{Mo}/d$) of the thickness ($d_{Ru}$, or $d_{Mo}$) of the Ru layer or Mo layer to the periodic length (d) of the multilayer.

Here, a method for manufacturing a multilayer in the present embodiment is explained. First, the surface of the substrate 1 made of low thermal expansion glass is polished until 0.2 nm RMS or less is attained. Next, on the surface of the substrate 1, 20 pair layers of Ru/Si multilayer 3 are formed by magnetron sputtering. Then, on the surface of the Ru/Si multilayer 3, five pair layers of Mo/Si multilayer 5 are formed by magnetron sputtering.

FIG. 2 and FIG. 3 are graphs showing the calculated values of reflectivity of the multilayer mirror according to the present embodiment. FIG. 2(A) and FIG. 2(B) show the dependence on the wavelength of incidence light and FIG. 3(A) and FIG. 3(B) show the dependence on the incidence angle of incidence light. The horizontal axis in FIG. 2 represents the wavelength of incidence light. The horizontal axis in FIG. 3 represents the incidence angle (hereinafter, the incidence angle refers to an angle that the incidence light makes with the normal to the reflective surface). In both drawings, the vertical axis represents the reflectivity of the multilayer and the solid line (i) indicates the reflectivity of the multilayer (the deep layer side: 20 pair layers of Ru/Si, the surface layer side: five pair layers of Mo/Si). The dotted line (ii) in FIG. 2(A) and FIG. 3(A) and the dotted line (iii) in FIG. 2(B) and FIG. 3(B) are comparative examples. The comparative example (ii) shows the reflectivity of the Ru/Si multilayer of 26 pair layers and the comparative example (iii) shows the reflectivity of the Mo/Si multilayer of 2 pair layers.

As shown in FIG. 2(A), the reflectivity peak value of the multilayer (i) in the present embodiment is 69.7% and the full width at half maximum is 0.86 nm. In contrast to this, in the comparative example (ii) (the Ru/Si multilayer of 26 pair layers), like the present embodiment (i), the full width at half maximum is as wide as 0.86 nm, however, the reflectivity peak value is as low as 67.4%, which is lower by 2% or more. Further, as shown in FIG. 2(B), in the comparative example (iii) (the Mo/Si multilayer of 27 pair layers), the peak value is about 70.0%, which is substantially the same as the present embodiment (i), however, the full width at half maximum is 0.72 nm, narrower by 0.1 nm or more. As described above, by forming the Mo/Si multilayer on the Ru/Si multilayer, a reflectivity the peak value of which is high and the full width at half maximum of which is wide can be obtained.

As shown in FIG. 3(A), the multilayer (i) in the present embodiment resembles the comparative example (ii) in that the reflectivity is maximum and almost constant in the incidence angle range of 0° to 10°, however, the peak reflectivity is higher than that in the comparative example (ii). Further, as shown in FIG. 3(B), the peak reflectivity of the multilayer (i) in the present embodiment is higher than that in the comparative example (iii) and the incidence angle range in which the peak reflectivity thereof is constant is wider than that in the comparative example (iii). As described above, in the present embodiment, a reflectivity that is almost constant in a wide incidence angle range can be obtained.

Note that, the periodic length referred to in the present embodiment is just an example, and the periodic length may be adjusted in accordance with the target wavelength to be used. Further, in the present embodiment, the multilayer is formed by magnetron sputtering, however, the film forming method is not limited to this and a film may be formed by ion beam sputtering or vacuum deposition. In the present embodiment, the Γ value of the multilayer is set to 0.4, however, the Γ value is not limited to this and the Γ value may be increased to, for example, about 0.5 on the substrate if the periodic structure can be controlled. In this case, a higher reflectivity can be obtained (refer to the non-patent document 4 described above).

Embodiment 2

Figure 4:
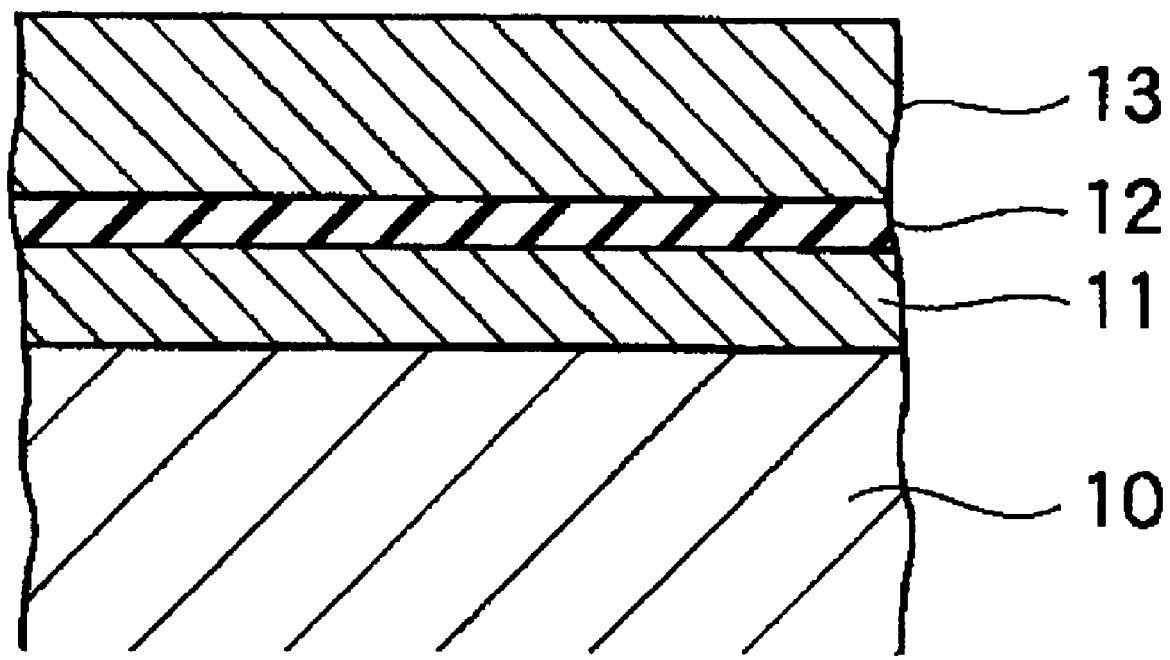
FIG. 4 is a sectional view showing a multilayer mirror according to a second embodiment of the present invention.

FIG. 4 is a sectional schematic diagram of a multilayer mirror according to a second embodiment of the present invention. A substrate 10 is made of low thermal expansion glass polished until the roughness of the surface (the upper surface in the drawing) is 0.2 nm RMS or less. On the surface of the substrate 10, four pair layers of Mo/Si multilayer (deep layer film group) 11 are formed. The periodic length of the Mo/Si multilayer 11 (the thickness of the pair layer of Mo/Si) is 6.9 nm and the Γ value is 0.5.

On the surface of the Mo/Si multilayer 11, an additional layer 12 (in the present embodiment, a silicon layer) is formed. The thickness of the additional layer 12 is adjusted so as to have an optical thickness of about one-fourth of the wavelength of incidence light. In the present embodiment, the thickness of the additional layer 12 is about 3.5 nm. Further, on the surface of the additional layer 12, 20 pair layers of Mo/Si multilayer (surface layer film group) 13 having a periodic length of 6.9 nm and a Γ value of 0.4 are formed. Additionally, in the drawing, the surface layer film group 13 and the deep layer film group 11 are further simplified and shown.

FIG. 5 is a graph showing the calculated values of reflectivity of the multilayer mirror according to the present embodiment. FIG. 5(A) shows the dependence on the wavelength of incidence light and FIG. 5(B) shows the dependence on the incidence angle of incidence light. The horizontal axis in FIG. 5(A) represents the wavelength of incidence light and the horizontal axis in FIG. 5(B) represents the incidence angle. In both drawings, the vertical axis represents the calculated values of the reflectivity. The solid line (W1) in the drawing indicates the reflectivity of the multilayer mirror in the present embodiment and the dotted line (C) shows a comparative example. The comparative example (C) shows the reflectivity of the Mo/Si multilayer of 40 pair layers.

As shown in FIG. 5(A), the full width at half maximum of the reflectivity peak of the multilayer (W1) in the present embodiment is 0.9 nm or more. Further, the shape of the reflectivity peak in the present embodiment (W1) is a top-flattened shape and the reflectivity is about 52%, almost constant, in the wavelength range of 13.2 nm to 13.7 nm. When this is compared to the comparative example (C), the peak value of the reflectivity of the multilayer (W1) in the present embodiment is not a match for that in the comparative example (C), which is a multilayer of a simple periodic structure, however, it is known that the uniformity in the reflectivity across a wide wavelength band is very excellent.

As shown in FIG. 5(B), the reflectivity of the multilayer (W1) in the present embodiment is almost constant across a wide range of the incidence angle of 0° to about 13°. In contrast to this, in the comparative example (C), the incidence angle range in which the reflectivity is almost constant is 0° to about 7°. In the present embodiment, the range in which the reflectivity is constant is obviously wider than that in the comparative example (C). Therefore, according to the present embodiment, the incidence angle dependence of the reflectivity is considerably reduced and it is known that a high reflectivity can be obtained in a wide incidence angle range.

Supplementary items of the embodiment 2 are explained below. In the present embodiment, the Γ value of the multilayer is varied between the upper part and the lower part of the additional layer 12, however, the present invention is not limited to this and for example, the Γ value may be the same. Further, in the present embodiment, silicon is used as the material of the additional layer 12, however, the material of the additional layer is not limited to this. As the material of the additional layer, in addition to silicon, boron (B), Mo, and Ru the absorption in the EUV region is small, or carbon tetraboride ($B_4C$), silicon carbide (SiC), etc., including these substances are preferable. If a slight drop in the reflectivity does not bring about a serious problem, other substances will do. However, even in a case where any one of the substances is used, it is necessary for the thickness, the optical thickness, of the additional layer 12 to be about one-fourth of the wavelength of incidence light (about half the multilayer periodic length) or the thickness plus an integer multiple of the periodic length. The above-mentioned supplementary items also apply to embodiments 3 and 4.

In the present embodiment, with the additional layer 12 sandwiched in between, the four pair layers are formed on the substrate side and the 20 pair layers are formed on the incidence side, however, the number of pairs is not limited to this. It is desirable to vary the number of pairs so as to obtain an adequate reflectivity or a uniform reflectivity in accordance with the purpose of use.

Embodiment 3

Figure 6:
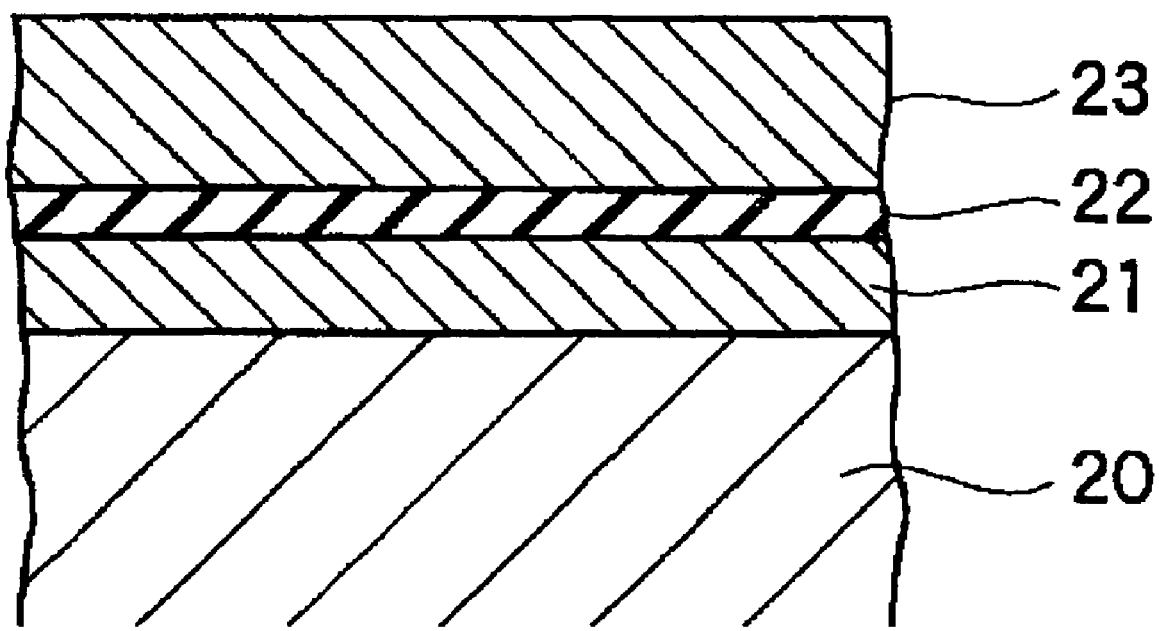
FIG. 6 is a sectional view showing a multilayer mirror according to a third embodiment of the present invention.

FIG. 6 is a sectional schematic diagram of a multilayer mirror according to a third embodiment of the present invention. A substrate 20 is made of low thermal expansion glass polished until the roughness of the surface (the upper surface in the drawing) is 0.2 nm RMS or less. On the surface of the substrate 20, five pair layers of Ru/Si multilayer (deep layer film group) 21 are formed. The periodic length of the Ru/Si multilayer 21 (the thickness of the pair layer of Ru/Si) is 6.9 nm and the Γ value is 0.5.

On the surface of the Ru/Si multilayer 21, an additional layer 22 (in the present embodiment, a silicon layer) is formed. The thickness of the additional layer 22 is adjusted so as to have an optical thickness of about one-fourth of the wavelength of incidence light. In the present embodiment, the thickness of the additional layer 22 is about 3.85 nm. Further, on the surface of the additional layer 22, 20 pair layers of Ru/Si multilayer (surface layer film group) 23 having a periodic length of 6.96 nm and a Γ value of 0.4 are formed.

FIG. 7 is a graph showing the calculated values of reflectivity of the multilayer mirror according to the present embodiment. FIG. 7(A) shows the dependence on the wavelength of incidence light and FIG. 7(B) shows the dependence on the incidence angle of incidence light. The horizontal axis in FIG. 7(A) represents the wavelength of incidence light and the horizontal axis in FIG. 7(B) represents the incidence angle. In both drawings, the vertical axis represents the calculated values of the reflectivity. The solid line (W2) in the drawing indicates the reflectivity of the multilayer mirror in the present embodiment and the dotted line (C) shows a comparative example. The comparative example (C) shows the reflectivity of the Mo/Si multilayer of 40 pair layers.

As shown in FIG. 7(A), the full width at half maximum of the reflectivity peak of the multilayer (W2) in the present embodiment is 1.0 nm or more. Further, the shape of the reflectivity peak in the present embodiment (W2) is a top-flattened shape and the reflectivity is about 60%, almost constant, in the wavelength range of 13.2 nm to 13.7 nm. When this is compared to the comparative example (C), the peak value of the reflectivity of the multilayer (W2) in the present embodiment is not a match for that in the comparative example (C), which is a multilayer of a simple periodic structure, however, it is known that the uniformity in the reflectivity across a wide wavelength band is very excellent.

As shown in FIG. 7(B), the reflectivity of the multilayer (W2) in the present embodiment is almost constant across a wide range of the incidence angle of 0° to about 13°. In contrast to this, in the comparative example (C), the incidence angle range in which the reflectivity is almost constant is 0° to about 7°. Therefore, in the present embodiment, the range in which the reflectivity is constant is obviously wider than that in the comparative example (C). Thus, in the present embodiment, the incidence angle dependence of the reflectivity is considerably reduced and it is known that a high reflectivity can be obtained in a wide incidence angle range.

Note that, in the present embodiment, with the additional layer 22 sandwiched in between, the five pair layers are formed on the substrate side and the 20 pair layers are formed on the incidence side, however, the number of pairs is not limited to this. It is desirable to vary the number of pairs so as to obtain an adequate reflectivity or a uniform reflectivity in accordance with the purpose of use.

Embodiment 4

Figure 8:
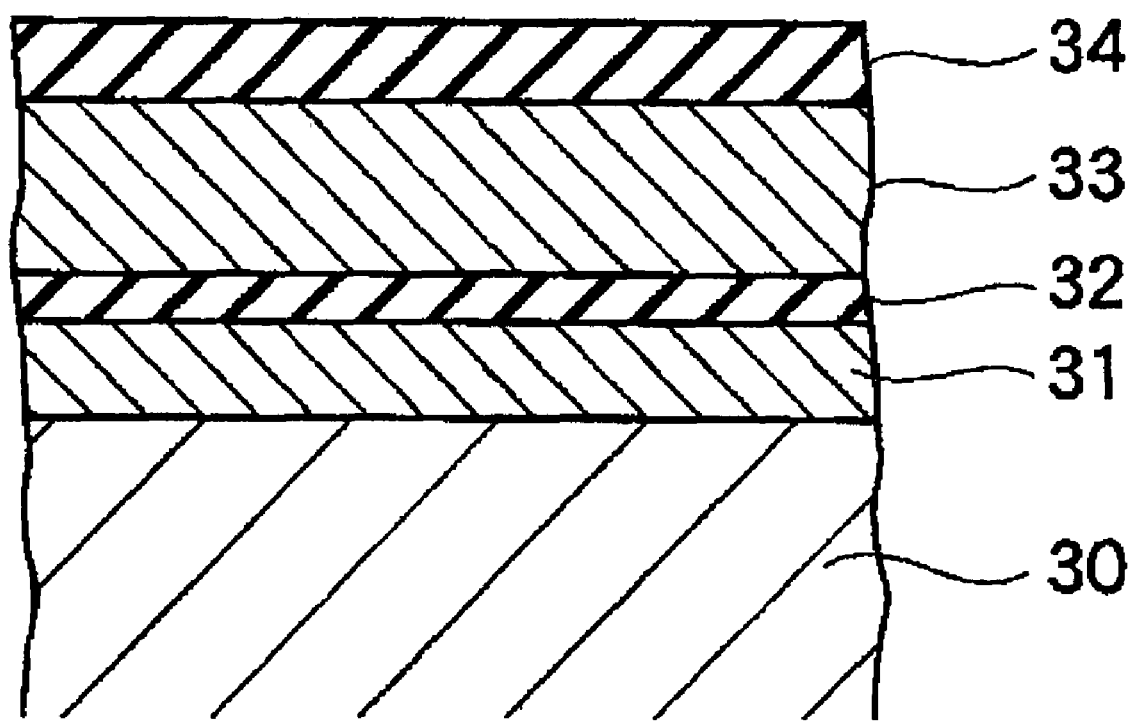
FIG. 8 is a sectional view showing a multilayer mirror according to a fourth embodiment of the present invention.

FIG. 8 is a sectional schematic diagram of a multilayer mirror according to a fourth embodiment of the present invention. A substrate 30 is made of low thermal expansion glass polished until the roughness of the surface (the upper surface in the drawing) is 0.2 nm RMS or less. On the surface of the substrate 30, five pair layers of Ru/Si multilayer (deep layer film group) 31 are formed. The periodic length of the Ru/Si multilayer 31 (the thickness of the pair layer of Ru/Si) is 6.96 nm and the Γ value is 0.5.

On the surface of the Ru/Si multilayer 31, an additional layer 32 (in the present embodiment, a silicon layer) is formed. The thickness of the additional layer 32 is adjusted so as to have an optical thickness of about one-fourth of the wavelength of incidence light. In the present embodiment, the thickness of the additional layer 32 is about 3.75 nm. Further, on the surface of the additional layer 32, 16 pair layers of Ru/Si multilayer (second surface layer film group) 33 having a periodic length of 6.96 nm and a $\Gamma$ value of 0.4 are formed, and on the surface of the Ru/Si layer 33, five pair layers of Mo/Si multilayer (first surface layer film group) 34 having a periodic length of 6.9 nm and a $\Gamma$ value of 0.4 are formed.

FIG. 9 is a graph showing the calculated values of reflectivity of the multilayer mirror according to the present embodiment. FIG. 9(A) shows the dependence on the wavelength of incidence light and FIG. 9(B) shows the dependence on the incidence angle of incidence light. The horizontal axis in FIG. 9(A) represents the wavelength of incidence light and the horizontal axis in FIG. 9(B) represents the incidence angle. In both drawings, the vertical axis represents the calculated values of the reflectivity, the solid line (W3) indicates the reflectivity of the multilayer mirror in the present embodiment, and the dotted line (C) shows a comparative example. The comparative example (C) shows the reflectivity of the Mo/Si multilayer of 40 pair layers.

As shown in FIG. 9(A), the full width at half maximum of the reflectivity peak of the multilayer (W3) in the present embodiment is 1.0 nm or more. Further, the shape of the reflectivity peak in the present embodiment (W3) is a top-flattened shape and the reflectivity is about 62%, almost constant, in the wavelength range of 13.2 nm to 13.7 nm. When this is compared to the comparative example (C), the peak value of the reflectivity of the multilayer (W3) in the present embodiment is not a match for that in the comparative example (C), which is a multilayer of a simple periodic structure, however, it is known that the uniformity in the reflectivity across a wide wavelength band is very excellent.

As shown in FIG. 9(B), the reflectivity of the multilayer (W3) in the present embodiment is almost constant across a wide range of the incidence angle of 0° to about 10° and the reflectivity does not drop considerably up to an incidence angle of about 15°. In contrast to this, in the comparative example (C), the incidence angle range in which the reflectivity is almost constant is 0° to about 7°, and the reflectivity sharply drops in the vicinity of the incidence angle of about 10°. Therefore, in the present embodiment, the range in which the reflectivity is constant is obviously wider than that in the comparative example (C). Thus, in the present embodiment, the incidence angle dependence of the reflectivity is considerably reduced and it is known that a high reflectivity can be obtained in a wide incidence angle range.

Note that, in the present embodiment, with the additional layer 32 sandwiched in between, the five pair layers are formed on the substrate side and the 21(=16+5) pair layers are formed on the incidence side, however, the number of pairs is not limited to this. It is desirable to vary the number of pairs so as to obtain an adequate reflectivity or a uniform reflectivity in accordance with the purpose of use.

Embodiment 5

Next, a multilayer mirror according to a fifth embodiment of the present invention will be explained. In the multilayer in the present embodiment, the material configuration and the film thickness of each layer are optimized by using the Needle Method so as to be capable of obtaining a uniformly high reflectivity for the EUV ray (Extreme Ultra-Violet ray) having a wavelength of 13.5 nm and being made incident at an incidence angle of 15° to 25°.

The multilayer in the present embodiment is one formed on the surface of a synthetic silica glass substrate precisely polished, including a plurality of blocks in which a layer pair (a unit periodic structure) having different structures is laminated repeatedly. Here, a layer pair (a unit periodic structure) is one in which a low refractive-index film made of a substance having a low refractive index and a high refractive-index film made of a substance having a high refractive index for EUV ray are laminated into a multilayer. In the present embodiment, molybdenum (Mo) and ruthenium (Ru) are used as a low refractive-index film and silicon (Si) is used as a high refractive-index film.

Additionally, in the following explanation, the configuration of a multilayer is expressed by the configuration of one layer pair in each block (unit periodic structure) and the number of laminated layer pairs (the number of repetitions) and each block is expressed by a number counted from the substrate (the A-th block).

The configuration of the multilayer in the present embodiment is shown in Table 1. The total film thickness of the multilayer in the present embodiment is about 450 nm. Further, it is preferable for the thickness of each layer of the multilayer to be not constant and to be adjusted so as to obtain a desired reflectivity by varying in accordance with the position on the multilayer.

TABLE 1

| A | Unit Periodic Structure | Number of Repetitions |
|---|---|---|
| 1 | Ru/Si | 3 |
| 2 | Ru/Mo/Si | 4 |
| 3 | Mo/Si | 6 |
| 4 | Mo/Ru/Mo/Si | 1 |
| 5 | Ru/Mo/Si | 4 |
| 6 | Mo/Si | 20 |
| 7 | Mo/Ru/Mo/Si | 14 |
| 8 | Mo/Si | 4 |
| 9 | Mo | 1 |

In the following Table 2, Table 3, and Table 4, the film thickness of each layer of the multilayer in the present embodiment is shown. In these tables, each layer of the multilayer is expressed by a number counted from the substrate side and a preferable film thickness range (nm) and a more preferable film thickness (nm) are shown for each layer. Note that, since the number of layers of the multilayer is large, the table is shown in a plurality of divided tables.

TABLE 2

| | Unit Periodic Structure | Preferable Film Thickness Range (nm) | More Preferable Film Thickness (nm) |
|---|---|---|---|
| 1 | Ru | 6~2 | 4 |
| 2 | Si | 6~2 | 4 |
| 3 | Ru | 6~2 | 4 |
| 4 | Si | 6~2 | 4 |
| 5 | Ru | 6~2 | 4 |
| 6 | Si | 6~2 | 4 |
| 7 | Ru | 5~2 | 3 |
| 8 | Mo | 2~0 | 1 |
| 9 | Si | 6~2 | 4 |
| 10 | Ru | 4~1 | 3 |
| 11 | Mo | 2~0 | 1 |
| 12 | Si | 6~2 | 4 |
| 13 | Ru | 4~1 | 2 |

TABLE 2-continued

| | Unit Periodic Structure | Preferable Film Thickness Range (nm) | More Preferable Film Thickness (nm) |
|---|---|---|---|
| 14 | Mo | 2~0 | 1 |
| 15 | Si | 6~2 | 4 |
| 16 | Ru | 3~1 | 2 |
| 17 | Mo | 3~1 | 2 |
| 18 | Si | 6~2 | 4 |
| 19 | Mo | 5~2 | 3 |
| 20 | Si | 6~2 | 4 |
| 21 | Mo | 4~1 | 2 |
| 22 | Si | 6~2 | 4 |
| 23 | Mo | 2~0 | 1 |
| 24 | Si | 6~2 | 4 |
| 25 | Mo | 5~2 | 3 |
| 26 | Si | 6~2 | 4 |
| 27 | Mo | 5~2 | 4 |
| 28 | Si | 6~2 | 4 |
| 29 | Mo | 5~2 | 4 |
| 30 | Si | 6~2 | 4 |
| 31 | Mo | 2~0 | 1 |
| 32 | Ru | 2~0 | 1 |
| 33 | Mo | 3~1 | 2 |
| 34 | Si | 6~2 | 4 |
| 35 | Ru | 3~1 | 2 |
| 36 | Mo | 2~0 | 2 |
| 37 | Si | 6~2 | 4 |
| 38 | Ru | 3~1 | 2 |
| 39 | Mo | 3~1 | 2 |
| 40 | Si | 6~2 | 4 |
| 41 | Ru | 2~0 | 2 |
| 42 | Mo | 3~1 | 2 |
| 43 | Si | 6~2 | 4 |
| 44 | Ru | 2~0 | 1 |
| 45 | Mo | 4~1 | 2 |
| 46 | Si | 6~2 | 4 |
| 47 | Mo | 5~2 | 3 |
| 48 | Si | 6~2 | 4 |
| 49 | Mo | 5~2 | 3 |
| 50 | Si | 7~2 | 4 |
| 51 | Mo | 4~1 | 3 |
| 52 | Si | 7~2 | 5 |
| 53 | Mo | 3~1 | 2 |
| 54 | Si | 25~8 | 17 |
| 55 | Mo | 3~1 | 2 |
| 56 | Si | 7~2 | 5 |
| 57 | Mo | 4~1 | 3 |
| 58 | Si | 7~2 | 4 |
| 59 | Mo | 5~2 | 3 |
| 60 | Si | 6~2 | 4 |
| 61 | Mo | 5~2 | 3 |
| 62 | Si | 6~2 | 4 |
| 63 | Mo | 5~2 | 3 |
| 64 | Si | 6~2 | 4 |
| 65 | Mo | 5~2 | 3 |
| 66 | Ru | 6~2 | 4 |
| 67 | Mo | 5~2 | 3 |
| 68 | Si | 6~2 | 4 |

TABLE 3

| | Unit Periodic Structure | Preferable Film Thickness Range (nm) | More Preferable Film Thickness (nm) |
|---|---|---|---|
| 69 | Mo | 5~2 | 3 |
| 70 | Si | 6~2 | 4 |
| 71 | Mo | 5~2 | 3 |
| 72 | Si | 6~2 | 4 |
| 73 | Mo | 5~2 | 3 |
| 74 | Si | 7~2 | 4 |
| 75 | Mo | 5~2 | 3 |
| 76 | Si | 7~2 | 5 |
| 77 | Mo | 4~1 | 3 |

TABLE 3-continued

| | Unit Periodic Structure | Preferable Film Thickness Range (nm) | More Preferable Film Thickness (nm) |
|---|---|---|---|
| 78 | Si | 8~3 | 5 |
| 79 | Mo | 3~1 | 2 |
| 80 | Si | 35~12 | 23 |
| 81 | Mo | 4~1 | 3 |
| 82 | Si | 7~2 | 5 |
| 83 | Mo | 5~2 | 3 |
| 84 | Si | 6~2 | 4 |
| 85 | Mo | 5~2 | 3 |
| 86 | Si | 6~2 | 4 |
| 87 | Mo | 2~0 | 1 |
| 88 | Ru | 2~0 | 1 |
| 89 | Mo | 3~1 | 2 |
| 90 | Si | 6~2 | 4 |
| 91 | Mo | 2~0 | 1 |
| 92 | Ru | 3~1 | 2 |
| 93 | Mo | 2~0 | 1 |
| 94 | Si | 6~2 | 4 |
| 95 | Mo | 2~0 | 1 |
| 96 | Ru | 3~1 | 2 |
| 97 | Mo | 2~0 | 1 |
| 98 | Si | 6~2 | 4 |
| 99 | Mo | 2~0 | 1 |
| 100 | Ru | 3~1 | 2 |
| 101 | Mo | 2~0 | 1 |
| 102 | Si | 6~2 | 4 |
| 103 | Mo | 2~0 | 1 |
| 104 | Ru | 3~1 | 2 |
| 105 | Mo | 2~0 | 1 |
| 106 | Si | 6~2 | 4 |
| 107 | Mo | 2~0 | 1 |
| 108 | Ru | 3~1 | 2 |
| 109 | Mo | 2~0 | 1 |
| 110 | Si | 6~2 | 4 |
| 111 | Mo | 2~0 | 1 |
| 112 | Ru | 3~1 | 2 |
| 113 | Mo | 2~0 | 1 |
| 114 | Si | 6~2 | 4 |
| 115 | Mo | 2~0 | 1 |
| 116 | Ru | 3~1 | 2 |
| 117 | Mo | 2~0 | 1 |
| 118 | Si | 6~2 | 4 |
| 119 | Mo | 2~0 | 1 |
| 120 | Ru | 3~1 | 2 |
| 121 | Mo | 2~0 | 1 |
| 122 | Si | 6~2 | 4 |
| 123 | Mo | 2~0 | 1 |
| 124 | Ru | 3~1 | 2 |
| 125 | Mo | 2~0 | 2 |
| 126 | Si | 6~2 | 4 |

TABLE 4

| | Unit Periodic Structure | Preferable Film Thickness Range (nm) | More Preferable Film Thickness (nm) |
|---|---|---|---|
| 127 | Mo | 2~0 | 1 |
| 128 | Ru | 2~0 | 2 |
| 129 | Mo | 2~0 | 2 |
| 130 | Si | 6~2 | 4 |
| 131 | Mo | 2~0 | 1 |
| 132 | Ru | 2~0 | 1 |
| 133 | Mo | 3~1 | 2 |
| 134 | Si | 6~2 | 4 |
| 135 | Mo | 2~0 | 1 |
| 136 | Ru | 2~0 | 1 |
| 137 | Mo | 3~1 | 2 |
| 138 | Si | 6~2 | 4 |
| 139 | Mo | 2~0 | 1 |
| 140 | Ru | 2~0 | 1 |
| 141 | Mo | 3~1 | 2 |

TABLE 4-continued

| | Unit Periodic Structure | Preferable Film Thickness Range(nm) | More Preferable Film Thickness (nm) |
|---|---|---|---|
| 142 | Si | 6~2 | 4 |
| 143 | Mo | 5~2 | 3 |
| 144 | Si | 6~2 | 4 |
| 145 | Mo | 5~2 | 3 |
| 146 | Si | 6~2 | 4 |
| 147 | Mo | 5~2 | 3 |
| 148 | Si | 7~2 | 4 |
| 149 | Mo | 5~2 | 3 |
| 150 | Si | 7~2 | 4 |
| 151 | Mo | 4~1 | 3 |

According to the table, the silicon layers of the 54th and 80th layers counted from the substrate side are thicker than other layers (in the following explanation, these are referred to as extremely thick silicon layers). The extremely thick silicon layer has a thickness of half or more of the center wavelength of EUV ray and serves a role as an interposed layer for widening the band of the EUV ray wavelength or incidence angle having a relatively high EUV ray reflectivity by adjusting the phase difference of the EUV ray reflected from the boundary surface of each layer.

Figure 10:
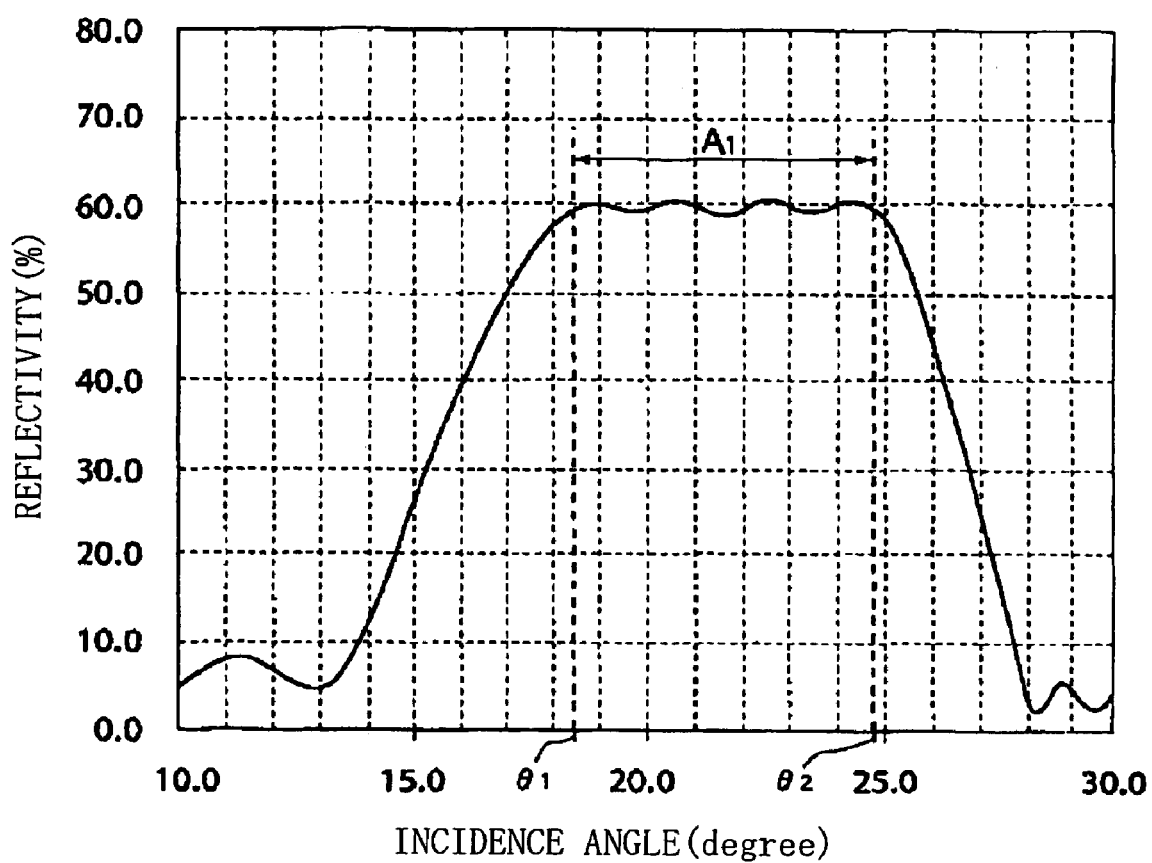
FIG. 10 shows the incidence angle dependence of the reflectivity of a multilayer mirror according to a fifth embodiment of the present invention.

FIG. 10 is a graph showing the incidence angle dependence of the reflectivity of the multilayer mirror according to the present embodiment. In the drawing, the horizontal axis represents the incidence angle (degree (°)) of light made incident to the multilayer mirror and the vertical axis represents the reflectivity (%) for the EUV ray having a wavelength ($\lambda$) of 13.5 nm. As seen from the drawing, in the multilayer in the present embodiment, a high reflectivity of 50% or more can be obtained for the EUV ray in a wide incidence range (at least an incidence angle of 18° to 25°). Particularly, in a region Al (an incidence angle range of $\theta1(18.4°)$ to $\theta2(24.8°)$ shown in the drawing, the reflectivity is almost constant in the vicinity of 60% and there is almost no incidence angle dependence of the reflectivity, therefore, a high resolution can be obtained.

Embodiment 6

Next, a sixth embodiment of the present invention will be explained. A multilayer in the present embodiment is one in which the material configuration of each layer and the total film thickness are optimized while the ratio of the film thickness for each layer is maintained so as to be capable of obtaining a high reflectivity for the EUV ray having a wavelength of 13.5 nm and being made incident at an incidence angle of 0° to 20°. The multilayer in the present embodiment is used, for example, to obtain a high reflectivity uniformly on the entire reflective surface by controlling the total film thickness for each section for optical elements with different light ray incidence angles for each section in the same reflective surface.

The multilayer in the present embodiment is one formed by forming the multilayer having the structure shown in the following Table 5 on a synthetic silica glass substrate polished precisely. Note that, the total film thickness of the multilayer in the present embodiment is about 420 nm to 430 nm. Further, it is preferable for the thickness of each layer of the multilayer to be not constant and to be adjusted so as to obtain a desired reflectivity by varying the thickness in accordance with the position on the multilayer.

TABLE 5

| A | Unit Periodic Structure | Number of Repetitions |
|---|---|---|
| 1 | Ru/Si | 4 |
| 2 | Ru/Mo/Si | 6 |
| 3 | Mo/Si | 5 |
| 4 | Ru/Mo/Si | 5 |
| 5 | Mo/Ru/Mo/Si | 2 |
| 6 | Mo/Si | 9 |
| 7 | Mo/Ru/Mo/Si | 19 |
| 8 | Mo/Si | 3 |
| 9 | Mo | 1 |

In the following Table 6, Table 7, and Table 8, the film thickness for each layer of the multilayer in the present embodiment is shown. Note that, since the number of layers of the multilayer is large, the table is shown in a plurality of divided tables. According to these tables, the 28th and 69th silicon layers counted from the substrate side are the extremely thick silicon layer.

TABLE 6

| | Unit Periodic Structure | Preferable Film Thickness Range (nm) | More Preferable Film Thickness (nm) |
|---|---|---|---|
| 1 | Ru | 9~3 | 6 |
| 2 | Si | 6~2 | 4 |
| 3 | Ru | 6~2 | 4 |
| 4 | Si | 6~2 | 4 |
| 5 | Ru | 6~2 | 4 |
| 6 | Si | 6~2 | 4 |
| 7 | Ru | 6~2 | 4 |
| 8 | Si | 6~2 | 4 |
| 9 | Ru | 5~2 | 3 |
| 10 | Mo | 2~0 | 1 |
| 11 | Si | 6~2 | 4 |
| 12 | Ru | 4~1 | 3 |
| 13 | Mo | 2~0 | 1 |
| 14 | Si | 6~2 | 4 |
| 15 | Ru | 4~1 | 3 |
| 16 | Mo | 2~0 | 1 |
| 17 | Si | 6~2 | 4 |
| 18 | Ru | 4~1 | 3 |
| 19 | Mo | 2~0 | 1 |
| 20 | Si | 6~2 | 4 |
| 21 | Ru | 3~1 | 2 |
| 22 | Mo | 2~0 | 1 |
| 23 | Si | 6~2 | 4 |
| 24 | Ru | 2~0 | 1 |
| 25 | Mo | 3~1 | 2 |
| 26 | Si | 6~2 | 4 |
| 27 | Mo | 5~2 | 3 |
| 28 | Si | 22~7 | 15 |
| 29 | Mo | 5~2 | 3 |
| 30 | Si | 6~2 | 4 |
| 31 | Mo | 5~2 | 3 |
| 32 | Si | 6~2 | 4 |
| 33 | Mo | 5~2 | 3 |
| 34 | Si | 6~2 | 4 |
| 35 | Mo | 5~2 | 3 |
| 36 | Si | 6~2 | 4 |
| 37 | Ru | 2~0 | 1 |
| 38 | Mo | 3~1 | 2 |
| 39 | Si | 6~2 | 4 |
| 40 | Ru | 2~0 | 2 |
| 41 | Mo | 3~1 | 2 |
| 42 | Si | 6~2 | 4 |
| 43 | Ru | 2~0 | 1 |
| 44 | Mo | 3~1 | 2 |
| 45 | Si | 6~2 | 4 |
| 46 | Ru | 2~0 | 1 |
| 47 | Mo | 3~1 | 2 |
| 48 | Si | 6~2 | 4 |
| 49 | Ru | 2~0 | 1 |

TABLE 6-continued

| Unit Periodic Structure | Preferable Film Thickness Range (nm) | More Preferable Film Thickness (nm) |
|---|---|---|
| 50 | Mo | 3~1 | 2 |
| 51 | Si | 6~2 | 4 |
| 52 | Mo | 2~0 | 1 |
| 53 | Ru | 2~0 | 1 |
| 54 | Mo | 3~1 | 2 |
| 55 | Si | 6~2 | 4 |
| 56 | Mo | 2~0 | 1 |
| 57 | Ru | 2~0 | 1 |
| 58 | Mo | 4~1 | 2 |
| 59 | Si | 6~2 | 4 |
| 60 | Mo | 5~2 | 3 |
| 61 | Si | 7~2 | 4 |
| 62 | Mo | 4~1 | 3 |
| 63 | Si | 7~2 | 5 |
| 64 | Mo | 4~1 | 3 |
| 65 | Si | 7~2 | 5 |
| 66 | Mo | 3~1 | 2 |
| 67 | Si | 8~3 | 5 |

TABLE 7

| | Unit Periodic Structure | Preferable Film Thickness Range (nm) | More Preferable Film Thickness (nm) |
|---|---|---|---|
| 68 | Mo | 2~0 | 1 |
| 69 | Si | 36~12 | 24 |
| 70 | Mo | 3~1 | 2 |
| 71 | Si | 7~2 | 5 |
| 72 | Mo | 4~1 | 3 |
| 73 | Si | 6~2 | 4 |
| 74 | Mo | 5~2 | 3 |
| 75 | Si | 6~2 | 4 |
| 76 | Mo | 5~2 | 3 |
| 77 | Si | 6~2 | 4 |
| 78 | Mo | 2~0 | 1 |
| 79 | Ru | 2~0 | 1 |
| 80 | Mo | 3~1 | 2 |
| 81 | Si | 6~2 | 4 |
| 82 | Mo | 2~0 | 1 |
| 83 | Ru | 3~1 | 2 |
| 84 | Mo | 2~0 | 2 |
| 85 | Si | 6~2 | 4 |
| 86 | Mo | 2~0 | 1 |
| 87 | Ru | 3~1 | 2 |
| 88 | Mo | 2~0 | 1 |
| 89 | Si | 6~2 | 4 |
| 90 | Mo | 2~0 | 1 |
| 91 | Ru | 3~1 | 2 |
| 92 | Mo | 2~0 | 1 |
| 93 | Si | 6~2 | 4 |
| 94 | Mo | 2~0 | 1 |
| 95 | Ru | 3~1 | 2 |
| 96 | Mo | 2~0 | 1 |
| 97 | Si | 6~2 | 4 |
| 98 | Mo | 2~0 | 1 |
| 99 | Ru | 3~1 | 2 |
| 100 | Mo | 2~0 | 1 |
| 101 | Si | 6~2 | 4 |
| 102 | Mo | 2~0 | 1 |
| 103 | Ru | 3~1 | 2 |
| 104 | Mo | 2~0 | 1 |
| 105 | Si | 6~2 | 4 |
| 106 | Mo | 2~0 | 1 |
| 107 | Ru | 3~1 | 2 |
| 108 | Mo | 2~0 | 1 |
| 109 | Si | 6~2 | 4 |
| 110 | Mo | 2~0 | 1 |
| 111 | Ru | 3~1 | 2 |
| 112 | Mo | 2~0 | 1 |

TABLE 7-continued

| | Unit Periodic Structure | Preferable Film Thickness Range (nm) | More Preferable Film Thickness (nm) |
|---|---|---|---|
| 113 | Si | 6~2 | 4 |
| 114 | Mo | 2~0 | 1 |
| 115 | Ru | 3~1 | 2 |
| 116 | Mo | 2~0 | 1 |
| 117 | Si | 6~2 | 4 |
| 118 | Mo | 2~0 | 1 |
| 119 | Ru | 3~1 | 2 |
| 120 | Mo | 2~0 | 1 |
| 121 | Si | 6~2 | 4 |
| 122 | Mo | 2~0 | 1 |
| 123 | Ru | 3~1 | 2 |
| 124 | Mo | 2~0 | 2 |
| 125 | Si | 6~2 | 4 |

TABLE 8

| | Unit Periodic Structure | Preferable Film Thickness Range (nm) | More Preferable Film Thickness (nm) |
|---|---|---|---|
| 126 | Mo | 2~0 | 1 |
| 127 | Ru | 2~0 | 2 |
| 128 | Mo | 2~0 | 2 |
| 129 | Si | 6~2 | 4 |
| 130 | Mo | 2~0 | 1 |
| 131 | Ru | 2~0 | 1 |
| 132 | Mo | 2~0 | 2 |
| 133 | Si | 6~2 | 4 |
| 134 | Mo | 2~0 | 1 |
| 135 | Ru | 2~0 | 1 |
| 136 | Mo | 3~1 | 2 |
| 137 | Si | 6~2 | 4 |
| 138 | Mo | 2~0 | 1 |
| 139 | Ru | 2~0 | 1 |
| 140 | Mo | 3~1 | 2 |
| 141 | Si | 6~2 | 4 |
| 142 | Mo | 2~0 | 1 |
| 143 | Ru | 2~0 | 1 |
| 144 | Mo | 3~1 | 2 |
| 145 | Si | 6~2 | 4 |
| 146 | Mo | 2~0 | 1 |
| 147 | Ru | 2~0 | 1 |
| 148 | Mo | 3~1 | 2 |
| 149 | Si | 6~2 | 4 |
| 150 | Mo | 2~0 | 1 |
| 151 | Ru | 2~0 | 1 |
| 152 | Mo | 3~1 | 2 |
| 153 | Si | 6~2 | 4 |
| 154 | Mo | 5~2 | 3 |
| 155 | Si | 6~2 | 4 |
| 156 | Mo | 5~2 | 3 |
| 157 | Si | 6~2 | 4 |
| 158 | Mo | 4~1 | 3 |
| 159 | Si | 7~1 | 4 |
| 160 | Mo | 4~1 | 3 |

Figure 11:
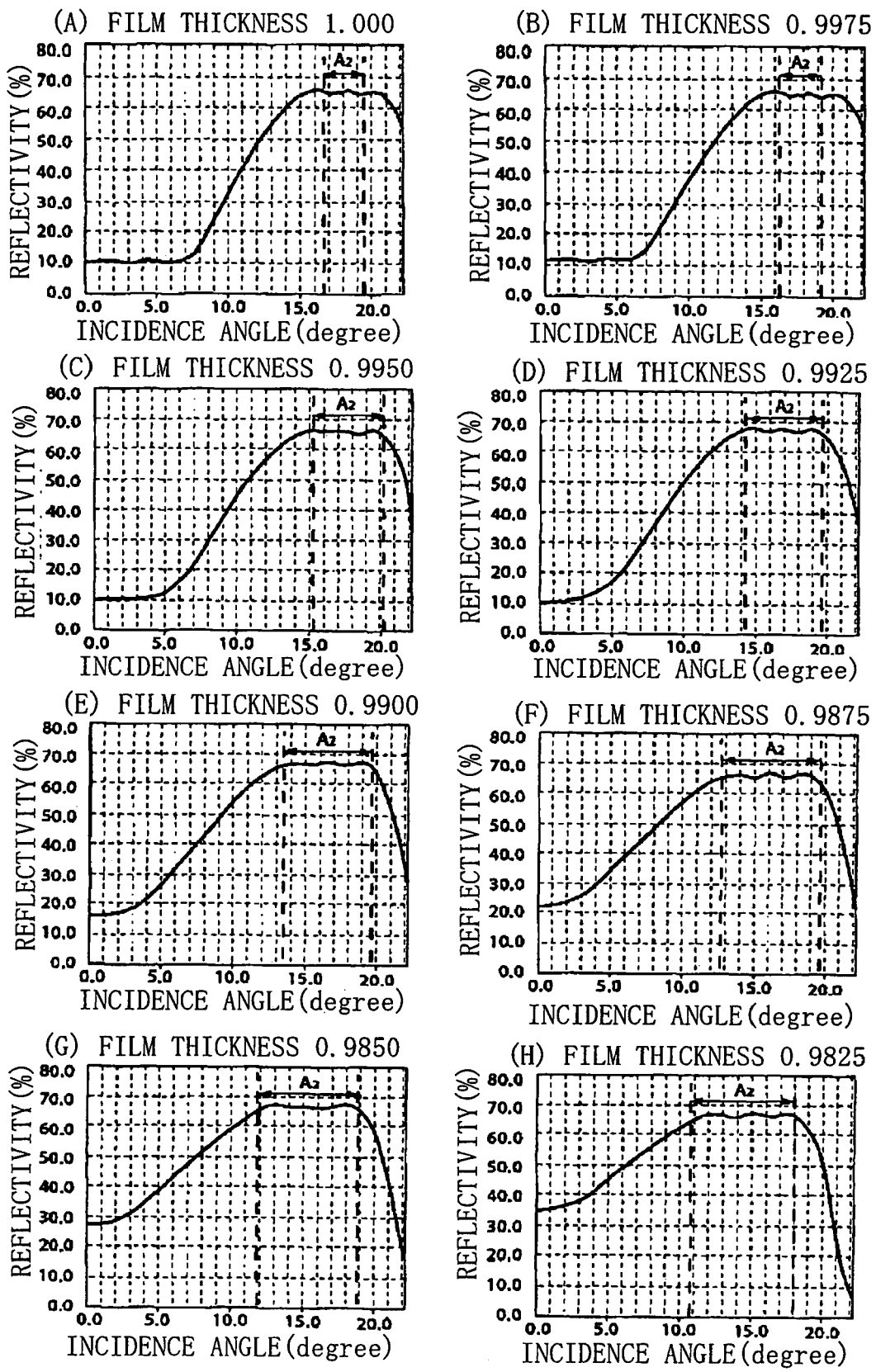
FIGS. 11(A) to (H) show the incidence angle dependence of the reflectivity of a multilayer mirror according to a sixth embodiment of the present invention.
Figure 12:
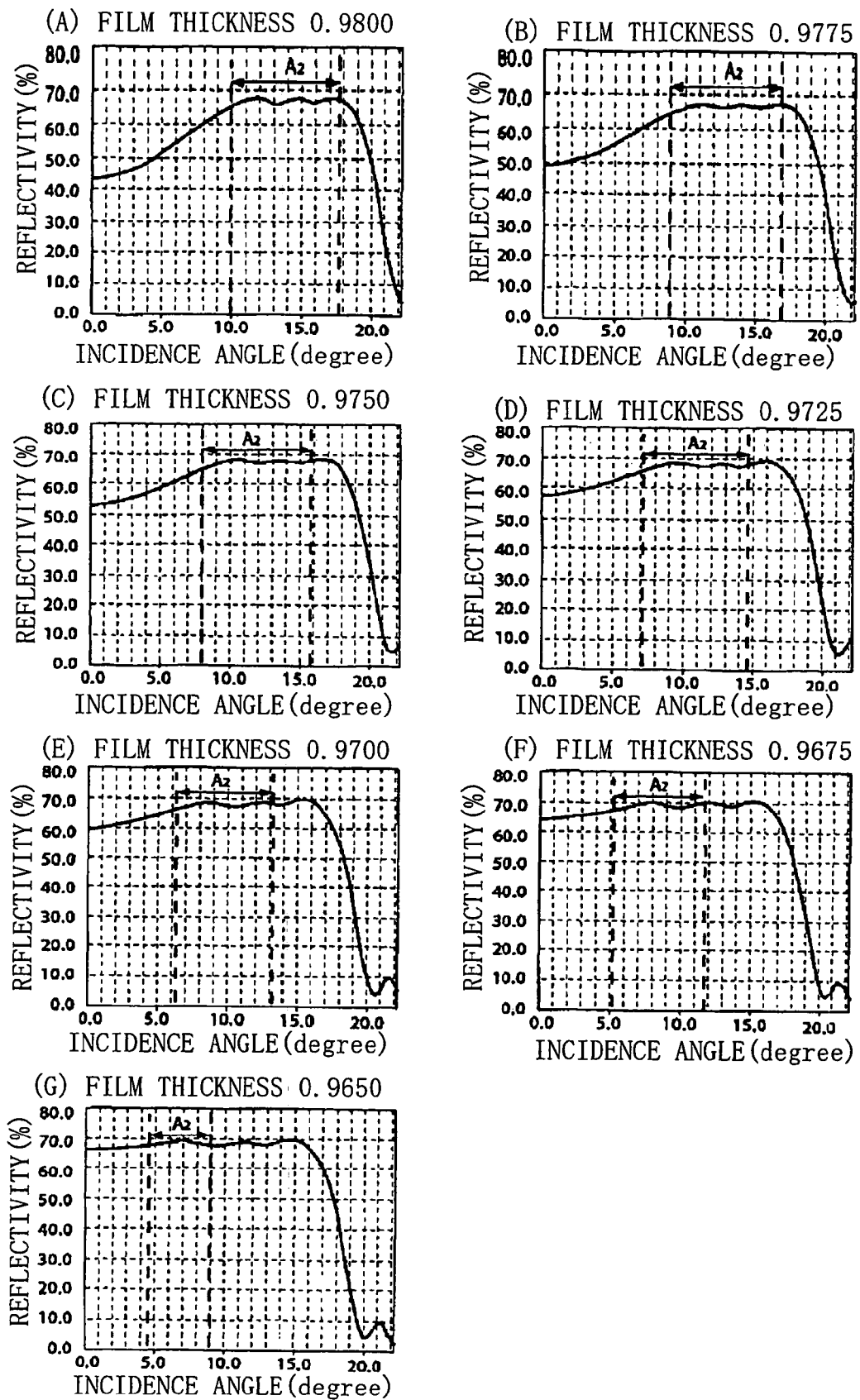
FIGS. 12(A) to (F) show the incidence angle dependence of the reflectivity of the multilayer mirror according to the sixth embodiment of the present invention.

FIG. 11 and FIG. 12 are graphs showing the incidence angle dependence of the reflectivity of the multilayer mirror according to the present embodiment. In the drawing, the horizontal axis represents the incidence angle (degree (°)) of the light made incident to the multilayer mirror and the vertical axis represents the reflectivity (%) for the EUV ray having a wavelength ($\lambda$) of 13.5 nm. The reflectivity shown in each of FIG. 11 and FIG. 12 is obtained from the multilayer the total film thickness of which is varied while the ratio of the film thickness of each layer of the multilayer is maintained. The film thickness shown in each drawing is a value when the total film thickness of the multilayer in FIG. 11(A) is assumed to be 1.000 and is varied at an interval of 0.0025 in the range of 1.000 (FIG. 11 (A)) to 0.9650 (FIG. 12(G)).

A region A2 sandwiched by the two longitudinal dotted lines in each drawing shows an incidence angle range in which the incidence angle dependence of the reflectivity is small. As seen from FIG. 11 and FIG. 12, as the total film thickness increases, the region A2 shifts toward larger incidence angles (to the right in the drawing). For example, while the region A2 in FIG. 12(G) is in the range of the incidence angle of about 4° to about 9°, in FIG. 11(A), the range is between about 17° and 20°. Therefore, according to the present embodiment, by varying the total film thickness of the multilayer, a high reflectivity of 50% or more can be obtained in a wide range of the incidence angle of 0° to 20°.

Embodiment 7

Next a seventh embodiment of the present invention will be explained. In the multilayer in the present embodiment, the material configuration and the film thickness of each layer are optimized so as to be capable of obtaining a high reflectivity for the EUV ray having a wavelength of 13.5 nm across the entire incidence light range from 0° to 20°. The multilayer in the present embodiment is one formed by forming the multilayer having a structure shown in the following Table 9 on a synthetic silica glass substrate precisely polished. Note that, the total film thickness of the multilayer in the present embodiment is about 280 nm. Further, it is preferable for the thickness of each layer of the multilayer to be not constant and to be adjusted so as to obtain a desired reflectivity by varying in accordance with the position on the multilayer.

TABLE 9

| A | Unit Periodic Structure | Number of Repetitions |
|---|---|---|
| 1 | Mo/Ru/Mo/Si | 3 |
| 2 | Ru/Mo/Si | 2 |
| 3 | Mo/Ru/Mo/Si | 1 |
| 4 | Ru/Mo/Si | 5 |
| 5 | Mo/Si | 3 |
| 6 | Mo/Ru/Mo/Si | 4 |
| 7 | Ru/Mo/Si | 1 |
| 8 | Mo/Ru/Mo/Si | 1 |
| 9 | Mo/Si | 3 |
| 10 | Mo/Ru/Mo/Si | 2 |
| 11 | Ru/Mo/Si | 1 |
| 12 | Mo/Ru/Mo/Si | 10 |
| 13 | Mo/Si | 1 |
| 14 | Mo | 1 |

Figure 13:
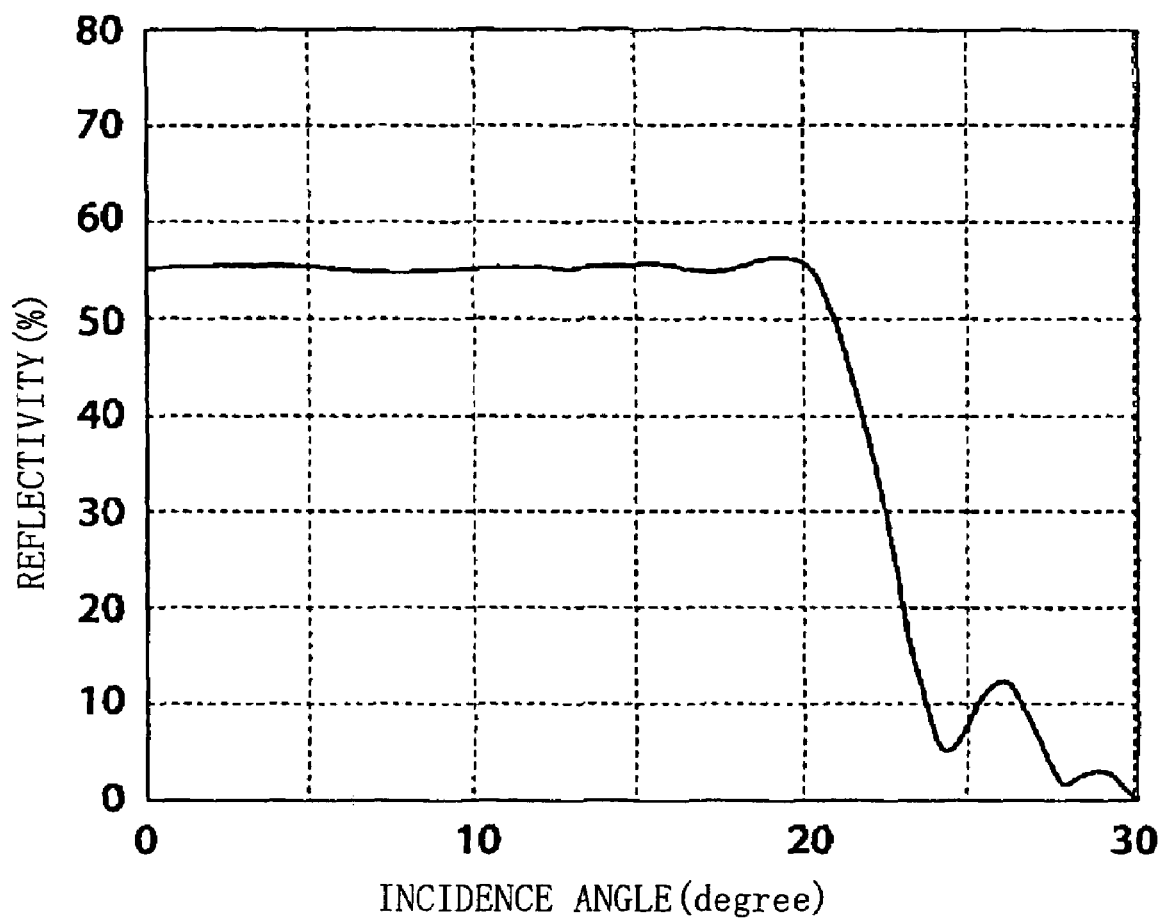
FIG. 13 shows the incidence angle dependence of the reflectivity of a multilayer mirror according to a seventh embodiment of the present invention.

FIG. 13 is a graph showing the incidence angle dependence of the reflectivity of the multilayer mirror according to the present embodiment. In the drawing, the horizontal axis represents the incidence angle (degree (°)) of light made incident to the multilayer mirror and the vertical axis represents the reflectivity (%) for the EUV ray having a wavelength ($\lambda$) of 13.5 nm. As seen from the drawing, according to the multilayer mirror in the present embodiment, a high reflectivity of 45% or more (in more detail, 54% or more) can be obtained across the entire incidence angle range of 0° to 20°.

Embodiment 8

Next an eighth embodiment of the present invention will be explained. In the multilayer in the present embodiment, the material configuration and the film thickness of each layer are optimized so as to be capable of obtaining a high reflectivity for the EUV ray (Extreme Ultra-Violet ray) having a wavelength of 13.1 nm to 13.9 nm and being made incident vertically. The multilayer in the present embodiment is one formed by forming the multilayer having a structure shown in the following Table 10 on a synthetic silica glass substrate precisely polished. Note that, the total film thickness of the multilayer in the present embodiment is about 360 nm. Further, it is preferable for the thickness of each layer of the multilayer to be not constant and to be adjusted so as to obtain a desired reflectivity by varying in accordance with the position on the multilayer.

TABLE 10

| A | Unit Periodic Structure | Number of Repetitions |
|---|---|---|
| 1 | Ru/Si | 1 |
| 2 | Ru/Mo/Si | 1 |
| 3 | Ru/Si | 1 |
| 4 | Mo/Si | 2 |
| 5 | Ru/Si | 1 |
| 6 | Ru/Mo/Si | 5 |
| 7 | Mo/Si | 3 |
| 8 | Ru/Mo/Si | 5 |
| 9 | Mo/Si | 5 |
| 10 | Ru/Mo/Si | 4 |
| 11 | Mo/Si | 4 |
| 12 | Ru/Mo/Si | 12 |
| 13 | Mo/Ru/Mo/Si | 2 |
| 14 | Mo/Si | 1 |
| 15 | Mo | 1 |

In the following Table 11 and Table 12, the film thickness for each layer of the multilayer in the present embodiment is shown. Note that, since the number of layers of the multilayer is large, the table is shown in a plurality of divided tables. According to these tables, the 28th, the 51th, the 73th, and 75th silicon layers counted from the substrate side are the extremely thick silicon layer.

TABLE 11

| | Unit Periodic Structure | Preferable Film Thickness Range (nm) | More Preferable Film Thickness (nm) |
|---|---|---|---|
| 1 | Ru | 6~2 | 4 |
| 2 | Si | 5~2 | 3 |
| 3 | Ru | 5~2 | 3 |
| 4 | Mo | 2~0 | 1 |
| 5 | Si | 5~2 | 3 |
| 6 | Ru | 5~2 | 4 |
| 7 | Si | 6~2 | 4 |
| 8 | Mo | 8~3 | 6 |
| 9 | Si | 7~2 | 5 |
| 10 | Mo | 6~2 | 4 |
| 11 | Si | 5~2 | 3 |
| 12 | Ru | 5~2 | 3 |
| 13 | Si | 5~2 | 4 |
| 14 | Ru | 4~1 | 3 |
| 15 | Mo | 2~0 | 1 |
| 16 | Si | 5~2 | 4 |
| 17 | Ru | 4~1 | 3 |
| 18 | Mo | 2~0 | 1 |
| 19 | Si | 5~2 | 4 |
| 20 | Ru | 3~1 | 2 |
| 21 | Mo | 2~0 | 2 |
| 22 | Si | 5~2 | 4 |
| 23 | Ru | 2~0 | 2 |
| 24 | Mo | 3~1 | 2 |
| 25 | Si | 5~2 | 4 |
| 26 | Ru | 2~0 | 1 |
| 27 | Mo | 4~1 | 2 |
| 28 | Si | 12~4 | 8 |
| 29 | Mo | 2~0 | 1 |
| 30 | Si | 6~2 | 4 |
| 31 | Mo | 5~2 | 3 |

TABLE 11-continued

| | Unit Periodic Structure | Preferable Film Thickness Range (nm) | More Preferable Film Thickness (nm) |
|---|---|---|---|
| 32 | Si | 5~2 | 4 |
| 33 | Mo | 5~2 | 3 |
| 34 | Si | 6~2 | 4 |
| 35 | Ru | 2~0 | 1 |
| 36 | Mo | 3~1 | 2 |
| 37 | Si | 6~2 | 4 |
| 38 | Ru | 2~0 | 2 |
| 39 | Mo | 3~1 | 2 |
| 40 | Si | 6~2 | 4 |
| 41 | Ru | 2~0 | 1 |
| 42 | Mo | 3~1 | 2 |
| 43 | Si | 6~2 | 4 |
| 44 | Ru | 2~0 | 1 |
| 45 | Mo | 3~1 | 2 |
| 46 | Si | 6~2 | 4 |
| 47 | Ru | 2~0 | 1 |
| 48 | Mo | 4~1 | 2 |
| 49 | Si | 6~2 | 4 |
| 50 | Mo | 4~1 | 3 |
| 51 | Si | 24~8 | 16 |
| 52 | Mo | 2~0 | 1 |
| 53 | Si | 7~2 | 4 |
| 54 | Mo | 5~2 | 3 |
| 55 | Si | 5~2 | 4 |
| 56 | Mo | 5~2 | 3 |
| 57 | Ru | 5~2 | 4 |
| 58 | Mo | 5~2 | 4 |
| 59 | Si | 6~2 | 4 |
| 60 | Ru | 2~0 | 1 |
| 61 | Mo | 3~1 | 2 |
| 62 | Si | 6~2 | 4 |
| 63 | Ru | 2~0 | 1 |
| 64 | Mo | 3~1 | 2 |
| 65 | Si | 6~2 | 4 |
| 66 | Ru | 2~0 | 1 |
| 67 | Mo | 3~1 | 2 |
| 68 | Si | 6~2 | 4 |

TABLE 12

| | Unit Periodic Structure | Preferable Film Thickness Range (nm) | More Preferable Film Thickness (nm) |
|---|---|---|---|
| 69 | Ru | 2~0 | 1 |
| 70 | Mo | 4~1 | 2 |
| 71 | Si | 6~2 | 4 |
| 72 | Mo | 4~1 | 3 |
| 73 | Si | 18~6 | 12 |
| 74 | Mo | 2~0 | 1 |
| 75 | Si | 15~5 | 10 |
| 76 | Mo | 4~1 | 3 |
| 77 | Si | 6~2 | 4 |
| 78 | Mo | 5~2 | 3 |
| 79 | Si | 6~2 | 4 |
| 80 | Ru | 2~0 | 1 |
| 81 | Mo | 3~1 | 2 |
| 82 | Si | 6~2 | 4 |
| 83 | Ru | 3~1 | 2 |
| 84 | Mo | 2~0 | 1 |
| 85 | Si | 6~2 | 4 |
| 86 | Ru | 3~1 | 2 |
| 87 | Mo | 2~0 | 1 |
| 88 | Si | 5~2 | 4 |
| 89 | Ru | 3~1 | 2 |
| 90 | Mo | 2~0 | 1 |
| 91 | Si | 5~2 | 4 |
| 92 | Ru | 3~1 | 2 |
| 93 | Mo | 2~0 | 1 |
| 94 | Si | 5~2 | 4 |

TABLE 12-continued

| | Unit Periodic Structure | Preferable Film Thickness Range (nm) | More Preferable Film Thickness (nm) |
|---|---|---|---|
| 95 | Ru | 3~1 | 2 |
| 96 | Mo | 2~0 | 1 |
| 97 | Si | 6~2 | 4 |
| 98 | Ru | 3~1 | 2 |
| 99 | Mo | 2~0 | 1 |
| 100 | Si | 6~2 | 4 |
| 101 | Ru | 3~1 | 2 |
| 102 | Mo | 2~0 | 1 |
| 103 | Si | 6~2 | 4 |
| 104 | Ru | 3~1 | 2 |
| 105 | Mo | 2~0 | 1 |
| 106 | Si | 6~2 | 4 |
| 107 | Ru | 3~1 | 2 |
| 108 | Mo | 2~0 | 1 |
| 109 | Si | 6~2 | 4 |
| 110 | Ru | 3~1 | 2 |
| 111 | Mo | 2~0 | 1 |
| 112 | Si | 6~2 | 4 |
| 113 | Ru | 3~1 | 2 |
| 114 | Mo | 2~0 | 1 |
| 115 | Si | 6~2 | 4 |
| 116 | Mo | 2~0 | 1 |
| 117 | Ru | 2~0 | 2 |
| 118 | Mo | 2~0 | 1 |
| 119 | Si | 6~2 | 4 |
| 120 | Mo | 2~0 | 1 |
| 121 | Ru | 2~0 | 1 |
| 122 | Mo | 2~0 | 1 |
| 123 | Si | 6~2 | 4 |
| 124 | Mo | 4~1 | 3 |
| 125 | Si | 6~2 | 4 |
| 126 | Mo | 4~1 | 3 |

Figure 14:
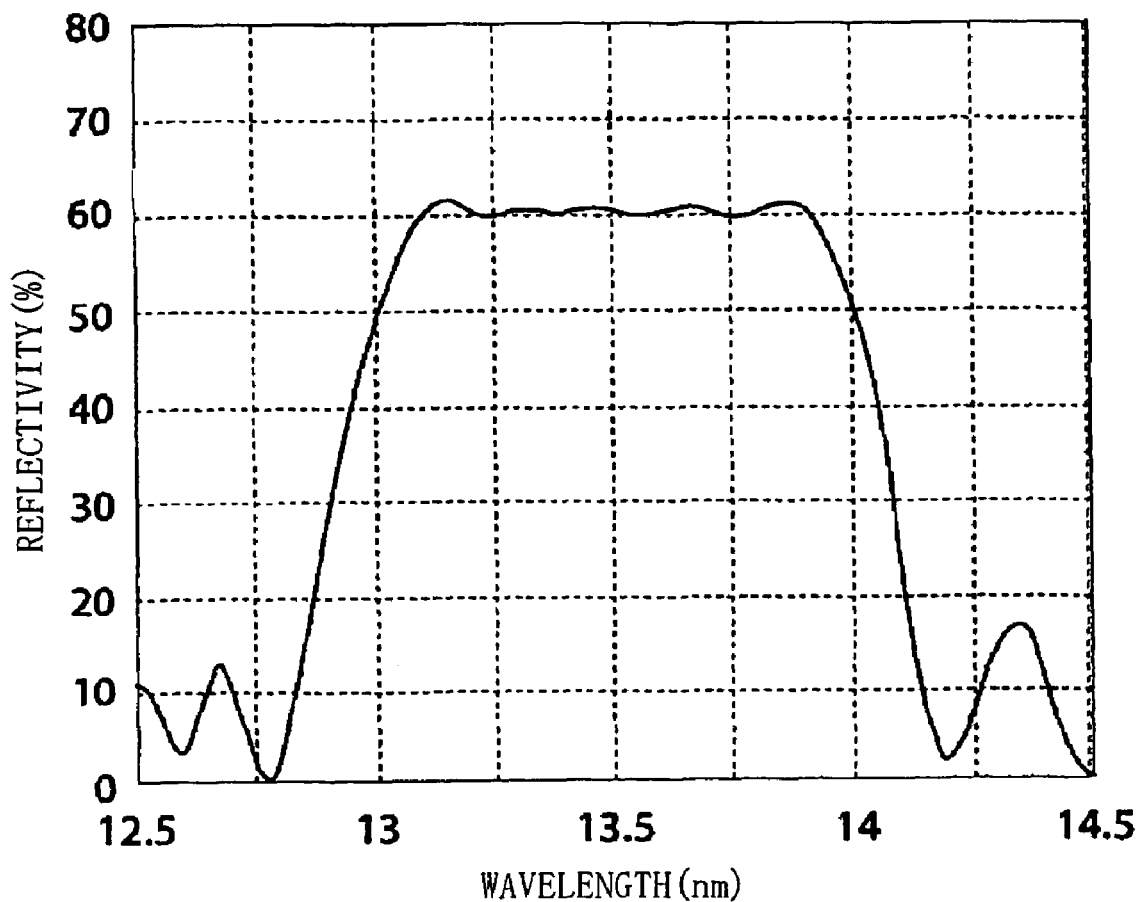
FIG. 14 shows the spectral reflectivity properties of a multilayer mirror according to an eighth embodiment of the present invention.

FIG. 14 is a graph showing the spectral reflectivity properties of the multilayer mirror according to the present embodiment. In the drawing, the horizontal axis represents the wavelength (nm) of incidence light and the vertical axis represents the reflectivity (%). Note that, it is assumed that the incidence angle of light is 0° (vertical incidence on the reflective surface). As seen from the drawing, according to the multilayer mirror in the present embodiment, a high reflectivity of 45% or more (in more detail, 50% or more) can be obtained across the entire wide wavelength range described above.

Embodiment 9

Next a ninth embodiment of the present invention will be explained. In the multilayer in the present embodiment, the material configuration and the film thickness of each layer are optimized so as to be capable of obtaining a reflectivity as high as possible for the EUV ray having a wavelength of 13.5 nm and being made incident vertically. The multilayer in the present embodiment is one formed by forming the multilayer having a structure shown in the following Table 13 on a synthetic silica glass substrate precisely polished. Note that, the total film thickness of the multilayer in the present embodiment is about 510 nm. Further, it is preferable for the thickness of each layer of the multilayer to be not constant and to be adjusted so as to obtain a desired reflectivity by varying it in accordance with the position on the multilayer.

TABLE 13

| A | Unit Periodic Structure | Number of Repetitions |
|---|---|---|
| 1 | Si | 1 |
| 2 | Ru/Si | 17 |
| 3 | Ru/Mo/Si | 56 |
| 4 | Ru/Mo | 1 |

Figure 15:
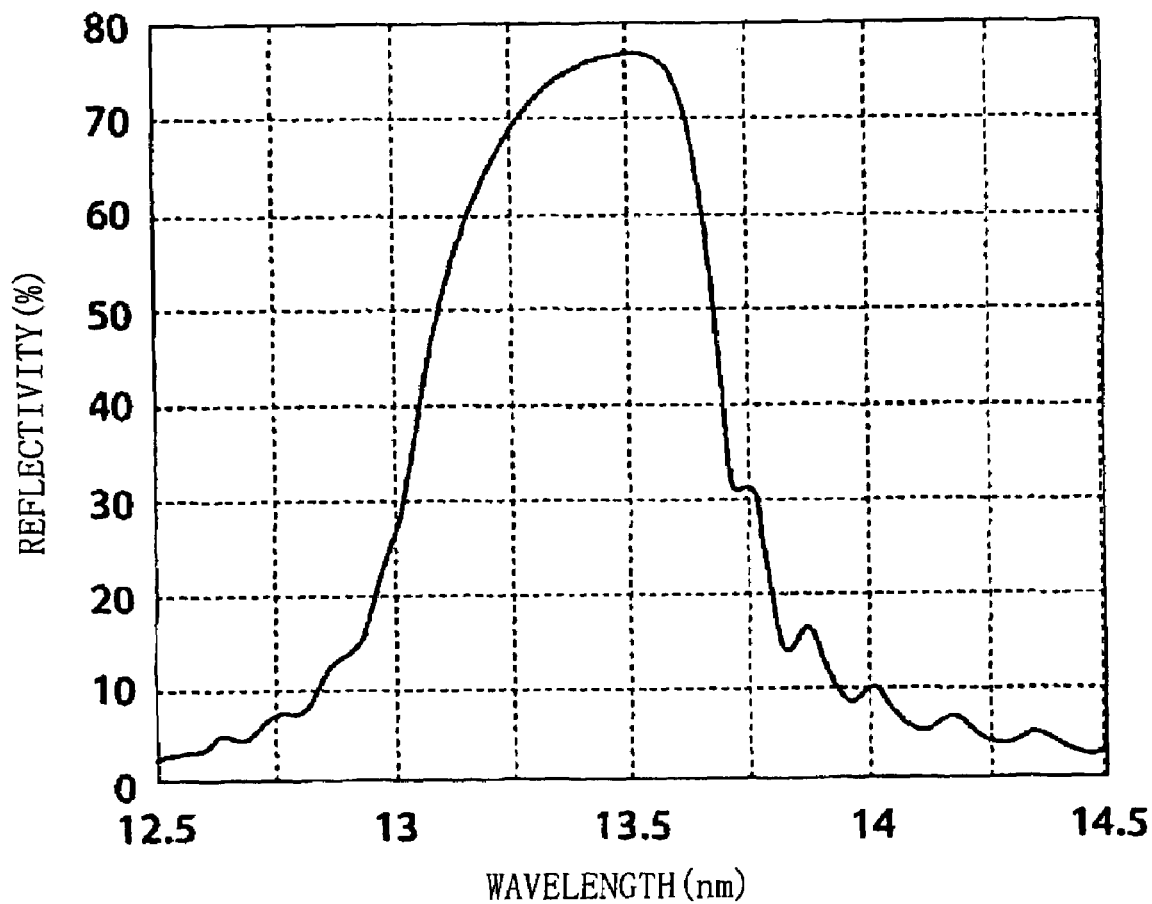
FIG. 15 shows the spectral reflectivity properties of a multilayer mirror according to a ninth embodiment of the present invention.
Figure 20:
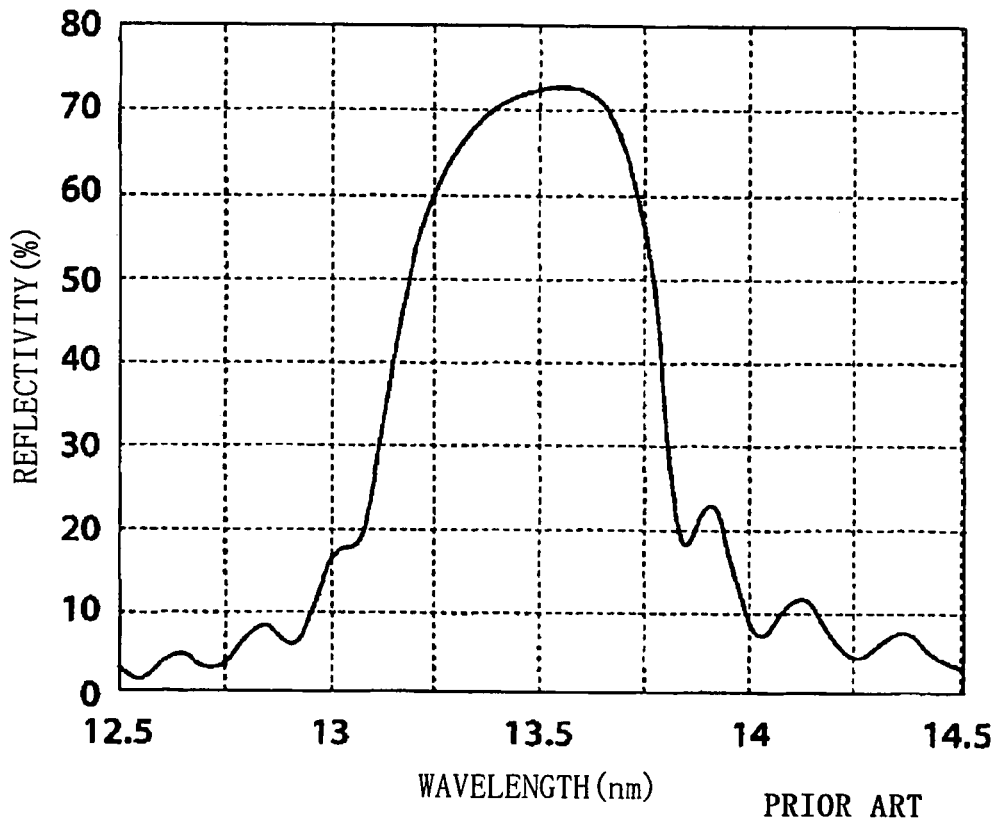
FIG. 20 shows an example of the spectral reflectivity properties of a conventional multilayer mirror.
Figure 21:
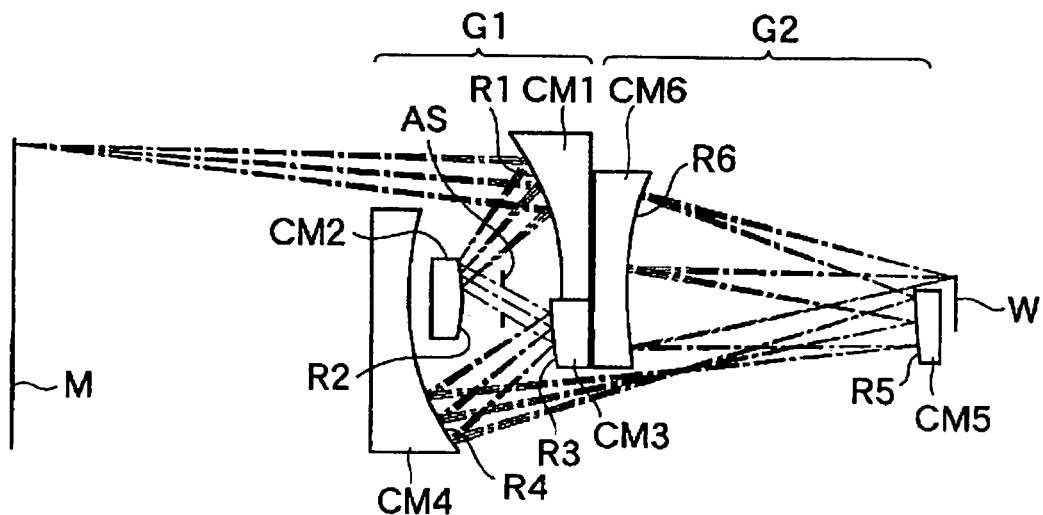
FIG. 21 shows an example of an optical system configured by six mirrors.

FIG. 15 is a graph showing the spectral reflectivity properties of the multilayer mirror according to the present embodiment. In the drawing, the horizontal axis represents the wavelength (nm) of incidence light and the vertical axis represents the reflectivity (%). Note that, it is assumed that the incidence angle is 0° (vertical incidence on the reflective surface. As seen from the drawing, according to the multilayer mirror in the present embodiment, a high reflectivity of 70% or more (for example, about 76%), which is higher than that in FIG. 20 described above, can be obtained for the EUV ray having a wavelength of 13.5 nm.

Embodiment 10

Next a tenth embodiment of the present invention will be explained. In the multilayer in the present embodiment, the material configuration and the film thickness of each layer are optimized so as to be capable of obtaining a high reflectivity for the EUV ray (Extreme Ultra-Violet ray) having a wavelength of 13.5 nm to 14.2 nm at the time of vertical incidence. The multilayer in the present embodiment is a Mo/Si multilayer in which a molybdenum layer (a low refractive-index film) and a silicon layer (a high refractive-index film) are laminated by turns on a synthetic silica glass substrate precisely polished.

Note that, the total film thickness of the multilayer in the present embodiment is about 330 nm. Further, it is preferable for the thickness of each layer of the multilayer to be not constant and to be adjusted so as to obtain a desired reflectivity by varying in accordance with the position on the multilayer. In the following Table 14 and Table 15, the film thickness for each layer of the multilayer in the present embodiment is shown. Note that, since the number of layers of the multilayer is large, the table is shown in a plurality of divided tables. According to these tables, the 46th silicon layer (the silicon layer located almost in the middle in the multilayer) is the extremely thick silicon layer.

TABLE 14

| | Unit Periodic Structure | Preferable Film Thickness Range (nm) | More Preferable Film Thickness (nm) |
|---|---|---|---|
| 1 | Mo | 20~5 | 11 |
| 2 | Si | 6~2 | 4 |
| 3 | Mo | 6~2 | 4 |
| 4 | Si | 6~2 | 4 |
| 5 | Mo | 6~2 | 4 |
| 6 | Si | 6~2 | 3 |
| 7 | Mo | 9~3 | 6 |
| 8 | Si | 8~3 | 5 |
| 9 | Mo | 7~2 | 4 |
| 10 | Si | 6~2 | 3 |
| 11 | Mo | 6~2 | 4 |
| 12 | Si | 6~2 | 4 |
| 13 | Mo | 6~2 | 4 |
| 14 | Si | 6~2 | 4 |
| 15 | Mo | 6~2 | 4 |

TABLE 14-continued

| | Unit Periodic Structure | Preferable Film Thickness Range (nm) | More Preferable Film Thickness (nm) |
|---|---|---|---|
| 16 | Si | 6~2 | 4 |
| 17 | Mo | 6~2 | 4 |
| 18 | Si | 6~2 | 4 |
| 19 | Mo | 6~2 | 4 |
| 20 | Si | 6~2 | 4 |
| 21 | Mo | 6~2 | 4 |
| 22 | Si | 6~2 | 4 |
| 23 | Mo | 6~2 | 3 |
| 24 | Si | 6~2 | 4 |
| 25 | Mo | 12~3 | 7 |
| 26 | Si | 6~2 | 4 |
| 27 | Mo | 6~2 | 3 |
| 28 | Si | 6~2 | 4 |
| 29 | Mo | 6~2 | 4 |
| 30 | Si | 6~2 | 4 |
| 31 | Mo | 6~2 | 4 |
| 32 | Si | 6~2 | 4 |
| 33 | Mo | 6~2 | 4 |
| 34 | Si | 6~2 | 4 |
| 35 | Mo | 6~2 | 4 |
| 36 | Si | 6~2 | 4 |
| 37 | Mo | 6~2 | 4 |
| 38 | Si | 6~2 | 4 |
| 39 | Mo | 6~2 | 3 |
| 40 | Si | 6~2 | 4 |
| 41 | Mo | 6~2 | 3 |
| 42 | Si | 6~2 | 4 |
| 43 | Mo | 6~2 | 3 |
| 44 | Si | 8~2 | 5 |

TABLE 15

| | Unit Periodic Structure | Preferable Film Thickness Range (nm) | More Preferable Film Thickness (nm) |
|---|---|---|---|
| 45 | Mo | 2~0 | 1 |
| 46 | Si | 14~6 | 7 |
| 47 | Mo | 6~2 | 3 |
| 48 | Si | 6~2 | 4 |
| 49 | Mo | 6~2 | 3 |
| 50 | Si | 6~2 | 4 |
| 51 | Mo | 6~2 | 4 |
| 52 | Si | 6~2 | 4 |
| 53 | Mo | 6~2 | 4 |
| 54 | Si | 6~2 | 4 |
| 55 | Mo | 6~2 | 4 |
| 56 | Si | 6~2 | 4 |
| 57 | Mo | 6~2 | 4 |
| 58 | Si | 6~2 | 4 |
| 59 | Mo | 6~2 | 4 |
| 60 | Si | 6~2 | 4 |
| 61 | Mo | 6~2 | 4 |
| 62 | Si | 6~2 | 4 |
| 63 | Mo | 6~2 | 4 |
| 64 | Si | 6~2 | 4 |
| 65 | Mo | 6~2 | 4 |
| 66 | Si | 6~2 | 4 |
| 67 | Mo | 6~2 | 3 |
| 68 | Si | 6~2 | 4 |
| 69 | Mo | 6~2 | 3 |
| 70 | Si | 6~2 | 4 |
| 71 | Mo | 6~2 | 3 |
| 72 | Si | 6~2 | 4 |
| 73 | Mo | 6~2 | 3 |
| 74 | Si | 6~2 | 4 |
| 75 | Mo | 6~2 | 3 |
| 76 | Si | 6~2 | 4 |
| 77 | Mo | 6~2 | 3 |

TABLE 15-continued

| Unit Periodic Structure | Preferable Film Thickness Range (nm) | More Preferable Film Thickness (nm) |
|---|---|---|
| 78 Si | 6~2 | 4 |
| 79 Mo | 6~2 | 3 |
| 80 Si | 6~2 | 4 |
| 81 Mo | 6~2 | 3 |
| 82 Si | 7~2 | 4 |
| 83 Mo | 6~2 | 3 |
| 84 Si | 6~2 | 4 |
| 85 Mo | 5~1 | 3 |
| 86 Si | 6~2 | 3 |

Figure 16:
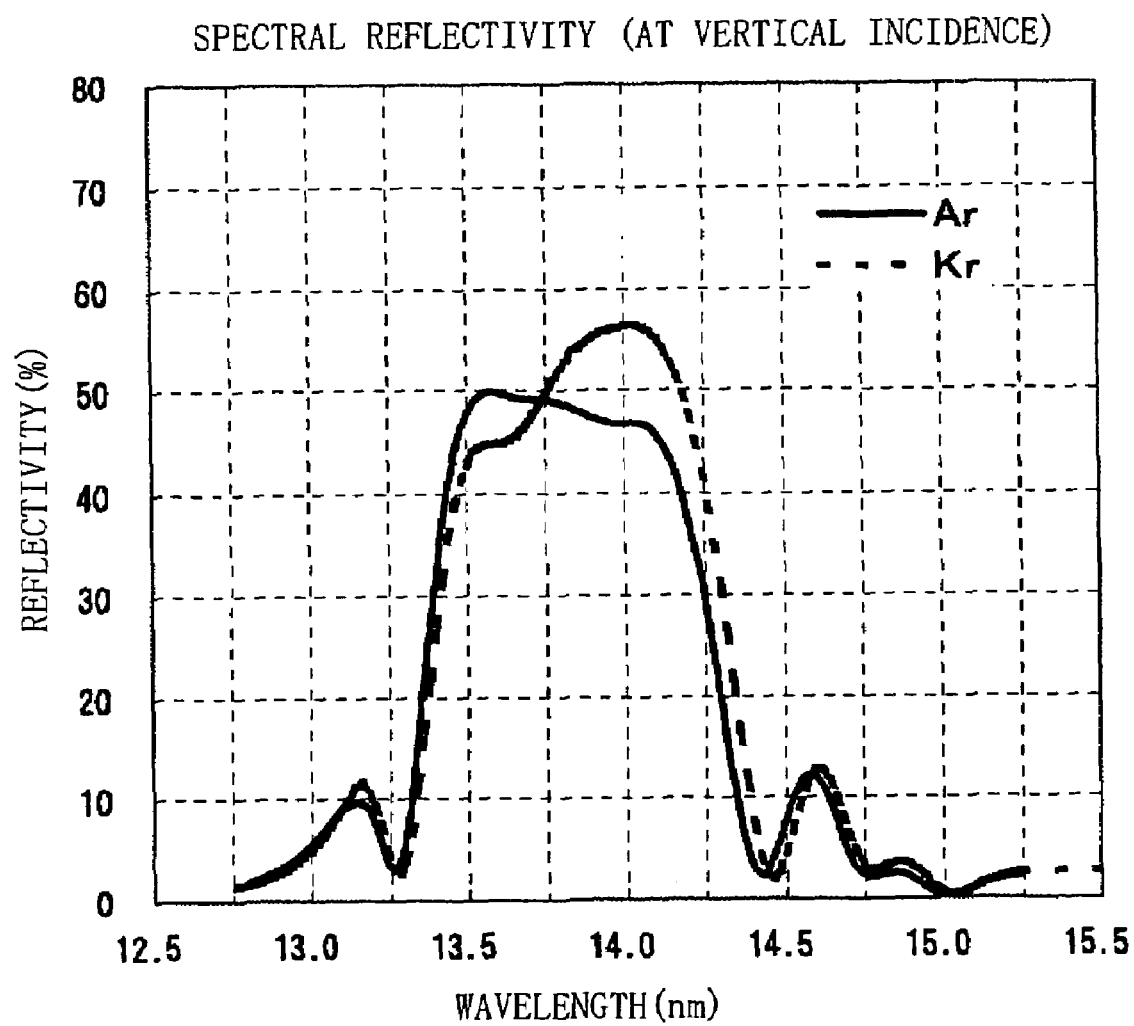
FIG. 16 shows the spectral reflectivity properties of a multilayer mirror according to a tenth embodiment of the present invention.

FIG. 16 is a graph showing the spectral reflectivity properties of the multilayer mirror according to the present embodiment. Note that, the method for forming the multilayer uses ion beam sputtering. In the drawing, the horizontal axis represents the wavelength (nm) of incidence light and the vertical axis represents the reflectivity (%). It is assumed that the incidence angle of light is 0° (vertical incidence on the reflective surface). The solid line in FIG. 16 shows the wavelength properties of the reflectivity when the film is formed using a sputtering gas and an argon (Ar) gas and the dotted line shows the wavelength properties of the reflectivity when the film is formed using a krypton (Kr) gas as a sputtering gas.

As seen from FIG. 16, according to the multilayer mirror in the present embodiment, a high reflectivity of 45% or more can be obtained across the wide wavelength range described above. Further, when the film is formed using a Kr gas as shown by the dotted line, the reflectivity peak is larger and the full width at half maximum of the spectral reflectivity is wider than the case where the film is formed using an Ar gas as shown by the solid line.

Figure 17:
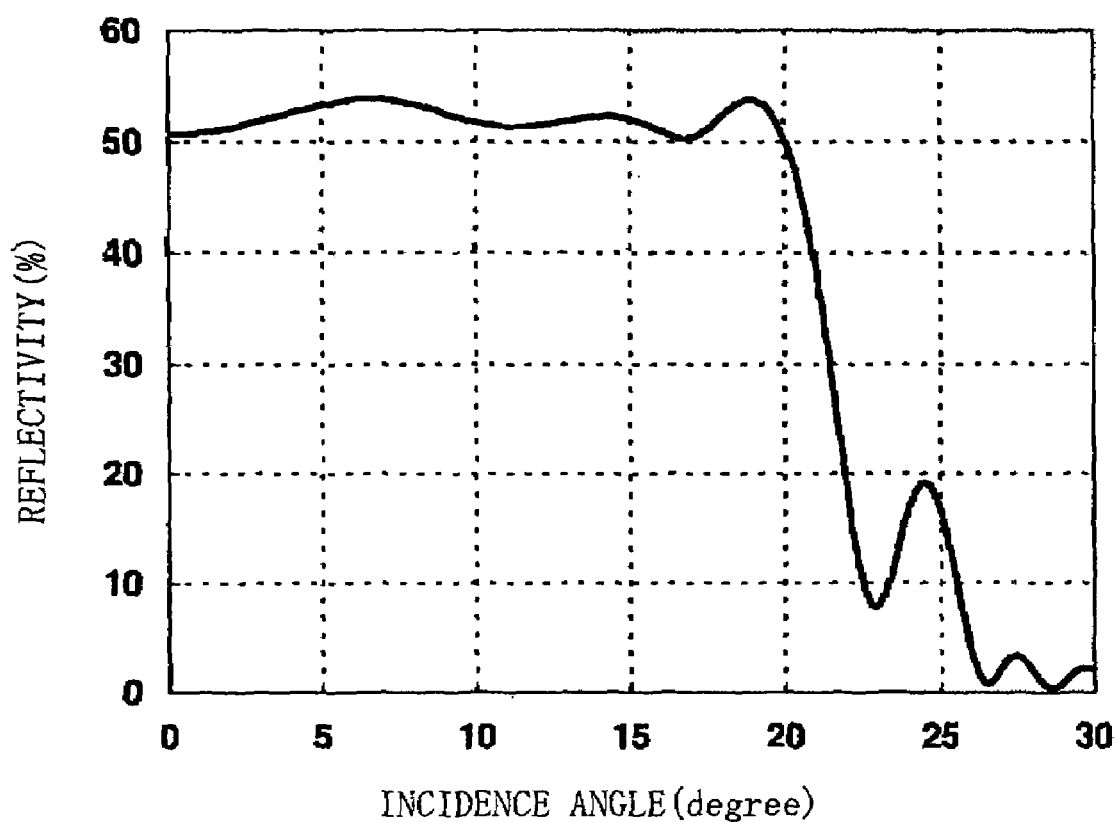
FIG. 17 shows the incidence angle dependence of the reflectivity of the multilayer mirror according to the seventh embodiment of the present invention.

FIG. 17 is a graph showing the incidence angle dependence of the reflectivity of the multilayer mirror according to the present embodiment. In the drawing, the horizontal axis represents the incidence angle (degree (°)) of light made incident to the multilayer mirror and the vertical axis represents the reflectivity (%) for the EUV ray having a wavelength ($\lambda$) of 13.5 nm. As seen from the drawing, according to the multilayer mirror in the present embodiment, a high reflectivity of 45% or more (more preferably, 50% or more) can be obtained across the entire wide incidence angle range of 0° to 20°.

Embodiment 11

Figure 18:
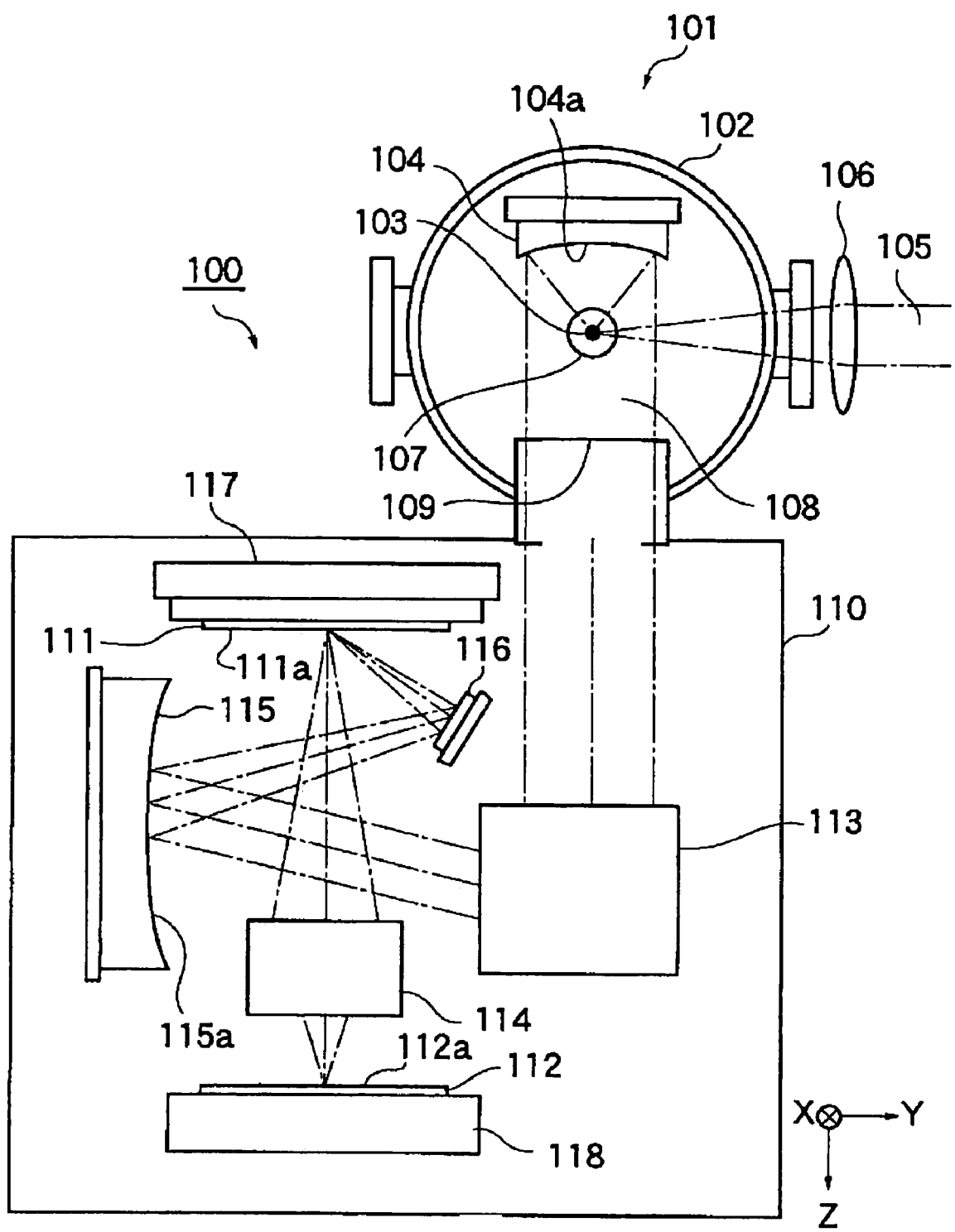
FIG. 18 is a schematic diagram showing exposure equipment according to an embodiment of the present invention.
Figure 19:
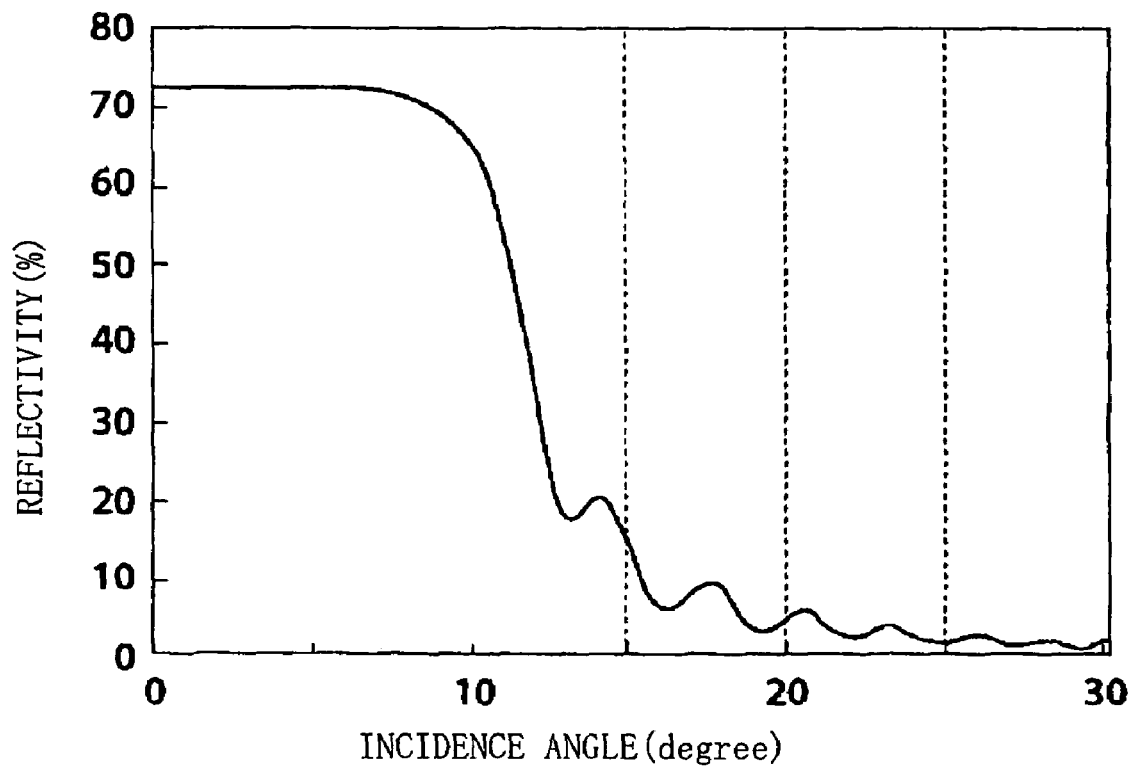
FIG. 19 shows an example of the incidence angle dependence of the reflectivity of a conventional multilayer mirror.

FIG. 18 is a schematic diagram of exposure equipment according to an embodiment of the present invention. As shown schematically, EUV exposure 100 has an X-ray generation device (a laser plasma X-ray source) 101. The X-ray generation device 101 has a spherical vacuum container 102 and the interior of the vacuum container 102 is evacuated by a vacuum pump. At the upper side inside the vacuum container 102 in the drawing, a multilayer paraboloidal mirror 104 is arranged its reflective surface 104a facing downward (in the +Z direction) in the drawing.

On the right-hand side of the vacuum container 102 in the drawing, a lens 106 is arranged and to the right of the lens 106, a laser light source, not shown in the drawing, is arranged. The laser light source emits pulse laser light 105 in the −Y direction. The pulse laser light 105 converges on the focal point of the multilayer paraboloidal mirror by the lens 106. At the focal point, a target material (xenon (Xe) etc.) is arranged and when the target material 103 is irradiated with the pulse laser light 105 caused to converge, a plasma 107 is generated. The plasma 107 emits a soft X-ray (EUV ray) 108 in a wavelength band near 13 nm.

At lower part of the vacuum container 102, an X-ray filter 109 for cutting visible light is provided. The EUV ray 108 is reflected in the +Z direction by the multilayer paraboloidal mirror 104, passes through the X-ray filter 109 and is guided to an exposure chamber 110. At this time, the visible light spectrum band of the EUV ray 18 is cut.

Note that, a xenon gas is used as a target material in the present embodiment, however, a xenon cluster or liquid drop may be used and a substance such as tin (Sn) may also be used. Further, a laser plasma X-ray source is used as the X-ray generation device 101, however, a discharge plasma X-ray source may be adopted. A discharge plasma X-ray source turns a target material into plasma by discharge of a high pulse voltage and causes X-rays to emit from the plasma.

Under the X-ray generation device 101 in the drawing, the exposure chamber 110 is provided. Inside the exposure chamber 110, an illumination optical system 113 is arranged. The illumination optical system 113 consists of a condenser system mirror, a fly eye optical system mirror, etc. (shown in a simplified shape in the drawing), and forms the EUV ray 108 made incident from the X-ray generation device 101 into a circular shape and emits it leftward in the drawing.

On the left-hand side of the illumination optical system 113, a mirror 115 is arranged. The mirror 115 is a circular concave mirror and held vertically (parallel to the Z-axis) by a holding member, not shown, so that the reflective surface 115a faces rightward (in the +Y direction) in the drawing. On the right-hand side of the mirror 115 in the drawing, an optical path bending mirror 116 is arranged. Above the optical path bending mirror 116 in the drawing, a reflective type mask 111 is arranged horizontally (parallel to the XY plane) so that the reflective surface 111a faces downward (in the +Z direction). After reflected and caused to converge by the mirror 115, the EUV ray emitted from the illumination optical system 113 reaches the reflective surface 111a of the reflective type mask 111 via the optical path bending mirror 116.

The mirrors 115 and 116 are composed of substrates made of low thermal expansion glass with slight thermal deformation, the reflective surface of which has been processed highly precisely. On the reflective surface 115a of the mirror 115, a reflective multilayer in which a high refractive-index film and low refractive-index film are laminated by turns is formed like the reflective surface of the multilayer paraboloidal mirror. Note that, when an X-ray having a wavelength of 10 to 15 nm is used, a reflective multilayer may be used, which is a combination of a substance such as molybdenum (Mo), ruthenium (Ru), and rhodium (Rh) and a substance such as silicon (Si), beryllium (Be), and carbon tetraboride ($B_4C$).

Also on the reflective surface 111a of the reflective type mask 111, a reflecting film composed of a multilayer is formed. On the reflecting film of the reflective type mask 111, a mask pattern in accordance with a pattern to be transferred onto a wafer 112 is formed. The reflective type mask 111 is attached to a mask stage 111 shown at the upper part in the drawing. The mask stage 117 is capable of moving at least in the Y direction and the EUV ray reflected by the optical path bending mirror 116 is scanned sequentially on the reflective type mask 111.

Down the reflective mask 111 in the drawing, a projection optical system 114 and a wafer (a substrate applied with a sensitive resin) 112 are arranged in this order from above. The projection optical system 114 is composed of a plurality of mirrors etc. The wafer 112 is fixed on the wafer stage 118 capable of moving in the XYZ directions so that the exposure surface 112a faces upward (in the −Z direction) in the drawing. The EUV ray reflected by the reflective type mask 111 is reduced by the projection optical system with a predetermined reduction factor (for example, ¼) and forms an image on the wafer 112 and the pattern on the mask 111 is transferred onto the wafer 112.

On the mirror (excluding the grazing incidence mirror making use of the total reflection) used in the exposure equipment 100 in the present embodiment, a multilayer having any one of structures described in the first to tenth embodiments described above is formed. Note that, the multilayer paraboloidal mirror 104, the mirrors in the illumination optical system 113 and the projection optical system 114, etc., are provided with a cooling mechanism, not shown in the drawing, in order to prevent the surface temperature from exceeding 100° C.

Since the incidence light of the EUV ray to the reflective surface of the multilayer paraboloidal mirror 104 considerably varies according to the position on the plane, the periodic length also varies considerably in the plane. As described above, a slight error occurs in the distribution of the periodic length of the multilayer paraboloidal mirror 104 and in the substrate mounting position, therefore, the reflectivity varies due to the error between the incidence angle supposed at the time of the control of the periodic length and the actual incidence angle. According to the present embodiment, such a change in the reflectivity seldom occurs by using a multilayer mirror having a wide full width at half maximum of the reflectivity according to the above-mentioned embodiments. Further, by using a multilayer having a wide reflection band as the multilayer mirror constituting the illumination optical system 113 and the projection optical system 114, the image forming performance of the optical system can be maintained high, therefore, it is possible to uniformalize the illuminance on the image forming surface and the amount of light in the pupil and an excellent resolution can be obtained.

In the present embodiment, the multilayer paraboloidal mirror 104 etc. is cooled, however, if cooling cannot be performed sufficiently, it may also possible to add an additional layer such as that in the second to fourth embodiments into the structure by making use of the film configuration (Mo/SiC/Si, MoC/Si multilayers etc.) the reflectivity of which drops slightly even if the temperature increases.

Supplemental Description

Hereinafter, supplemental description on the above-mentioned embodiments will be made.

FIG. 22(A) is a graph showing the incidence wavelength properties of the theoretical reflectivity of the Mo/Si multilayer and the Ru/Si multilayer. In the drawing, the horizontal axis represents the wavelength of incidence light and the vertical axis represents the theoretical reflectivity (the calculated value of the reflectivity). The solid line in the drawing shows the theoretical reflectivity of the Mo/Si multilayer of 100 pair layers and the dotted line shows the theoretical reflectivity of the Ru/Si multilayer of 100 pair layers. As seen from FIG. 22(A), the full width at half maximum of the Mo/Si multilayer having a sufficiently large number of pairs of formed layers as many as 100 pair layers is 0.6 nm and the full width at half maximum of the Ru/Si multilayer is 0.8 nm.

FIG. 22(B) is a graph showing the change in the full width at half maximum and the peak reflectivity with respect to the number of pairs of formed layers of the Mo/Si multilayer in the multilayer configured by forming the Mo/Si multilayer on the Ru/Si multilayer. In the drawing, the horizontal axis represents the number of pair layers of the Mo/Si multilayer formed on the Ru/Si multilayer of 100 pair layers. The full width at half maximum with respect to the number of pair layers of the Mo/Si multilayer is expressed by a white triangle (Δ) and the peak value of the reflectivity (the peak reflectivity) is expressed by a black circle (●).

As seen from FIG. 22(B), as the number of pair layers of the Mo/Si multilayer increases, the peak reflectivity increases, however, it almost saturates when the number becomes 15 pair layers or more. On the other hand, the full width at half maximum decreases as the number of pair layers of the Mo/Si multilayer increases. Then, when the number of pair layers of the Mo/Si multilayer becomes 15 pair layers, it falls below 0.7 nm and approaches the value of the Mo/Si multilayer (refer to FIG. 22(A)).

As described above, it is preferable for the number of pairs of formed layers of the Mo/Si multilayer to be two pair layers or more in order to obtain the effect of the increase in the reflectivity and to keep the influence of the decrease in the full width at half maximum to a minimum, and it is more preferable to be five to ten pair layers.

Figure 23:
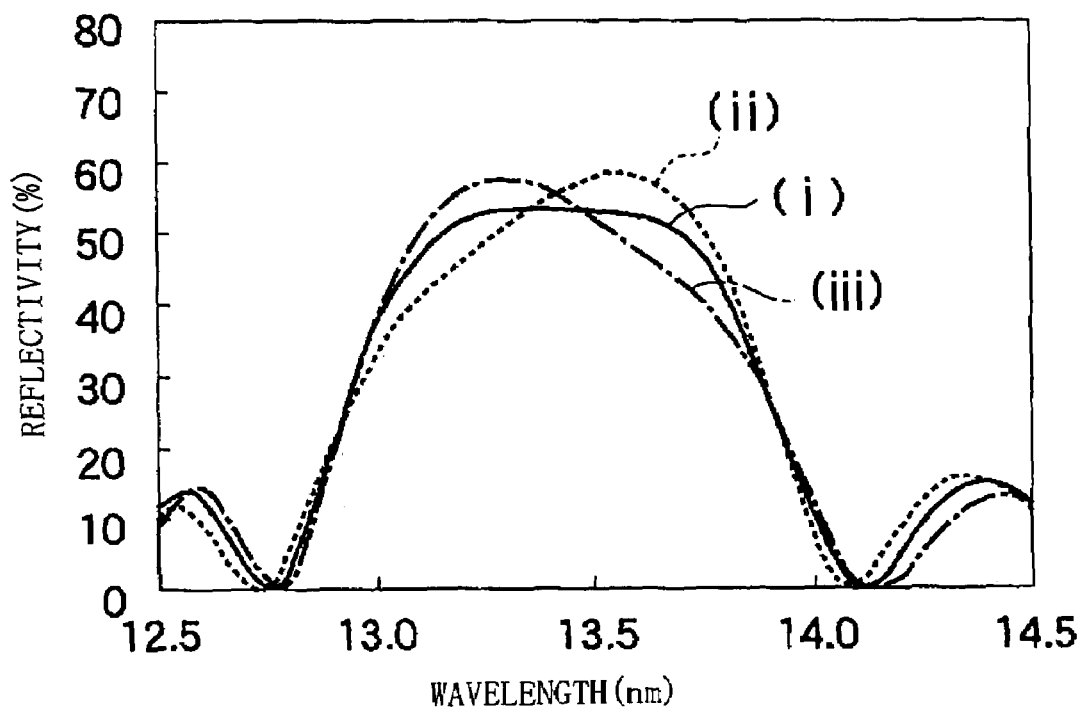
FIG. 23 shows a reflectivity peak shape when the thickness of an additional layer (a silicon layer) is varied against the periodic length of a Mo/Si multilayer.

As seen from FIG. 23, in the case of the dotted line (ii) and the chain line (iii), the top part is not so flat but in the case of the solid line (i), the top part of the reflectivity peak is significantly flat. It is apparent from this that setting the thickness of the additional layer to about half the periodic length of the multilayer is effective to reduce the change in the reflectivity near the peak.

Half the periodic length of the multilayer means half the optical thickness (film thickness×refractive index) of one period in the periodic structural part in the multilayer. It is preferable for the thickness of the additional layer to be half the optical thickness, however, it is not necessary to be strictly half the optical thickness as described above, and it is only necessary to have substantially the thickness. Therefore, it is preferable for the difference between the thickness of the additional layer and half the optical thickness to be within 5/100 of the wavelength of EUV ray to be utilized, and more preferable to be within 3/100 of the utilized wavelength.

The optical thickness of one period in the multilayer structure is about half the wavelength of incidence light, therefore, in other words, it is necessary to set the optical thickness of an additional layer to about one-fourth of the utilized wavelength. Note that, as the angle (the angle of refraction) that the transmitted EUV ray makes with the normal to the boundary surface increases, the optical path length in the unit periodic structure becomes longer than the film thickness (if the angle of refraction is assumed to be θ, the optical path length=film thickness/cos θ). Therefore, it is necessary to adjust the thickness of the additional layer in accordance with the incidence angle of EUV ray at the time of use. When the utilized wavelength is, for example, 13.5 nm, it is preferable for the thickness of the additional layer to be in the range of half the periodic length of the multilayer ±0.68 nm and at the time of the use in the incidence angle range of 5° to 10°, it is preferable to be within the range of 3.4±0.68 nm.

Additionally, the configuration of the multilayer according to the present invention is used for infrared, visible, and ultraviolet ray, and it can also be thought to somewhat resemble an Etalon in which a space having a thickness of one-fourth of the used wavelength is added between reflecting films. However, the multilayer according to the present invention quite differs from the Etalon in the configuration, purposes of use, and characteristics as described below. The etalon, which is a kind of Fabry-Perot type resonator, is used mainly as a narrow band filter.

Figure 24:
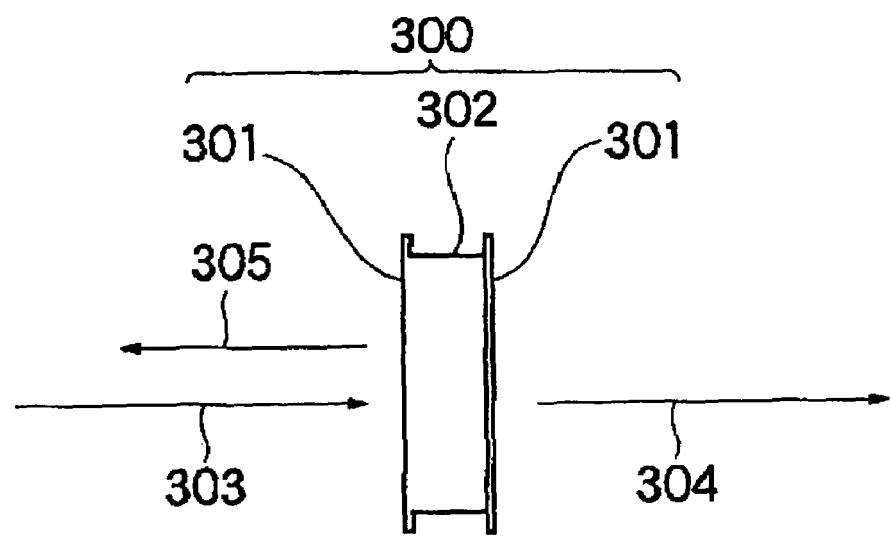
FIG. 24 is a diagram schematically showing a structure of an Etalon.

FIG. 24 is a schematic diagram of a structure of an Etalon. An Etalon 300 is a device that makes use of a multiple interference and has a structure in which two high reflectivity mirrors 301 are arranged so as to sandwich in between a spacer 302 having a certain thickness. Most of light 303 made incident to the Etalon 300 (the arrow on the left-hand side) is reflected to the left side in the drawing to become reflected light 305. On the other hand, the two mirrors 301 and the space 302 play a role as a resonator and cause only the light having the wavelength meeting the resonance condition among the incidence light 303 to pass through as transmitted light 304.

Because of this, a sharp transmittance peak occurs. Since the Etalon 300 causes only the light having the wavelength meeting the resonance condition to pass through as described above, the reflectivity falls only in the vicinity of the wavelength and the high reflectivity is maintained at the other wavelengths. Therefore, the spectral reflectivity properties of the Etalon 300 have a sharp valley. Note that, the Etalon 300 is used as a narrow band filter, the reflectivity of the two reflective surfaces must be high and almost equal.

In contrast to this, in the case of the multilayer of the present invention, the reflectivity of the multilayers above and under the additional layer must not be equal and it is necessary for the reflectivity of the multilayer on the substrate side to be low. If the reflectivity of the multilayer on the substrate side is equal to that of the multilayer on the surface side, the drop in the reflectivity due to interference occurs in a narrow wavelength region and there appears a sharp valley near the peak top, therefore, it is no longer a wide band multilayer.

As disclosed in the non-patent document 3, it is possible for a multilayer having a structure in which layers with various periodic lengths are laminated to obtain a relatively high reflectivity in a wide band. However, in this case, it is difficult to evaluate the structure. In general, as a method for evaluating the structure of a multilayer, a method is used in which a small angle scattering of X-ray is performed and the period is evaluated from the detected peak angle.

Figure 25:
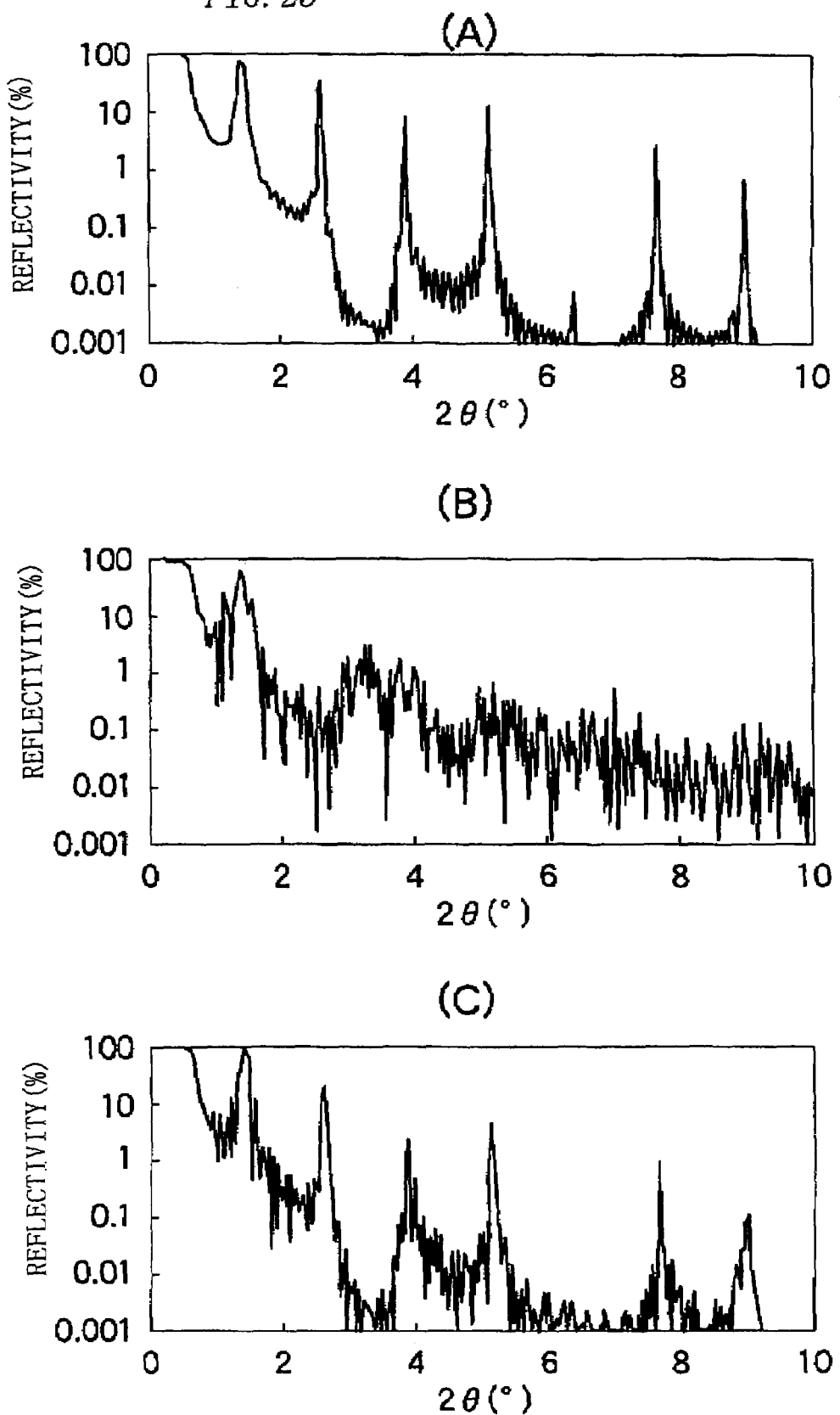
FIGS. 25(A) to (C) show expected diffraction peak shapes of a periodically structured multilayer, an uneven periodic structure, and a multilayer including an additional layer, respectively when the X-ray diffraction intensity angle distribution is varied.

FIG. 25 is a graph showing a diffraction peak shape expected when the X-ray diffraction intensity angle distribution is varied. FIG. 25(A) shows a diffraction peak shape of a periodically structured multilayer, FIG. 25(B) shows a diffraction peak shape of an uneven periodic structure, and FIG. 25(C) shows a diffraction peak shape of a multilayer including an additional layer (in this example, a silicon layer). In the drawing, the horizontal axis represents the incidence angle of incidence light and the vertical axis represents the reflectivity.

As shown in FIG. 25(A), in the case of the multilayer having a periodic structure, peaks corresponding to the incident angles appear sharply. On the other hand, in the case where the periodic length is uneven as an uneven periodic multilayer reported as a wide band multilayer (refer to the non-patent document 3), as shown in FIG. 25(B), many irregular-shaped peaks appear and the evaluation of the periodic length of the multilayer is difficult.

In contrast to this, according to the present invention, only an additional layer is added to the periodic structure of the multilayer and sharp diffraction light peaks occur as shown in FIG. 25(C), which makes the evaluation of the multilayer periodic length easy. Note that, it is not possible to directly measure the thickness of the additional layer, however, it is possible to control the thickness of the additional layer according to the present invention. Specifically, it is possible to control the thickness of the additional layer by adjusting the time required for film formation based on the thickness of the film formed from a substance for the additional layer per a unit time (film forming rate) in the film forming work, which is obtained from the periodic length evaluation of the periodically structured part of the multilayer and the time required for film formation.

Also, in the present invention, the number of pair layers of the deep layer film group is half or less than the number of pair layers of the surface layer film group. As described above, when the multilayer is nearer to the substrate side than to the additional layer, the reflectivity in the vicinity of the reflectivity peak drops compared to that when only the surface layer film group is present. Here, since the number of pair layers of the deep layer film group is half or less than that of the surface layer film group, the amount of drop in the reflectivity is small, the shape of the reflectivity peak is such that the front end part is flattened or becomes slightly hollow. It is unlikely that the portion in the vicinity of the reflectivity peak value becomes a sharp and deep valley.

Figure 26:
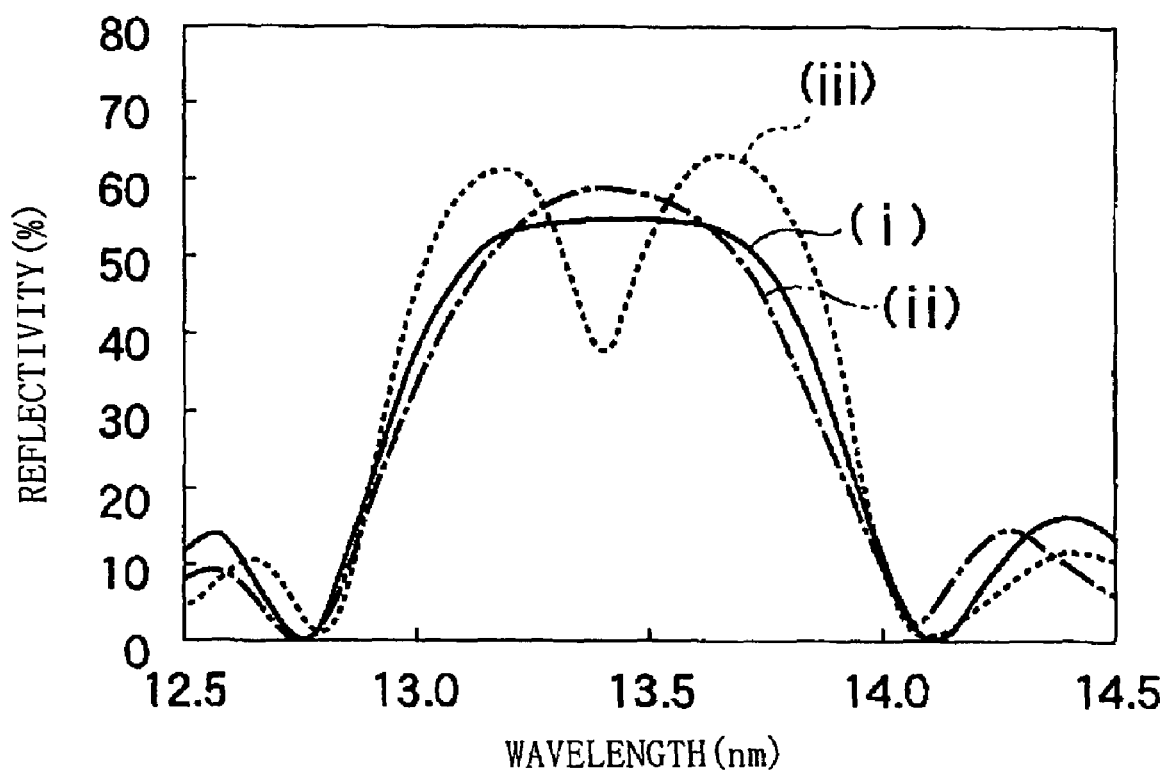
FIG. 26 shows the change in the reflectivity peak shape of a Mo/Si multilayer when the number of pairs of a deep layer film group is varied.

FIG. 26 is a graph showing the change in the reflectivity peak shape of a Mo/Si multilayer when the number of pairs of the deep layer film group is varied. In the drawing, the horizontal axis represents the wavelength of incidence light and the vertical axis represents the reflectivity. In the example in FIG. 26, the additional layer is silicon. The solid line (i), the chain line (ii), and the dotted line (iii) in the drawing show the reflectivity when the deep layer film group is a four-pair layer, a two-pair layer, and a 12-pair layer, respectively, and each of the surface layer film groups is a 20-pair layer.

As seen from FIG. 26, in the case (ii) where the deep layer film group is a two-pair layer for the 20-pair layer of the surface layer film group, the reflectivity peak is not sufficiently flattened but remains pointed, however, in the case (i) where the number of pair layers of the deep layer film group is increased to a four-pair layer, the reflectivity peak is flattened. Further, in the case (iii) where the deep layer film group is increased to a 12-pair layer, a deep valley is formed on the top of the reflectivity peak and a flat shape cannot be obtained. Hence, it is preferable for the number of pair layers of the deep layer film group to be at least half or less than the number of pair layers of the surface layer film group. As described above, according to the present invention, a reflectivity peak the full width at half maximum of which is wide and the peak of which is flat can be obtained.

According to the present embodiment, the EUV ray wavelength having a relatively high EUV ray reflectivity means that the wavelength is within a range including the maximum value of the reflectivity and the flat portion (the reflectivity is almost constant) of a graph in which the horizontal axis represents the wavelength and the vertical axis represents the reflectivity. For example, in the case of the solid line (i) in FIG. 26 described above, the range is one in which the wavelength is about 13.2 to about 13.6 nm. It is preferable for a wavelength range including a desired wavelength (for example, 13.5 nm) to be within 0.5 nm, or more preferably within 0.60 nm, in which the reflectivity is 50% or more, and in which the reflectivity peak has a flat shape (the fluctuation in the reflectivity is within ±5%).

Here, the incidence angle having a relatively high EUV ray reflectivity means that the angle is within a range including the maximum value of the reflectivity and the flat portion (the reflectivity is almost constant) of a graph in which the horizontal axis represents the incidence angle and the vertical axis represents the reflectivity.

The invention is not limited to the above embodiments and various modifications may be made without departing from the spirit and scope of the invention. Any improvement may be made in part or all of the components.

What is claims is:

1. A multilayer mirror having a reflective multilayer in which a high refractive-index film and a low refractive-index film for EUV ray are laminated by turns, comprising:

a surface layer film group on a light incidence side; and a deep layer film group on an opposite light incidence side of the surface layer film group, wherein:

a EUV ray reflectivity peak value of the surface layer film group is higher than that of the deep layer film group; and a full width at half maximum of peak reflectivity of the surface layer film group is smaller than that of the deep layer film group.

2. The multilayer mirror according to claim 1, wherein a number of pairs of the high refractive-index film and the low refractive-index film in the surface layer film group is 2 to 10.

3. The multilayer mirror according to claim 1, wherein:

in the surface layer film group, the low refractive-index film is composed of a substance including molybdenum and the high refractive-index film is composed of a substance including silicon; and in the deep layer film group, the low refractive-index film is composed of a substance including ruthenium and the high refractive-index film is composed of a substance including silicon.

4. The multilayer mirror according to claim 3, wherein a number of pairs of the high refractive-index film and the low refractive-index film in the surface layer film group is 2 to 10.

5. Exposure equipment which forms a pattern by selectively irradiating a sensitive substrate with EUV ray, comprising the multilayer mirror according to claim 1 in an optical system.

6. Exposure equipment according to claim 5, wherein:

in the surface layer film group, the low refractive-index film is composed of a substance including molybdenum and the high refractive-index film is composed of a substance including silicon; and in the deep layer film group, the low refractive-index film is composed of a substance including ruthenium and the high refractive-index film is composed of a substance including silicon.

* * * * *